US010566108B2

(12) United States Patent
Ishimatsu et al.

(10) Patent No.: US 10,566,108 B2
(45) Date of Patent: Feb. 18, 2020

(54) ANISOTROPIC ELECTRICALLY CONDUCTIVE FILM, METHOD FOR PRODUCING SAME, AND CONNECTION STRUCTURAL BODY

(71) Applicant: DEXERIALS CORPORATION, Tokyo (JP)

(72) Inventors: Tomoyuki Ishimatsu, Utsunomiya (JP); Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 16/382,684

(22) Filed: Apr. 12, 2019

(65) Prior Publication Data
US 2019/0237214 A1 Aug. 1, 2019

Related U.S. Application Data

(63) Continuation of application No. 15/522,162, filed as application No. PCT/JP2015/080337 on Oct. 28, 2015, now Pat. No. 10,304,587.

(30) Foreign Application Priority Data

Oct. 28, 2014 (JP) .................................. 2014-219789
Oct. 28, 2014 (JP) .................................. 2014-219790
(Continued)

(51) Int. Cl.
*B32B 7/12* (2006.01)
*C08K 3/08* (2006.01)
(Continued)

(52) U.S. Cl.
CPC ................ *H01B 5/16* (2013.01); *B32B 7/12* (2013.01); *B32B 27/08* (2013.01); *C09J 7/10* (2018.01);
(Continued)

(58) Field of Classification Search
CPC ...... H01B 5/16; H05K 3/323; H01R 13/2414; H01L 2224/29082; C09J 2203/326
See application file for complete search history.

(56) References Cited

U.S. PATENT DOCUMENTS

2015/0214176 A1* 7/2015 Shinohara .............. C08G 59/68
361/767
2017/0103959 A1* 4/2017 Akutsu .................... H01B 1/22
(Continued)

FOREIGN PATENT DOCUMENTS

JP   H02-160311 A   6/1990
JP   2003-286457 A  10/2003
(Continued)

OTHER PUBLICATIONS

Jan. 12, 2016 International Search Report issued in International Application No. PCT/JP2015/080337.
(Continued)

*Primary Examiner* — Timothy J Thompson
*Assistant Examiner* — Rhadames Alonzo Miller
(74) *Attorney, Agent, or Firm* — Oliff PLC

(57) ABSTRACT

The present invention provides an anisotropic electrically conductive film with a structure, in which electrically conductive particles are disposed at lattice points of a planar lattice pattern in an electrically insulating adhesive base layer. A proportion of the lattice points, at which no electrically conductive particle is disposed, with respect to all the lattice points of the planar lattice pattern assumed as a reference region, is less than 20%. A proportion of the lattice points, at which plural electrically conductive particles are disposed in an aggregated state, with respect to all the lattice points of the planar lattice pattern, is not greater than 15%.

(Continued)

A sum of omission of the electrically conductive particle and an aggregation of the electrically conductive particles is less than 25%.

25 Claims, 14 Drawing Sheets

(30) Foreign Application Priority Data

Oct. 28, 2014 (JP) .................. 2014-219791
Oct. 28, 2014 (JP) .................. 2014-219792

(51) Int. Cl.
| | | |
|---|---|---|
| C08K 9/02 | (2006.01) | |
| C09J 7/10 | (2018.01) | |
| H01B 1/22 | (2006.01) | |
| H01B 5/16 | (2006.01) | |
| H05K 3/32 | (2006.01) | |
| B32B 27/08 | (2006.01) | |
| H01L 23/00 | (2006.01) | |
| H01R 12/70 | (2011.01) | |
| H01R 13/24 | (2006.01) | |

(52) U.S. Cl.
CPC .............. *H01B 1/22* (2013.01); *H01L 24/27* (2013.01); *H01L 24/29* (2013.01); *H01L 24/83* (2013.01); *H01R 13/2414* (2013.01); *H05K 3/323* (2013.01); *C08K 3/08* (2013.01); *C08K 9/02* (2013.01); *C09J 2201/36* (2013.01); *C09J 2201/602* (2013.01); *C09J 2203/326* (2013.01); *C09J 2205/102* (2013.01); *H01L 2224/294* (2013.01); *H01L 2224/2919* (2013.01); *H01L 2224/29082* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29455* (2013.01); *H01L 2224/29499* (2013.01); *H01L 2224/32225* (2013.01); *H01L 2224/73204* (2013.01); *H01L 2224/83101* (2013.01); *H01L 2224/83203* (2013.01); *H01L 2224/83862* (2013.01); *H01L 2924/07802* (2013.01); *H01R 12/7076* (2013.01)

(56) References Cited

U.S. PATENT DOCUMENTS

2017/0110806 A1* 4/2017 Igarashi ............... H01R 43/007
2017/0317047 A1* 11/2017 Akutsu .................. H01L 24/32

FOREIGN PATENT DOCUMENTS

| JP | 2010-033793 A | 2/2010 |
|---|---|---|
| WO | 2005/054388 A1 | 6/2005 |

OTHER PUBLICATIONS

Jan. 12, 2016 Written Opinion of the International Searching Authority issued in International Application No. PCT/JP2015/080337.
Dec. 6, 2016 Written Opinion of the International Preliminary Examining Authority issued in International Patent Application No. PCT/JP2015/080337.
Mar. 1, 2017 International Preliminary Report on Patentability issued in International Patent Application No. PCT/JP2015/080337.
Nov. 16, 2017 Office Action issued in Korean Patent Application No. 10-2017-7005958.
Sep. 3, 2018 Office Action issued in Chinese Patent Application No. 201580055638.8.
Jul. 2, 2019 Notification of Reasons for Refusal issued in Japanese Patent Application No. 2015-211459.
Jul. 2, 2019 Notification of Reasons for Refusal issued in Japanese Patent Application No. 2015-211460.
May 23, 2019 Office Action issued in Taiwanese Patent Application No. 104135557.
Jul. 9, 2019 Notification of Reasons for Refusal issued in Japanese Patent Application No. 2015-211452.
Jul. 9, 2019 Notification of Reasons for Refusal issued in Japanese Patent Application No. 2015-211497.

* cited by examiner

ANISOTROPIC ELECTRICALLY CONDUCTIVE FILM, METHOD FOR PRODUCING SAME, AND CONNECTION STRUCTURAL BODY

CROSS-REFERENCE

This application is a continuation of U.S. patent application Ser. No. 15/522,162, filed Apr. 26, 2017, which is a National Stage of International Application No. PCT/JP2015/080337, filed Oct. 28, 2015, which claims priority of Japanese Patent Application No. 2014-219792, filed Oct. 28, 2014, Japanese Patent Application No. 2014-219791, filed Oct. 28, 2014, Japanese Patent Application No. 2014-219790, filed Oct. 28, 2014, and Japanese Patent Application No. 2014-219789, filed Oct. 28, 2014. Contents of all of these identified documents are hereby incorporated by reference in their entireties.

TECHNICAL FIELD

The present invention relates to an anisotropic electrically conductive film.

BACKGROUND ART

An anisotropic electrically conductive film, in which electrically conductive particles are dispersed in an electrically insulating resin binder, is widely used when an electronic component such as an IC chip is mounted on a wiring board and the like; however, in such an anisotropic electrically conductive film, it is known that electrically conductive particles are present in a state of being connected or aggregated with one another. Therefore, in a case where the anisotropic electrically conductive film is applied to connect IC chip terminals and wiring board terminals, the pitches of which are reduced as an electronic device is reduced in a weight thereof and miniaturized, a short circuit may occur between the adjacent terminals due to the electrically conductive particles that are present in a state of being connected or aggregated in the anisotropic electrically conductive film.

Conventionally, a film, in which electrically conductive particles are regularly arranged, is suggested as an anisotropic electrically conductive film to deal with such a narrow pitch. For example, an anisotropic electrically conductive film is suggested which is obtained as follows: after an adhesive layer is formed in a stretchable film and the electrically conductive particles are densely packed in a single layer on a surface of the adhesive layer, the film is biaxially stretched until the distance between the conductive particles reaches a predetermined distance to arrange the electrically conductive particles regularly, then the electrically conductive particles are transferred to an electrically insulating adhesive base layer by pressing an electrically insulating adhesive base layer against the electrically conductive particles, the electrically insulating adhesive base layer being an element of the anisotropic electrically conductive film (Patent Document 1). Alternatively, an anisotropic electrically conductive film is also suggested which is obtained as follows: electrically conductive particles are scattered on a transfer-type concave portion formation surface having a concave portion on a surface, the concave portion formation surface is squeegeed and the electrically conductive particles are held in the concave portion, the electrically conductive particles are primarily transferred to the adhesive layer by pressing therefrom an adhesive film on which an adhesive layer for transfer is formed. Next, the electrically conductive particles deposited on the adhesive layer are transferred to an electrically insulating adhesive base layer by pressing the electrically insulating adhesive base layer against the electrically conductive particles being deposited to the adhesive layer, the electrically insulating adhesive base layer being an element of the anisotropic electrically conductive film (Patent Document 2). In general, in these anisotropic electrically conductive films, an electrically insulating adhesive cover layer is laminated on the surface of the electrically conductive particle side to cover the electrically conductive particles.

CITATION LIST

Patent Literature

Patent Document 1: WO 2005/054388
Patent Document 2: Japanese Unexamined Patent Application Publication No. 2010-033793A

SUMMARY OF INVENTION

Technical Problem

However, the electrically conductive particles are easily aggregated to form secondary particles by static electricity and the like, and thus, it is difficult for the electrically conductive particles to be present isolated all the time as primary particles. Therefore, the following problems arise in the technologies of Patent Documents 1 and 2. That is, in the case of Patent Document 1, there was a problem that it is difficult to densely pack the electrically conductive particles on the entire surface of a stretchable film in a single layer with no defects, thus, the electrically conductive particles may be packed in the stretchable film in an aggregated state, resulting in a cause of a short circuit; or a region, in which no electrically conductive particle is packed (so-called "omission of an electrically conductive particle") may be created, resulting in a cause of a conduction failure. In the case of Patent Document 2, the following problems may occur: if the transfer-type concave portion is covered with electrically conductive particles having a large particle diameter, the electrically conductive particles are removed by a subsequent squeegee, a concave portion that does not hold the electrically conductive particles may be created, and "omission of an electrically conductive particle" may occur in the anisotropic electrically conductive film causing a conduction failure; or, conversely, if a large number of small electrically conductive particles are pressed in the concave portion and transferred to the electrically insulating adhesive base layer, an aggregation of the electrically conductive particles may occur, and further, the electrically conductive particles located on the base side of the concave portion may not be in contact with the electrically insulating adhesive base layer, and thus the electrically conductive particles may be dispersed on the surface of the electrically insulating adhesive base layer, resulting in a loss of a regular arrangement, causing a short circuit and a conduction failure.

As seen above, in Patent Documents 1 and 2, in reality, a sufficient consideration is not given to the way how to control the "omission" and "aggregation" of the electrically conductive particles that should be disposed with a regular pattern on the anisotropic electrically conductive film.

An object of the present invention is to solve the above-described conventional technical problems, and from a viewpoint of "omission" and "aggregation" of the electrically conductive particles that should be disposed with a regular pattern, to provide an anisotropic electrically conductive film in which occurrence of a short circuit or a conduction failure is significantly suppressed.

Solution to Problem

The present inventor discovered that it is possible to achieve the above-described object by controlling, when disposing electrically conductive particles at lattice points of a planar lattice, with respect to all the lattice points of the planar lattice pattern assumed as a reference region of an anisotropic electrically conductive film, a "proportion of the lattice points at which no electrically conductive particle is disposed", a "proportion of the lattice points at which plural electrically conductive particles are disposed in an aggregated state", and an "aggregation direction of the aggregated electrically conductive particles" where necessary. Furthermore, the present inventors discovered that it is also possible to achieve the above-described object when, with respect to all the lattice points of the planar lattice pattern assumed as a reference region of an anisotropic electrically conductive film, a "proportion of the lattice points at which no electrically conductive particles is disposed" and a "proportion of the lattice points at which plural electrically conductive particles are disposed in an aggregated state" are controlled and in addition, when at least some of the aggregated electrically conductive particles are disposed with a shift in a thickness direction of the anisotropic electrically conductive film. Then, the present invention was completed on the basis of the acquired knowledge. Furthermore, the present inventors also discovered that it is possible to produce such an anisotropic electrically conductive film, not by disposing the electrically conductive particles in a concave portion of a transfer body, but by depositing the electrically conductive particles on a tip end of a columnar convex portion of the transfer body of which the surface is formed with the convex portion, followed by transfer. Thus, the present inventors completed a production method of the present invention.

That is, according to an embodiment of the present invention, an anisotropic electrically conductive film having a structure is provided, in which electrically conductive particles are disposed at lattice points of a planar lattice pattern in an electrically insulating adhesive base layer, wherein a proportion of the lattice points, at which no electrically conductive particle is disposed, with respect to all the lattice points of the planar lattice pattern assumed as a reference region of the anisotropic electrically conductive film (a proportion of the lattice points with "omission of an electrically conductive particle") is less than 20%, a proportion of the lattice points, at which plural electrically conductive particles are disposed in an aggregated state, with respect to all the lattice points of the planar lattice pattern (a proportion of the lattice points with "aggregation" of electrically conductive particles) is 15% or less, and a sum of the omission and the aggregation is 25% or less.

More specifically, the anisotropic electrically conductive film of the present invention provides an anisotropic electrically conductive film of first to fourth modes below.

That is, the present invention provides, as a first mode, an anisotropic electrically conductive film with a structure, in which an electrically insulating adhesive base layer and an electrically insulating adhesive cover layer are laminated together, and near an interface therebetween, electrically conductive particles are disposed at lattice points of a planar lattice pattern, wherein a proportion of the lattice points, at which no electrically conductive particle is disposed, with respect to all the lattice points of the planar lattice pattern assumed as a reference region of the anisotropic electrically conductive film is less than 20%, and a proportion of the lattice points, at which plural electrically conductive particles are disposed in an aggregated state, with respect to all the lattice points of the planar lattice pattern is 5% or less. In the first mode, it is preferable that a sum of the omission and the aggregation is less than 25%.

Furthermore, the present invention provides, as a second mode, an anisotropic electrically conductive film having a structure in which an electrically insulating adhesive base layer and an electrically insulating adhesive cover layer are laminated together, and near an interface therebetween, electrically conductive particles are disposed at lattice points of a planar lattice pattern, wherein a proportion of the lattice points, at which no electrically conductive particle is disposed, with respect to all the lattice points of the planar lattice pattern assumed as a reference region of the anisotropic electrically conductive film is less than 5%, and a proportion of the lattice points, at which plural electrically conductive particles are disposed in an aggregated state, with respect to all the lattice points of the planar lattice pattern is greater than 10% and less than 15%. In the second mode, it is preferable that a sum of the omission and the aggregation is less than 20%.

The present invention provides, as a third mode, an anisotropic electrically conductive film having a structure, in which an electrically insulating adhesive base layer and an electrically insulating adhesive cover layer are laminated together, and near an interface therebetween, electrically conductive particles are disposed at the lattice points of the planar lattice pattern, wherein a proportion of the lattice points, at which no electrically conductive particle is disposed, with respect to all the lattice points of the planar lattice pattern assumed as a reference region of the anisotropic electrically conductive film, is 15% or less, a proportion of the lattice points, at which plural electrically conductive particles are disposed in an aggregated state, with respect to all the lattice points of the planar lattice pattern, is 10% or less, and the electrically conductive particles disposed in an aggregated state are aggregated in a planar direction of the anisotropic electrically conductive film. In the third mode, it is preferable that a sum of the omission and the aggregation is 25% or less.

That is, the present invention provides, as a fourth mode, an anisotropic electrically conductive film having a structure, in which an electrically insulating adhesive base layer and an electrically insulating adhesive cover layer are laminated together, and near an interface therebetween, electrically conductive particles are disposed at the lattice points of the planar lattice pattern, wherein a proportion of the lattice points, at which no electrically conductive particle is disposed, with respect to all the lattice points of the planar lattice pattern assumed as a reference region of the anisotropic electrically conductive film, is less than 10%, a proportion of the lattice points, at which plural electrically conductive particles are disposed in an aggregated state, with respect to all the lattice points of the planar lattice pattern, is 15% or less, and at least some of electrically conductive particles that are disposed in an aggregated state are disposed with an oblique shift in a thickness direction of the anisotropic electrically conductive film. In the fourth mode, it is preferable that a sum of the omission and the aggregation is less than 25%.

The present invention provides a method of producing the above-mentioned anisotropic electrically conductive film having a structure, in which an electrically insulating adhesive base layer and an electrically adhesive cover layer are laminated together, and near an interface therebetween, electrically conductive particles are disposed at the lattice points of the planar lattice pattern, specifically, the anisotropic electrically conductive film of the first, second, third, or fourth mode, including:

(i) preparing a transfer body having a columnar convex portion corresponding to a lattice points of a planar lattice pattern, formed on a surface thereof;

(ii) making at least a top surface of the convex portion of the transfer body as a weak adhesive layer;

(iii) depositing electrically conductive particles on the weak adhesive layer of the convex portion of the transfer body;

(iv) transferring the electrically conductive particles to an electrically insulating adhesive base layer by overlapping and pressing the electrically insulating adhesive base layer on a surface at a side of the transfer body on which the electrically conductive particles are deposited; and (v) laminating an electrically insulating adhesive cover layer to the electrically insulating adhesive base layer, on which the electrically conductive particles are transferred, from a side, on which the electrically conductive particles are transferred.

Furthermore, according to an embodiment of the present invention, a connection structural body, in which a terminal of a first electronic component and a terminal of a second electronic component are anisotropically conductively connected by the above-described anisotropic electrically conductive film, specifically, the anisotropic electrically conductive film of the first, second, third, and fourth modes.

Advantageous Effects of Invention

In the anisotropic electrically conductive film of the present invention, a proportion of "lattice points, at which no electrically conductive particle is disposed" (proportion of the lattice points at which an electrically conductive particle is not present) with respect to all the lattice points of the planar lattice pattern assumed as a reference region is set to less than 20%, and a proportion of "lattice points at which plural electrically conductive particles are disposed in an aggregated state" (proportion of the lattice points at which the electrically conductive particles are aggregated) is 15% or less, and moreover, a sum of the omission and the aggregation is set to 25% or less. Therefore, when the anisotropic electrically conductive film of the present invention is applied to an anisotropic conductive connection, it is possible to achieve a good initial conductivity and a good conduction reliability after aging, and it is also possible to suppress occurrence of a short circuit. Furthermore, in addition to COG, it is excellent for electronic components having a relatively large bump area and a distance between the bumps such as FOG in terms of economy.

In a method of producing an anisotropic electrically conductive film according to an embodiment of the present invention, a transfer body, in which a columnar convex portion corresponding to lattice points of a planar lattice pattern is formed on a surface is used, electrically conductive particles are deposited on a weak adhesive layer formed on a top surface of the convex portion, and then the electrically conductive particles are transferred to an electrically insulating adhesive base layer. Therefore, it is possible to achieve that a proportion of "lattice points, at which no electrically conductive particle is disposed" with respect to all the lattice points of the planar lattice pattern assumed as the reference region of the anisotropic electrically conductive film is less than 20%, and a proportion of "lattice points, at which plural electrically conductive particles are disposed in an aggregated state" with respect to all the lattice points of the planar lattice pattern is 15% or less. Thus, by using the method of production of the present invention, it is possible to economically advantageously produce an anisotropic electrically conductive film, and with the anisotropic electrically conductive film, it is possible to achieve an anisotropic conductive connection between an IC chip and a wiring board, wherein the pitches are reduced while occurrence of a short circuit and a conduction failure are significantly suppressed.

In the anisotropic electrically conductive film of the first mode of the present invention, a proportion of "lattice points, at which no electrically conductive particle is disposed" with respect to all the lattice points of the planar lattice pattern assumed as a reference region is set to less than 20%, and moreover, a proportion of "lattice points at which plural electrically conductive particles are disposed in an aggregated state" with respect thereto is 5% or less. Therefore, when the anisotropic electrically conductive film of the present invention is applied to an anisotropic conductive connection, it is possible to achieve a good initial conductivity and a good conduction reliability after aging, and it is also possible to suppress occurrence of a short circuit. Furthermore, in addition to COG, it is excellent for electronic components having a relatively large bump area and a distance between the bumps such as FOG in terms of economy.

In a method of producing an anisotropic electrically conductive film of the first mode of the present invention, by using a transfer body having a columnar convex portion corresponding to a lattice point region of a planar lattice pattern, formed on a surface thereof, electrically conductive particles are deposited on a weak adhesive layer formed on a top surface of the convex portion, then the electrically conductive particles are transferred to an electrically insulating adhesive base layer. Therefore, it is possible to achieve that a proportion of "lattice points, at which no electrically conductive particle is disposed" with respect to all the lattice points of the planar lattice pattern assumed as the reference region of the anisotropic electrically conductive film is less than 20%, and a proportion of "lattice points, at which plural electrically conductive particles are disposed in an aggregated state" with respect to all the lattice points of the planar lattice pattern is 5% or less. Thus, by using the method of production of the present invention, it is possible to economically advantageously produce an anisotropic electrically conductive film, and with the anisotropic electrically conductive film, it is possible to achieve an anisotropic conductive connection between an IC chip and a wiring board, wherein the pitches are reduced while occurrence of a short circuit and a conduction failure are significantly suppressed.

In the anisotropic electrically conductive film of the second mode of the present invention, a proportion of "lattice points, at which no electrically conductive particle is disposed" with respect to all the lattice points of the planar lattice pattern assumed as the reference region is set to less than 5%, and moreover, a proportion of "lattice points at which plural electrically conductive particles are disposed in an aggregated state" is set to greater than 10% and less than 15%. Therefore, when the anisotropic electrically conductive film of the present invention is applied to an anisotropic conductive connection, it is possible to achieve a good initial conductivity and a good conduction reliability after aging, and it is also possible to suppress occurrence of a short circuit. Furthermore, in addition to COG, it is excellent for electronic components having a relatively large bump area and a distance between the bumps such as FOG in terms of economy.

In a method of producing an anisotropic electrically conductive film of the second mode of the present invention, by using a transfer body having a columnar convex portion corresponding to a lattice point region of a planar lattice pattern, formed on a surface thereof, electrically conductive particles are deposited on a weak adhesive layer formed on a top surface of the convex portion, then the electrically conductive particles are transferred to an electrically insulating adhesive base layer. Therefore, it is possible to achieve that a proportion of "lattice points, at which no electrically conductive particle is disposed" with respect to all the lattice points of the planar lattice pattern assumed as any reference region of the anisotropic electrically conductive film is less than 5%, and a proportion of "lattice points, at which plural electrically conductive particles are disposed in an aggregated state" with respect to all the lattice points of the planar lattice pattern is greater than 10% and less than 15%. Consequently, in the production method according to an embodiment of the present invention, it is possible to economically advantageously produce an anisotropic electrically conductive film, and by using the anisotropic electrically conductive film, it is possible to anisotropic conductive connect between the IC chip and the wiring board, wherein the pitches thereof are reduced while occurrence of a short circuit and a conduction failure are significantly suppressed.

In the anisotropic electrically conductive film of the third mode of the present invention, a proportion of "lattice points, at which no electrically conductive particle is disposed" with respect to all the lattice points of the planar lattice pattern assumed as the reference region is set to 15% or less, moreover, a proportion of "lattice points, at which plural electrically conductive particles are disposed in an aggregated state" is set to 10% or less, and moreover, the electrically conductive particles disposed in an aggregated state are aggregated in a planar direction of the anisotropic electrically conductive film. Therefore, when the anisotropic electrically conductive film according to an embodiment of the present invention is applied to an anisotropic conductive connection, it is possible to achieve a good initial conductivity and a good conduction reliability after aging, and it is also possible to suppress occurrence of a short circuit. Furthermore, in addition to COG, it is excellent for electronic components having a relatively large bump area and a distance between the bumps such as FOG in terms of economy.

In a method of producing an anisotropic electrically conductive film of the third mode of the present invention, by using a transfer body having a columnar convex portion corresponding to a lattice point region of a planar lattice pattern, formed on a surface thereof, electrically conductive particles are deposited on a weak adhesive layer formed on a top surface of the convex portion, then the electrically conductive particles are transferred to an electrically insulating adhesive base layer. Therefore, it is possible to achieve that a proportion of the "lattice points, at which no electrically conductive particle is disposed" with respect to all the lattice points of the planar lattice pattern assumed as the reference region of the anisotropic electrically conductive film is 15% or less, and a proportion of "lattice points having plural electrically conductive particles disposed in an aggregated state" to all the lattice points of the planar lattice pattern is 10% or less, and moreover, the electrically conductive particles disposed in an aggregated state are aggregated with respect to the plane direction of the anisotropic electrically conductive film. Thus, by using the method of production according to an embodiment of the present invention, it is possible to economically advantageously produce an anisotropic electrically conductive film, and with the anisotropic electrically conductive film, it is possible to achieve an anisotropic conductive connection between an IC chip and a wiring board, wherein the pitches thereof are reduced while occurrence of a short circuit and a conduction failure are significantly suppressed.

In the anisotropic electrically conductive film of the fourth mode of the present invention, a proportion of the "lattice points, at which no electrically conductive particle is disposed" with respect to all the lattice points of the planar lattice pattern assumed as the reference region is set to less than 10%, and a proportion of "lattice points at which plural electrically conductive particles are disposed in an aggregated state" is set to 15% or less, and moreover, at least some of the electrically conductive particles disposed in an aggregated state are disposed with an oblique shift in a thickness direction of the anisotropic electrically conductive film. Therefore, when the anisotropic electrically conductive film according to an embodiment of the present invention is applied to an anisotropic conductive connection, it is possible to achieve a good initial conductivity and a good conduction reliability after aging, and it is also possible to suppress occurrence of a short circuit. Furthermore, in addition to COG, it is excellent for electronic components having a relatively large bump area and a distance between the bumps such as FOG in terms of economy.

In a method of producing the anisotropic electrically conductive film of the fourth mode of the present invention, by using a transfer body having a columnar convex portion corresponding to a lattice point region of a planar lattice pattern, formed on a surface thereof, the electrically conductive particles are deposited on the weak adhesive layer formed on the top surface of the convex portion, then the electrically conductive particles are transferred to the electrically insulating adhesive base layer. Therefore, it is possible to achieve that a proportion of the "lattice points, at which no electrically conductive particle is disposed" with respect to all the lattice points of the planar lattice pattern assumed as the reference region of the anisotropic electrically conductive film is less than 10%, and a proportion of the "lattice points at which plural electrically conductive particles are disposed in an aggregated state" with respect to all the lattice points of the planar lattice pattern is 15% or less, and moreover, at least some of electrically conductive particles disposed in an aggregated state are disposed with an oblique shift in a thickness direction of the anisotropic electrically conductive film. Consequently, in the production method according to an embodiment of the present invention, it is possible to economically advantageously produce an anisotropic electrically conductive film, and with the anisotropic electrically conductive film, it is possible to achieve an anisotropic conductive connection between an IC chip and a wiring board wherein the pitches thereof are reduced while occurrence of a short circuit and a conduction failure are significantly suppressed.

DESCRIPTION OF EMBODIMENTS

An anisotropic electrically conductive film according to an embodiment of the present invention has a structure in which an electrically insulating adhesive base layer and an electrically insulating adhesive cover layer are laminated together, and near an interface therebetween, electrically conductive particles are disposed at the lattice points of the planar lattice pattern. In the anisotropic electrically conductive film, a proportion of the lattice points, at which no electrically conductive particle is disposed with respect to all the lattice points of the planar lattice pattern assumed as a reference region (a proportion of the lattice points having "omission" of the electrically conductive particle) is less than 20%, and a proportion of the lattice points at which plural electrically conductive particles are disposed in an aggregated state with respect to all the lattice points of the planar lattice pattern (a proportion of the lattice points having "aggregation" of the electrically conductive particles) is 15% or less, and moreover, a sum of the omission and the aggregation is 25% or less. The reference region is a substantially square region including a side X and a side Y in a center portion of the anisotropic electrically conductive film plane, the side X and the side Y satisfying the Relationships (A), (2), and (3). Here, D is an average particle diameter of the electrically conductive particles, the side Y is a straight line disposed at an angle in a range of less than ±45° with respect to the longitudinal direction of the anisotropic electrically conductive film, and the side X is a straight line perpendicular to the side Y.

$$100D \leq X+Y \leq 400D \quad (A)$$

$$X \geq 5D \quad (2)$$

$$Y \geq 5D \quad (3)$$

An anisotropic electrically conductive film according to an embodiment of the present invention will be specifically described for each mode, below. Specifically, firstly, an anisotropic electrically conductive film and a production method thereof of a first mode of the present invention will be described in detail with reference to the drawings.

Anisotropic Electrically Conductive Film of First Mode

Figure 1:
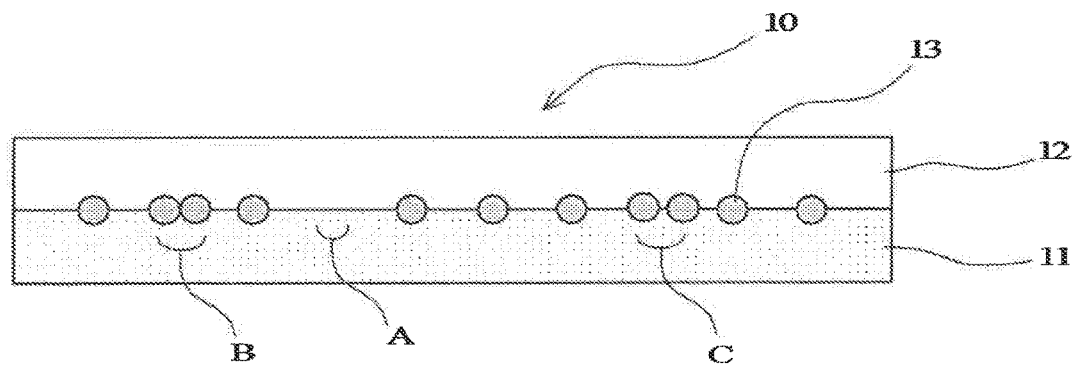
FIG. 1 is a cross-sectional view of an anisotropic electrically conductive film of a first mode of the present invention.
Figure 2:
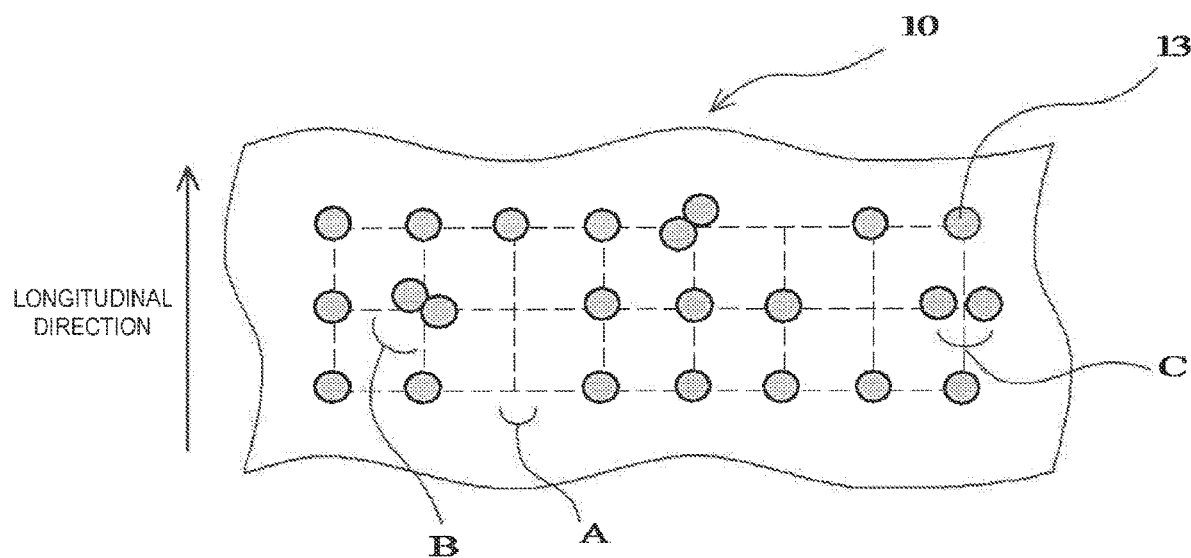
FIG. 2 is a perspective plan view of the anisotropic electrically conductive film of the first mode of the present invention.

As illustrated in FIG. 1 (cross-sectional view) and FIG. 2 (perspective plan view), an anisotropic electrically conductive film 10 according to an embodiment of the present invention has a structure in which an electrically insulating adhesive base layer 11 and an electrically insulating adhesive cover layer 12 are laminated together, and near an interface therebetween, electrically conductive particles 13 are disposed at the lattice points of the planar lattice pattern (dotted line in FIG. 2). In FIGS. 1 and 2, the planar lattice pattern is assumed to be along a longitudinal direction of the anisotropic electrically conductive film 10 and a direction (short-side direction) that is orthogonal to the longitudinal direction; however, the entire pattern may be assumed to be inclined with respect to both the longitudinal direction and the short-side direction. Here, an arrow A indicates a position at which no electrically conductive particles are disposed at the lattice points with a planar lattice, in other words, a position at which there is so-called "omission" of the electrically conductive particles. Note that an arrow B indicates a position at which the electrically conductive particles are aggregated in contact with each other, and an arrow C indicates a position at which the electrically conductive particles are aggregated without contacting each other. Here, to "aggregate without contacting each other" means that the electrically conductive particles are in close proximity in a range not exceeding 25% the average particle diameter of the electrically conductive particles.

"Omission" of Electrically Conductive Particle

In the anisotropic electrically conductive film according to an embodiment of the present invention, a proportion of "lattice points, at which no electrically conductive particles are disposed" (A in FIG. 2) (proportion of the lattice points at which an electrically conductive particle is not present) with respect to all the lattice points of the planar lattice pattern assumed as any reference region of the anisotropic electrically conductive film is set to less than 20%, preferably to 18% or less, and more preferably to 10 to 18%. Thereby, in a case where the anisotropic electrically conductive film according to an embodiment of the present invention is applied to anisotropic conductive connection, it is possible to achieve good initial conductivity and good conduction reliability after aging, and it is also possible to suppress occurrence of a short circuit.

Planar Lattice Pattern

Examples of the planar lattice pattern include a rhombic lattice, a hexagonal lattice, a square lattice, a rectangular lattice, and a parallelotope lattice. In particular, the hexagonal lattice, in which closest packing is possible, is preferable.

Here, it is possible to select the whole surface of the anisotropic electrically conductive film as the reference region of the anisotropic electrically conductive film, but ordinarily, it is preferable to select, as the reference region, a substantially square region including a side X and a side Y in a center portion of the anisotropic electrically conductive film plane, the side X and the side Y satisfying the following Relationship (A), and preferably satisfying the following Relationships (1), (2), and (3).

$$100D \leq X+Y \leq 400D \quad (A)$$

$$X+Y=100D \quad (1)$$

$$X \geq 5D \quad (2)$$

$$Y \geq 5D \quad (3)$$

Note that in a case of applying the film to FOG connection in which a connection area is comparatively large, it is possible to reduce the amount of electrically conductive particles being present in the film. In such a case, as described below, it is preferable to increase each of the values of X and Y, preferably to 20D or greater, and it is preferable to set a value of "X+Y" to a value from 100D to around 400D and finally to 400D.

$$X+Y=400D$$

$$X \geq 20D$$

$$Y \geq 20D$$

In Relationships (A) and (1) to (3), and the above relationships, D is an average particle diameter of the electrically conductive particles. It is possible to measure the average particle diameter of the electrically conductive particles by using an image-type or laser-type particle size analyzer. A surface observation can be used for such a measurement. In addition, the side Y is a straight line disposed at an angle in a range of less than ±45° with respect to the longitudinal direction (refer to FIG. 2) of the anisotropic electrically conductive film, and the side X is a straight line perpendicular to the side Y.

By defining the reference region in this manner, the reference region may resemble or approximate a shape of a bump to which the electrically conductive particles are pressed. As a result, it is possible to increase the permissible range of shift of the electrically conductive particles from the planar lattice pattern, and anisotropic conductive connection is economically and stably established. In other words, it is possible to reliably establish anisotropic conductive connection because the electrically conductive particles are captured by any bump and there is no excessive aggregation in a space between bumps, even if there may be a shift, an omission or a contact of the electrically conductive particles in a range assumed to be in a range in which the smallest side of the reference region is set to 5 times or greater of the electrically conductive particle diameter.

Note that the reason that the smallest side is 5 times or greater of the electrically conductive particle diameter is because it is necessary for the side to be typically larger than the average particle diameter of the electrically conductive particles for reliably capturing the particles in at least one side of the bump that is subjected to anisotropic conductive connection, and moreover, it is necessary to desirably provide a size 2 times or greater the average particle diameter of the electrically conductive particles for a space between bumps because of preventing a short circuit. In other words, the reason is because when focusing on a circular electrically conductive particle as one reference, if an unexpected failure does not occur within a concentric circle having a diameter of sum of the average particle diameter D and 4 times the size thereof (4D), that is 5D, then it is considered that the requirements described above can be satisfied. In addition, the reason is because a minimum distance between bumps in a case of a fine pitch is less than 4 times the electrically conductive particle diameter as an example.

Aggregation of Electrically Conductive Particles

In a case of the anisotropic electrically conductive film according to an embodiment of the present invention, a proportion of the lattice points (B and C of FIG. 2) having plural electrically conductive particles disposed in an aggregated state with respect to all the lattice points of the planar lattice pattern is preferably 15% or less and more preferably 5% or less. The proportion is theoretically most preferable to become 0%, thus it may be less than 0.1%. When the proportion of the lattice points of aggregated disposition is 5% or less, even in a case where the anisotropic electrically conductive film according to an embodiment of the present invention is applied to the anisotropic conductive connection, it is possible to achieve better initial conductivity and conduction reliability after aging, and it is also possible to further suppress occurrence of a short circuit. Here, the degree of aggregation of the electrically conductive particles with respect to one lattice point is as small as possible from the viewpoint of suppressing a short circuit and it is preferable not to exceed two. Note that as illustrated as C in FIG. 2, in the case where the aggregated electrically conductive particles are not in contact with each other, the space between them is preferably within 25% of the average particle diameter of the electrically conductive particles, and more preferably within 15%.

Note that, in the first mode, a sum of the omission and the aggregation is preferably less than 25%.

Arrangement of Electrically Conductive Particles

It is preferable that 11 or more electrically conductive particles are consecutively disposed in a direction perpendicular to the longitudinal direction of the film, and it is more preferable that 13 or more electrically conductive particles are consecutively disposed. This is because, when there is an absence of electrically conductive particles in the longitudinal direction of the bump, there is a concern that there is a failure to anisotropic conductive connection. In this case, it is preferable that all of the three consecutive rows along the longitudinal direction of the film satisfy the above condition, and it is more preferable that all of the five consecutive rows satisfy the above condition. Thereby, the number of electrically conductive particles captured by the bump can be equal to a certain number or more, and it is possible to achieve a stable anisotropic conductive connection.

When the electrically conductive particles are aggregated, it is preferable that in the vicinity of an aggregation of the two electrically conductive particles, there are three or less sets of electrically conductive particles that are connected by two, and more preferable that there are two sets or less, and even more preferable that there is one set or less. This is because when aggregations of the two electrically conductive particles densely exist, it becomes a cause of occurrence of a short circuit.

In addition, it is preferable that absence of four or more consecutive electrically conductive particles in the longitudinal direction of the film and absence of four or more consecutive electrically conductive particles in the direction orthogonal to the longitudinal direction of the film do not intersect, it is more preferable that any of the absence of the four or more consecutive electrically conductive particles is not adjacent to each other via one or more electrically conductive particles being lattice points, and it is even more preferable that any of the consecutive four or more absences is not adjacent to each other via two or more electrically conductive particles being lattice points. Such an intersection of absence is not a problem even if up to three rows intersect simultaneously with absence in one direction. This is because when there is consecutive absence not more than three rows, the electrically conductive particles in the vicinity thereof are captured by a bump.

Note that, generally it is not preferable that plural regions having consecutive absences intersecting with one another in this way are present in the vicinity of one another. However, as long as an anisotropic conductive connection is established via arrangements of the electrically conductive particles, the number of which is equal to or more than the number of regions with absences, there is no problem in the stability of the anisotropic conductive connection.

Particle Area Occupancy

In addition, it is effective when a particle area occupancy, with respect to the area of the reference region of the anisotropic electrically conductive film, of all electrically conductive particles present in the area is generally 0.15% or greater, preferably 0.35% or greater, and more preferably 1.4% or greater in a case where a bump size or a distance between bumps is relatively large, as in the FOG connection. An upper limit in this case is preferably 35% or less and is more preferably 32% or less. Furthermore, in a case where the bump size or the distance between the bumps is relatively small (for example, COG connection), the upper limit is preferably from 15 to 35%, and more preferably from 16 to 20%. When the distance is in this range, even in a case where the anisotropic electrically conductive film according to an embodiment of the present invention is applied to anisotropic conductive connection, it is possible to achieve better initial conductivity and conduction reliability after aging, and it is also possible to further suppress occurrence of a short circuit. Here, the particle area occupancy is a proportion, with respect to an area S of a reference region, of an area occupied by all the electrically conductive particles present in the reference region. The area occupied by all the electrically conductive particles is represented by $(R/2)^2 \times \pi \times n$ wherein R is the average particle diameter of the electrically conductive particles and n is the number of electrically conductive particles. Accordingly, the particle area occupancy is represented by the following equation: particle area occupancy (%)=$[\{(R/2)^2 \times \pi \times n\}/S] \times 100$.

Note that, the calculated particle area occupancy is 0.157% in a case where the average particle diameter of the electrically conductive particles is 2 μm, a number density is 500/mm$^2$ (0.00054 μm$^2$), X=Y=200D, and X+Y=400D. The calculated particle area occupancy is 0.35325% in a case where the average particle diameter of the electrically conductive particles is 3 μm, the number density is 500/mm$^2$ (0.0005/μm$^2$), X=Y=200D, and X+Y=400D. The calculated particle area occupancy is 1.413% in a case where the average particle diameter of the electrically conductive particles is 3 μm, the number density is 2000/mm$^2$ (0.002/μm$^2$), X=Y=200D, and X+Y=400D. In addition, the calculated particle area occupancy is 35.325% in a case where the average particle diameter of the electrically conductive particles is 30 μm, the number density is 500/mm$^2$ (0.0005/μm$^2$), X=Y=200D, and X+Y=400D.

Electrically Conductive Particles

It is possible to appropriately select and use any electrically conductive particles used in a known anisotropic electrically conductive film. Examples of the electrically conductive particles include metal particles such as nickel, copper, silver, gold, and palladium and metal-coated resin particles, where the surface of resin particles such as polyamide and polybenzoguanamine is coated with metal such as nickel. In addition, from the viewpoint of handling during production, the average particle diameter of the electrically conductive particles is preferably from 1 to 30 µm, more preferably from 1 to 10 µm, and particularly preferably from 2 to 6 µm. As described above, it is possible to measure the average particle diameter of the electrically conductive particles using the image-type particle size analyzer. A surface observation can be used for such a measurement.

The amount of the electrically conductive particles present in the anisotropic electrically conductive film depends on the lattice pitch of the planar lattice pattern and the average particle diameter of the electrically conductive particles, and ordinarily is from 300 to 40000/mm$^2$.

Distance Between Adjacent Lattice Points

The distance between adjacent lattice points of a planar lattice pattern that is assumed for the anisotropic electrically conductive film is preferably greater than 0.5 times, more preferably 1 time or greater, even more preferably from 1 to 20 times the average particle diameter of the electrically conductive particles. When the distance is in this range, even in a case where the anisotropic electrically conductive film according to an embodiment of the present invention is applied to anisotropic conductive connection, it is possible to achieve better initial conductivity and conduction reliability after aging, and it is also possible to further suppress occurrence of a short circuit.

Electrically Insulating Adhesive Base Layer

As the electrically insulating adhesive base layer 11, it is possible to appropriately select and use a base layer used as an electrically insulating adhesive base layer in a known anisotropic electrically conductive film. For example, it is possible to use a photoradical polymerizable resin layer including an acrylate compound and photoradical polymerization initiator, a thermal radical polymerizable resin layer including an acrylate compound and a thermal radical polymerization initiator, a thermal cationic polymerizable resin layer including an epoxy compound and a thermal cationic polymerization initiator, a thermal anionic polymerizable resin layer including an epoxy compound and a thermal anionic polymerization initiator, and the like, or a cured resin layer thereof. In addition, it is possible to appropriately select and include a silane coupling agent, a pigment, an antioxidant, an ultraviolet absorber, and the like in the resin layers as appropriate.

Note that the electrically insulating adhesive base layer 11 can be formed by depositing a film using a coating method and drying, and further curing, a coating composition including the resin as described above, or otherwise by forming the coating composition into a film using a method known in advance.

The thickness of such an electrically insulating adhesive base layer 11 is preferably from 1 to 30 µm and more preferably from 2 to 15 µm.

Electrically Insulating Adhesive Cover Layer

As the electrically insulating adhesive cover layer 12, a cover layer used as an electrically insulating adhesive cover layer in a known anisotropic electrically conductive film can be selected and used as appropriate. Alternatively, the cover layer formed from the same material as that of the electrically insulating adhesive base layer 11 as described earlier can be also used.

Note that the electrically insulating adhesive cover layer 12 may be formed by using a coating method and drying, and further curing, a coating composition including the resin as described above, or otherwise by forming a film using a known technique in advance.

The thickness of such an electrically insulating adhesive cover layer 12 is preferably from 1 to 30 µm and more preferably from 2 to 15 µm.

Furthermore, an electrically insulating filler such as silica fine particles, alumina, and aluminum hydroxide may be added to the electrically insulating adhesive base layer 11 or the electrically insulating adhesive cover layer 12 as necessary. The blending amount of the electrically insulating filler is preferably from 3 to 40 parts by mass per 100 parts by mass of resin included in the layers. Thereby, even when the electrically insulating adhesive layer is melted during anisotropic conductive connection, it is possible to prevent the electrically conductive particles 13 from moving unnecessarily by the melted resin.

Lamination of Electrically Insulating Adhesive Base Layer and Electrically Insulating Adhesive Cover Layer and Embedding of Electrically Conductive Particles Note that in a case where the electrically insulating adhesive base layer 11 and the electrically insulating adhesive cover layer 12 are laminated together with the electrically conductive particles 13 being interposed therebetween, it is possible to perform the lamination by using a known technique. In this case, the electrically conductive particles 13 are present near the interface of the layers. Here, "present near the interface" indicates that a part of the electrically conductive particles intrudes into one layer, and the remainder intrudes into the other layer. Furthermore, the electrically conductive particles may be embedded into the electrically insulating adhesive base layer. In this case, the electrically insulating adhesive cover layer may be formed without lamination.

Production of Anisotropic Electrically Conductive Film of First Mode

Next, a method of producing an anisotropic electrically conductive film, according to the first mode of the present invention, which has a structure in which the electrically insulating adhesive base layer and the electrically insulating adhesive cover layer are laminated together, and near an interface therebetween, electrically conductive particles are disposed at the lattice points of the planar lattice pattern, will be described. The production method has the following steps (i) to (v). Each step will be described in detail with reference to the drawings. Note that this production method is not limiting.

Step (i)

Figure 3A:
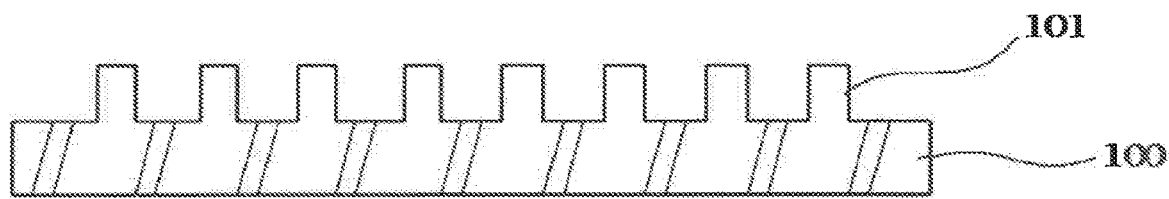
FIG. 3A is a step explanatory diagram of a method of producing the anisotropic electrically conductive film of the first mode of the present invention.

First, as illustrated in FIG. 3A, a transfer body 100 is prepared in which a columnar convex portion 101 corresponding to the lattice points of the planar lattice pattern is formed on the surface. Here, the columnar shape includes a cylindrical shape or prism shape (a triangular prism, a square prism, a hexagonal prism, and the like). This columnar shape includes a cone type. The columnar shape is preferably the cylindrical shape. The height of the convex portion 101 can be determined depending on a terminal pitch, a terminal width, a spacing width, the average particle diameter of the electrically conductive particles, and the like where anisotropic conductive connection should be provided. And the height is preferably not less than 1.2 times and less than 2 times the average particle diameter of the electrically conductive particles used. In addition, a full width at half height (width at a half height) of the convex portion 101 is preferably not less than 0.7 times and not greater than 1.3 times the average particle diameter of the electrically conductive particle. If the height and width are in this range, then an effect is obtained in which consecutive occurrence of shedding and omission is avoided.

Furthermore, the convex portion 101 has a flat top surface with a flatness that can promote stable deposition of the electrically conductive particles.

Specific Example of Transfer Body

The transfer body that should be prepared in the step (i) can be prepared by utilizing a well-known technique. For example, a transfer body can be prepared by processing a metal plate to prepare a master, which is then coated with a curable resin composition, followed by curing. Specifically, a flat metal plate is cut and processed to prepare a transfer body master formed with a concave portion corresponding to a convex portion, and then a concave portion formation surface of the master is coated with a resin composition that configures the transfer body followed by curing. Then the composition is separated from the master to obtain the transfer body.

Step (ii)

Figure 3B:
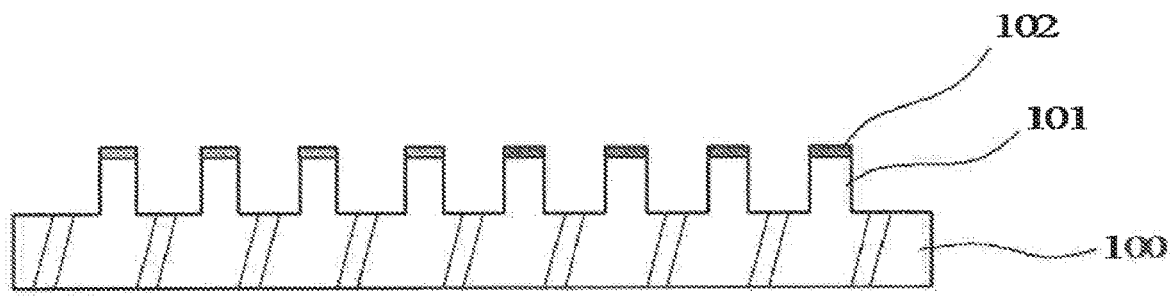
FIG. 3B is a step explanatory diagram of the method of producing the anisotropic electrically conductive film of the first mode of the present invention.

Next, as illustrated in FIG. 3B, at least the top surface of the convex portions 101 of the transfer body 100 in which plural convex portions 101 are formed with the planar lattice pattern on the surface is set as a weak adhesive layer 102.

Weak Adhesive Layer of Transfer Body

The weak adhesive layer 102 is a layer that exhibits an adhesive force, by which it is possible to temporarily hold the electrically conductive particles until the electrically conductive particles are transferred to the electrically insulating adhesive base layer configuring the anisotropic electrically conductive film. Such a weak adhesive layer 102 is formed at least on the top surface of the convex portions 101. Accordingly, the entire convex portions 101 may be weakly adhesive. The thickness of the weak adhesive layer 102 can be appropriately determined depending on the material of the weak adhesive layer 102, the particle diameter of the electrically conductive particles, and the like. In addition, "weak adhesive" has a meaning of a weaker adhesive force than the electrically insulating adhesive base layer when the electrically conductive particles are transferred to the electrically insulating adhesive base layer.

For such a weak adhesive layer 102, a weak adhesive layer used in a known anisotropic electrically conductive film can be used. For example, it is possible to form the weak adhesive layer by applying a silicone-based adhesive composition or an adhesive layer of the same material as in the electrically insulating adhesive base layer or the electrically insulating adhesive cover layer on a top surface of the convex portions 101.

Step (iii)

Figure 3C:
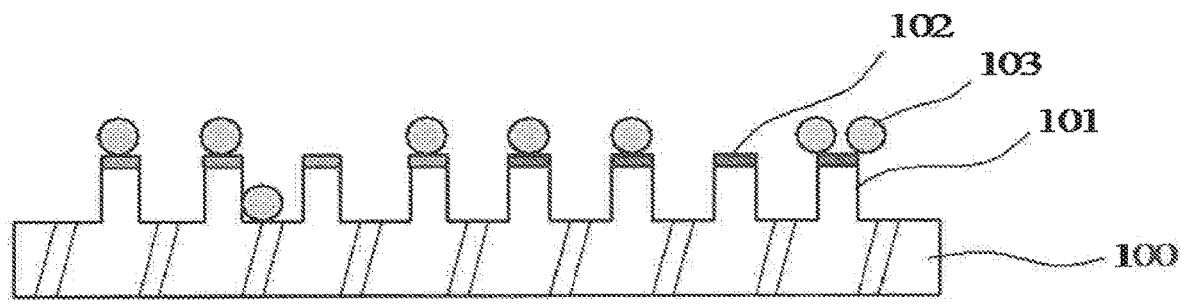
FIG. 3C is a step explanatory diagram of the method of producing the anisotropic electrically conductive film of the first mode of the present invention.

Next, as illustrated in FIG. 3C, the electrically conductive particles 103 are deposited on the weak adhesive layer 102 of the convex portions 101 of the transfer body 100. Specifically, the electrically conductive particles 103 are scattered from above the convex portions 101 of the transfer body 100, the electrically conductive particles 103 that are not deposited on the weak adhesive layer 102 may be blown away using a blower. Alternatively, the direction of the surface is reversed from FIG. 3C, and the top surface of a projection may be deposited on a surface all over which the electrically conductive particles are laid. This is to avoid unnecessary stress applied to the electrically conductive particles. It is easy to recover and reuse the electrically conductive particles by only electrically conductive particles necessary for the arrangement being deposited on the top surface of the projection. Thus, economic superiority is obtained in comparison with a method, in which the electrically conductive particles are packed in an opening portion and removed later. Note that in a case of the method, in which the electrically conductive particles are packed in an open portion and removed later, there is a concern that unnecessary stress is easily applied to the unpacked electrically conductive particles.

Note that in FIG. 3C, a width of the convex portion 101 in the left half is adjusted to be narrower than that of the convex portion 101 in the right half. As a result, there may be a difference in aggregation mode of the electrically conductive particle 103 between in the left half and the right half as illustrated in FIG. 3C.

Step (iv)

Figure 3D:
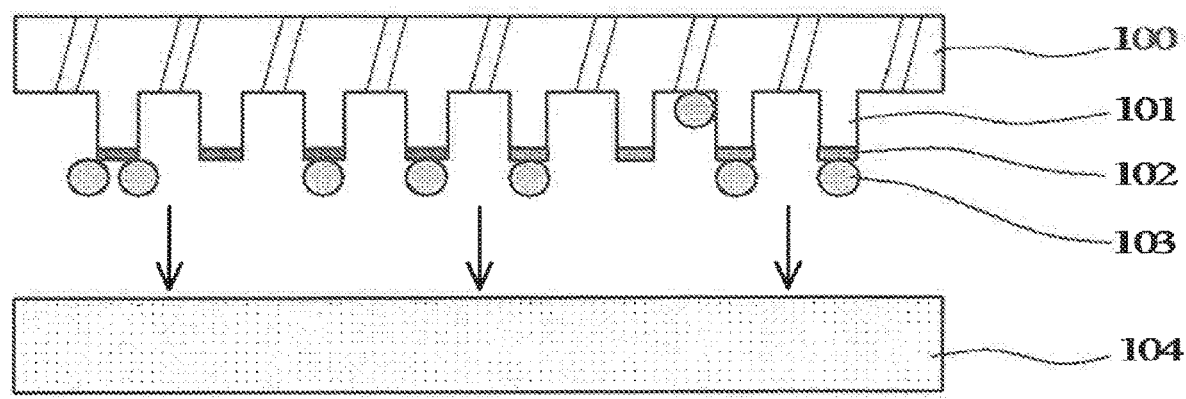
FIG. 3D is a step explanatory diagram of the method of producing the anisotropic electrically conductive film of the first mode of the present invention.
Figure 3E:
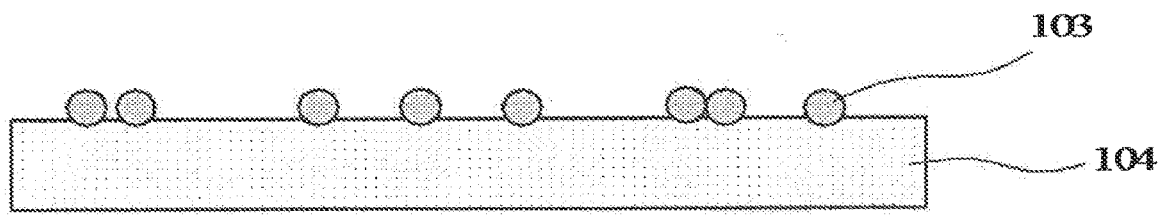
FIG. 3E is a step explanatory diagram of the method of producing the anisotropic electrically conductive film of the first mode of the present invention.

Next, as illustrated in FIG. 3D, when the electrically insulating adhesive base layer 104 that should configure the anisotropic electrically conductive film is overlapped and pressed on a surface at a side on which the electrically conductive particles 103 of the transfer body 100 are deposited, the electrically conductive particles 103 are transferred to one side of the electrically insulating adhesive base layer 104 (FIG. 3E). In this case, preferably the transfer body 100 overlaps and presses the electrically insulating adhesive base layer 104 such that the convex portions 101 face downward. This is because the electrically conductive particles that are not stuck to the top surface of the convex portion are easily removed by being blown while facing down.

Step (v)

Figure 3F:
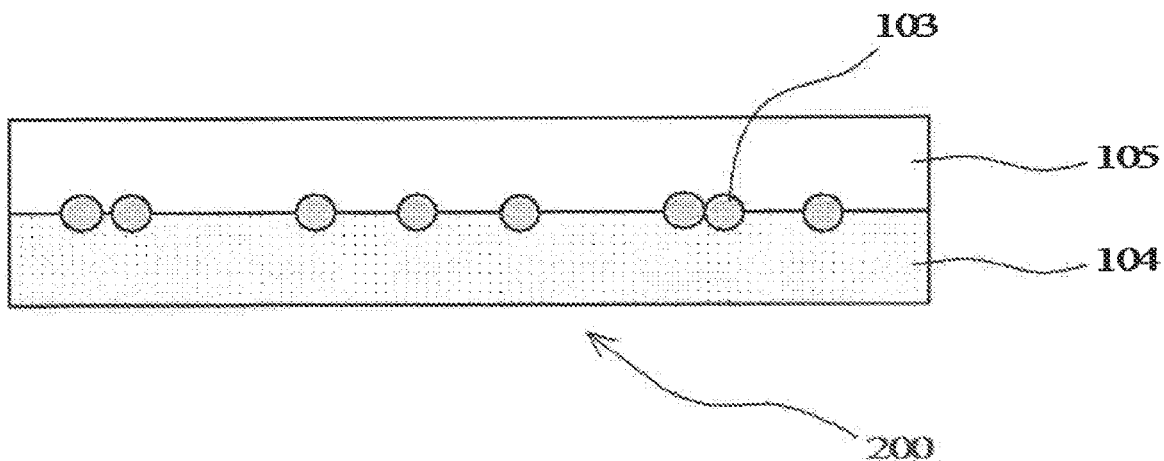
FIG. 3F is a step explanatory diagram of the method of producing the anisotropic electrically conductive film of the first mode of the present invention while being a schematic cross-sectional view of the anisotropic electrically conductive film of the first mode of the present invention.

As illustrated in FIG. 3F, the electrically insulating adhesive base layer 104 to which the electrically conductive particles 103 are transferred is laminated, from the electrically conductive particle transferred surface side, with the electrically insulating adhesive cover layer 105. Thereby, an anisotropic electrically conductive film 200 according to an embodiment of the present invention is obtained.

Note that in this anisotropic electrically conductive film 200, there are cases where at one lattice point of a planer lattice pattern, plural conductive particles are disposed in an aggregated state in contact with each other in a horizontal direction or in close proximity. This is because when depositing the electrically conductive particles on the weak adhesive layer of the convex portion of the transfer body, the width of the convex portion (width of the weak adhesive layer) and the average particle diameter of electrically conductive particles are roughly the same, thus presence of plural electrically conductive particles on one convex portion is unlikely; however, there is a possibility that excessive electrically conductive particles may be deposited on the terminal portion of the weak adhesive layer or those which have detached from the convex portion and failed to be blown off may remain in the gap between convex portions of the transfer body.

Next, an anisotropic electrically conductive film and a method of producing the anisotropic electrically conductive film according to the second mode of the present invention will be described in detail with reference to the drawings.

Anisotropic Electrically Conductive Film of Second Mode

Figure 4:
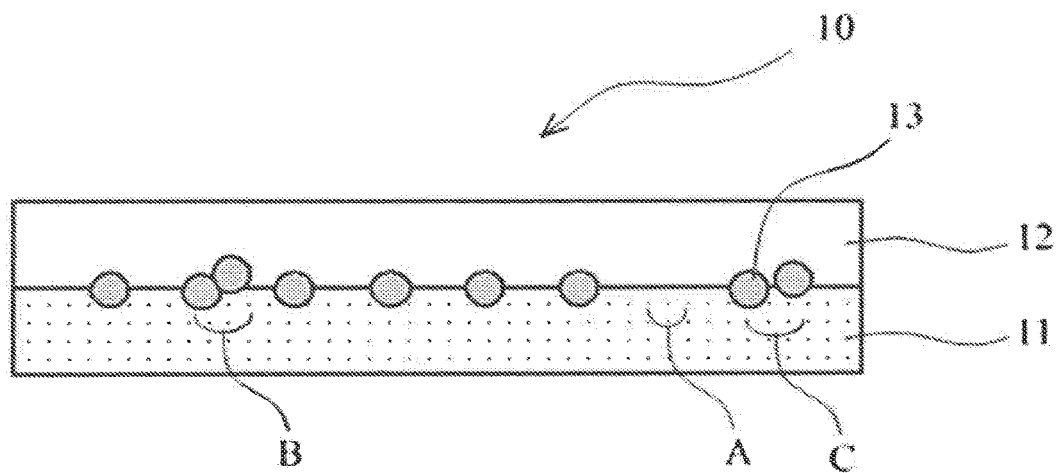
FIG. 4 is a cross-sectional view of an anisotropic electrically conductive film of a second mode of the present invention.
Figure 5A:
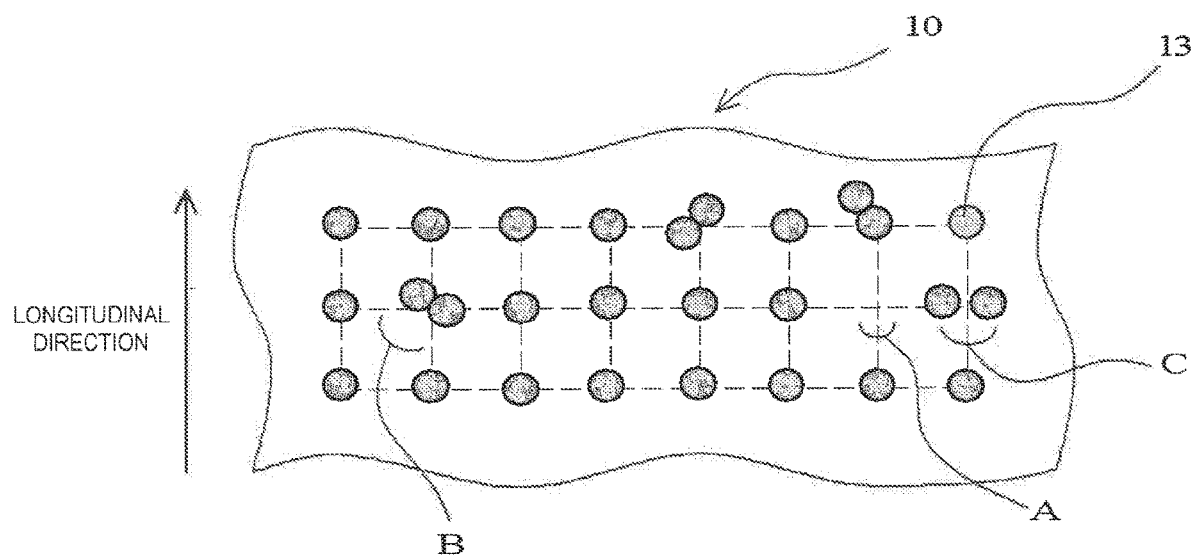
FIG. 5A is a perspective plan view of the anisotropic electrically conductive film of the second mode of the present invention.
Figure 5B:
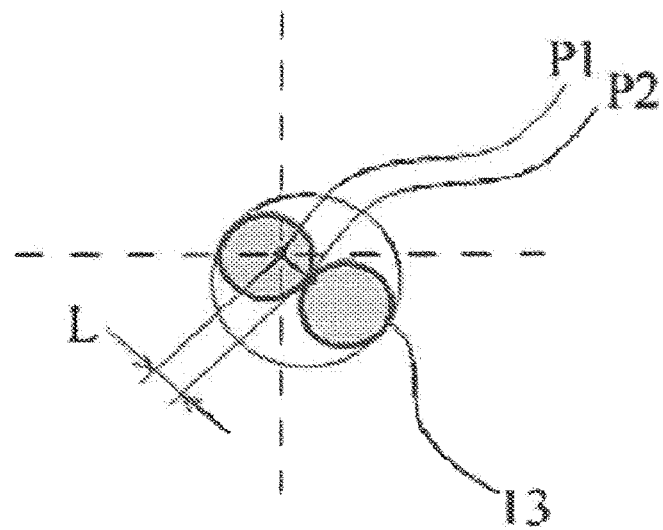
FIG. 5B is a partially enlarged view of the perspective plan view of the anisotropic electrically conductive film of the second mode of the present invention.

As illustrated in FIG. 4 (cross-sectional view), FIG. 5A, and FIG. 5B (perspective plan view), an anisotropic electrically conductive film 10 according to an embodiment of the present invention has a structure in which an electrically insulating adhesive base layer 11 and an electrically insulating adhesive cover layer 12 are laminated together, and near an interface therebetween, electrically conductive particles 13 are disposed at the lattice points of the planar lattice pattern (dotted line in FIG. 5A and FIG. 5B). In FIGS. 4, 5A, and 5B, the planar lattice pattern is assumed to be along a longitudinal direction of the anisotropic electrically conductive film 10 and a direction (short-side direction) that is orthogonal to the longitudinal direction; however, the entire pattern may be assumed to be inclined with respect to both the longitudinal direction and the short-side direction. Here, an arrow A indicates a position at which no electrically conductive particle is disposed at the lattice points of a planar lattice, and a position at which there is so-called "omission" of the electrically conductive particles. Note that an arrow B indicates a position at which the electrically conductive particles are aggregated in contact with each other (connected), and an arrow C indicates a position at which the electrically conductive particles are aggregated without contacting each other. Here, to "aggregate without contacting each other" means that the electrically conductive particles are in close proximity in a range not exceeding 25% the average particle diameter of the electrically conductive particles.

"Omission" of Electrically Conductive Particle

In the anisotropic electrically conductive film according to an embodiment of the present invention, a proportion of "lattice points, at which no electrically conductive particle is disposed" (A of FIG. 5A) (proportion of the lattice points at which an electrically conductive particle is not present) with respect to all the lattice points of the planar lattice pattern assumed as any reference region of the anisotropic electrically conductive film is set to less than 5%, preferably 4% or less, and more preferably from 1 or more to 4% or less. Thereby, in a case where the anisotropic electrically conductive film according to an embodiment of the present invention is applied to anisotropic conductive connection, it is possible to achieve good initial conductivity and good conduction reliability after aging, and it is also possible to suppress occurrence of a short circuit.

Planar Lattice Pattern

Examples of the planar lattice pattern include a rhombic lattice, a hexagonal lattice, a square lattice, a rectangular lattice, and a parallelotope lattice. In particular, the hexagonal lattice, in which closest packing is possible, is preferable.

Here, it is possible to select the whole surface of the anisotropic electrically conductive film as the reference region of the anisotropic electrically conductive film, but ordinarily, it is preferable to select, as the reference region, a substantially square region including a side X and a side Y in a center portion of the anisotropic electrically conductive film plane, the side X and the side Y satisfying the following Relationship (A), and preferably satisfy the following Relationships (1), (2), and (3).

$100D \leq X+Y \leq 400D$ (A)

$X+Y=100D$ (1)

$X \geq 5D$ (2)

$Y \geq 5D$ (3)

Note that in a case of applying the film to FOG connection in which a connection area is comparatively large, it is possible to reduce the amount of electrically conductive particles being present in the film. In such a case, as described below, it is preferable to increase each of the values of X and Y, preferably to 20D or greater, and it is preferable to set a value of "X+Y" to a value from 100D to around 400D and finally to 400D.

$X+Y=400D$ $X \geq 20D$ $Y \geq 20D$

In Relationships (A) and (1) to (3), and the above relationships, D is an average particle diameter of the electrically conductive particles. It is possible to measure the average particle diameter of the electrically conductive particles by using an image-type or laser-type particle size analyzer. A surface observation can be used for such a measurement. In addition, the side Y is a straight line disposed at an angle in a range of less than ±45° with respect to the longitudinal direction (refer to FIG. 5A) of the anisotropic electrically conductive film, and the side X is a straight line perpendicular to the side Y.

By defining the reference region in this manner, the reference region may resemble or approximate a shape of a bump to which the electrically conductive particles are pressed. As a result, it is possible to increase the permissible range of shift of the electrically conductive particles from the planar lattice pattern, and anisotropic conductive connection is economically and stably established. In other words, it is possible to reliably establish anisotropic conductive connection because the electrically conductive particles are captured by any bump and there is no excessive aggregation in a space between bumps, even if there may be a shift, an omission or a contact of the electrically conductive particles in a range assumed to be in a range in which the smallest side of the reference region is set to 5 times or greater of the electrically conductive particle diameter.

Note that the reason that the smallest side is 5 times or greater of the electrically conductive particle diameter is because it is necessary for the side to be typically larger than the average particle diameter of the electrically conductive particles for reliably capturing the particles in at least one side of the bump that is subjected to anisotropic conductive connection, and moreover, it is necessary to desirably provide a size 2 times or greater the average particle diameter of the electrically conductive particles for a space between bumps because of preventing a short circuit. In other words, the reason is because when focusing on a circular electrically conductive particle as one reference, if an unexpected failure does not occur within a concentric circle having a diameter of sum of the average particle diameter D and 4 times the size thereof (4D), that is 5D, then it is considered that the requirements described above can be satisfied. In addition, the reason is because a minimum distance between bumps in a case of a fine pitch is less than 4 times the electrically conductive particle diameter as an example.

Aggregation of Electrically Conductive Particles

Furthermore, in the anisotropic electrically conductive film according to an embodiment of the present invention, a proportion of the lattice points with plural electrically conductive particles disposed in an aggregated state with respect to all the lattice points of the planar lattice pattern (arrows B and C in FIG. 5A) is preferably 15% or less, may be greater than 10% and less than 15%, and as long as it is from 11 or more to 14% or less, there is no practical problem. When the proportion of the lattice points of aggregated disposition is within this range, even in a case where the anisotropic electrically conductive film according to an embodiment of the present invention is applied to the anisotropic conductive connection, it is possible to achieve better initial conductivity and conduction reliability after aging, and it is also possible to further suppress occurrence of a short circuit. Here, a state in which the electrically conductive particles are aggregated includes not only a case where the electrically conductive particles are directly connected as indicated by an arrow B of FIG. 5A but also a case where the electrically conductive particles are in extreme proximity to one another though not connected directly as indicated by an arrow C of FIG. 5A. The spacing of the above mentioned proximity is preferably within 25% of the average particle diameter of the electrically conductive particles. Furthermore, the degree of aggregation of the electrically conductive particles with respect to a single lattice point, although it is possible to have cases where more than two electrically conductive particles are connected in a chain, but from the viewpoint of suppressing short circuits, is preferable to be small, and it is preferable that more than two electrically conductive particles do not aggregate.

Note that in this second mode, a sum of the omission and the aggregation is preferably less than 20%.

In the present invention, the aggregation direction of the electrically conductive particles disposed in an aggregated state (normally, a direction of a line connecting the centroids of each of the two aggregated electrically conductive particles) is shifted in a thickness direction, thus becomes inclined with respect to the plane direction of the anisotropic electrically conductive film as in the arrows B and C of FIG. 4. In order not to disrupt pressing during connection, the degree of inclination is preferably between 5° to 45°, more preferably between 10° to 40°. Note that the reason that such inclination occurs is because it is possible to capture electrically conductive particles by only one side when it is present at the terminal portion of the bump at the time of connection (pressing is affected if overlapping without inclination). Note that there is no particular problem even if the aggregation is in a horizontal direction.

Arrangement of Electrically Conductive Particles

It is preferable that 11 or more electrically conductive particles are consecutively disposed in a direction perpendicular to the longitudinal direction of the film, and it is more preferable that 13 or more electrically conductive particles are consecutively disposed. This is because, when there is an absence of electrically conductive particles in the longitudinal direction of the bump, there is a concern that there is a failure to anisotropic conductive connection. In this case, it is preferable that all of the three consecutive rows along the longitudinal direction of the film satisfy the above condition, and it is more preferable that all of the five consecutive rows satisfy the above condition. Thereby, the number of electrically conductive particles captured by the bump can be equal to a certain number or more, and it is possible to achieve a stable anisotropic conductive connection.

When the electrically conductive particles are aggregated, it is preferable that in the vicinity of an aggregation of the two electrically conductive particles, there are three or less sets of electrically conductive particles that are connected by two, and more preferable that there are two sets or less, and even more preferable that there is one set or less. This is because when aggregations of the two electrically conductive particles densely exist, it becomes a cause of occurrence of a short circuit. It is preferable that the aggregations of the two electrically conductive particles are within three consecutive sets in one direction of the arrangement while satisfying the above mentioned conditions.

In addition, it is preferable that absence of four or more consecutive electrically conductive particles in the longitudinal direction of the film and absence of four or more consecutive electrically conductive particles in the direction orthogonal to the longitudinal direction of the film do not intersect, it is more preferable that any of the absence of four or more consecutive electrically conductive particles is not adjacent to each other via one or more electrically conductive particles being lattice points, and it is even more preferable that any of the consecutive four or more absences is not adjacent to each other via two or more electrically conductive particles being lattice points. Such an intersection of absence is not a problem even if up to three rows intersect simultaneously with absence in one direction. This is because when there is consecutive absence not more than three rows, the electrically conductive particles in the vicinity thereof are captured by a bump.

Note that, generally it is not preferable that plural regions having consecutive absences intersecting with one another in this manner are present in the vicinity of one another. However, as long as an anisotropic conductive connection is established via arrangements of the electrically conductive particles, the number of which is equal to or more than the number of regions with absences, there is no problem in the stability of the anisotropic conductive connection.

In addition, as illustrated in FIG. 5B, from the viewpoint of suppressing short circuits, it is preferable that a distance L between a lattice point P1 in which the aggregated electrically conductive particles 13 are disposed and a center P2 of a circle inscribing the aggregated electrically conductive particles 13 is 25% or less with respect to the average particle diameter of electrically conductive particles.

Particle Area Occupancy

In addition, it is effective when a particle area occupancy, with respect to the area of any reference region of the anisotropic electrically conductive film, of all electrically conductive particles present in the area is generally 0.15% or greater, preferably 0.35% or greater, and more preferably 1.4% or greater in a case where a bump size or a distance between bumps is relatively large, as in the FOG connection. An upper limit in this case is preferably 35% or less and is more preferably 32% or less. Furthermore, in a case where the bump size or the distance between bumps is relatively small (for example, COG connection), the upper limit is even more preferably from 15 to 35%, and particularly preferably from 20 to 25%. When the distance is in this range, even in a case where the anisotropic electrically conductive film according to an embodiment of the present invention is applied to anisotropic conductive connection, it is possible to achieve better initial conductivity and conduction reliability after aging, and it is also possible to further suppress occurrence of a short circuit. Here, the particle area occupancy is a proportion of an area that all electrically conductive particles occupy which are present in any reference region with respect to an area S of the reference region. The area occupied by all the electrically conductive particles is represented by $(R/2)^2 \times \pi \times n$ wherein R is the average particle diameter of the electrically conductive particles and n is the number of electrically conductive particles. Accordingly, the particle area occupancy is represented by the following equation: particle area occupancy (%)=$[\{(R/2)^2 \times \pi \times n\}/S] \times 100$.

Note that, the calculated particle area occupancy is 0.157% in a case where the average particle diameter of the electrically conductive particles is 2 μm, a number density is 500/mm² (0.00054/μm²), X=Y=200D, and X+Y=400D. The calculated particle area occupancy is 0.35325% in a case where the average particle diameter of the electrically conductive particles is 3 μm, the number density is 500/mm² (0.0005/μm²), X=Y=200D, and X+Y=400D. The calculated particle area occupancy is 1.413% in a case where the average particle diameter of the electrically conductive particles is 3 μm, the number density is 2000/mm² (0.002/μm²), X=Y=200D, and X+Y=400D. In addition, the calculated particle area occupancy is 35.325% in a case where the average particle diameter of the electrically conductive particles is 30 µm, the number density is 500/mm² (0.0005/µm²), X=Y=200D, and X+Y=400D.

Electrically Conductive Particles

It is possible to appropriately select and use any electrically conductive particles used in a known anisotropic electrically conductive film. Examples of the electrically conductive particles include metal particles such as nickel, copper, silver, gold, and palladium and metal-coated resin particles, where the surface of resin particles such as polyamide and polybenzoguanamine is coated with metal such as nickel. Furthermore, from the viewpoint of handling during production, the average particle diameter of the electrically conductive particles is preferably from 1 to 30 µm, more preferably from 1 to 10 µm, and particularly preferably from 2 to 6 µm. As described above, it is possible to measure the average particle diameter of the electrically conductive particles by using an image-type or laser-type particle size analyzer.

The amount of the electrically conductive particles present in the anisotropic electrically conductive film depends on the lattice pitch of the planar lattice pattern and the average particle diameter of the electrically conductive particles, and ordinarily is from 300 to 40000/mm².

Distance Between Adjacent Lattice Points

The distance between adjacent lattice points of a planar lattice pattern that is assumed for the anisotropic electrically conductive film is preferably greater than 0.5 times, more preferably 1 time or greater, even more preferably from 1 to 20 times the average particle diameter of the electrically conductive particles. When the distance is in this range, even in a case where the anisotropic electrically conductive film according to an embodiment of the present invention is applied to anisotropic conductive connection, it is possible to achieve better initial conductivity and conduction reliability after aging, and it is also possible to further suppress occurrence of a short circuit.

Electrically Insulating Adhesive Base Layer

As the electrically insulating adhesive base layer 11, it is possible to appropriately select and use a base layer used as an electrically insulating adhesive base layer in a known anisotropic electrically conductive film. For example, it is possible to use a photoradical polymerizable resin layer including an acrylate compound and photoradical polymerization initiator, a thermal radical polymerizable resin layer including an acrylate compound and a thermal radical polymerization initiator, a thermal cationic polymerizable resin layer including an epoxy compound and a thermal cationic polymerization initiator, a thermal anionic polymerizable resin layer including an epoxy compound and a thermal anionic polymerization initiator, and the like, or a curable resin layer thereof. In addition, it is possible to appropriately select and include a silane coupling agent, a pigment, an antioxidant, an ultraviolet absorber, and the like in the resin layers as appropriate.

Note that the electrically insulating adhesive base layer 11 can be formed by depositing a film using a coating method and drying, and further curing, a coating composition including the resin as described above, or otherwise by forming the coating composition into a film using a method known in advance.

The thickness of such an electrically insulating adhesive base layer 11 is preferably 1 to 30 µm and more preferably 2 to 15 µm.

Electrically Insulating Adhesive Cover Layer

As the electrically insulating adhesive cover layer 12, a cover layer used as an electrically insulating adhesive cover layer in a known anisotropic electrically conductive film can be selected and used as appropriate. Alternatively, the cover layer formed from the same material as that of the electrically insulating adhesive base layer 11 as described earlier can be also used.

Note that the electrically insulating adhesive cover layer 12 may be formed by using a coating method and drying, and further curing, a coating composition including the resin as described above, or otherwise by forming a film using a known technique in advance.

The thickness of such an electrically insulating adhesive cover layer 12 is preferably from 1 to 30 µm and more preferably from 2 to 15 µm.

Furthermore, an electrically insulating filler such as silica fine particles, alumina, and aluminum hydroxide may be added to the electrically insulating adhesive base layer 11 or the electrically insulating adhesive cover layer 12 as necessary. The blending amount of the electrically insulating filler is preferably from 3 to 40 parts by mass per 100 parts by mass of resin that configures the layers. Thereby, even when the electrically insulating adhesive layer is melted during anisotropic conductive connection, it is possible to prevent the electrically conductive particles 13 from moving unnecessarily by the melted resin.

Lamination of Electrically Insulating Adhesive Base Layer and Electrically Insulating Adhesive Cover Layer and Embedding of Electrically Conductive Particles Note that in a case where the electrically insulating adhesive base layer 11 and the electrically insulating adhesive cover layer 12 are laminated together interposing the electrically conductive particles 13 therebetween, it is possible to perform the process by using a known method. In this case, the electrically conductive particles 13 are present near the interface of the layers. Here, "present near the interface" indicates that a part of the electrically conductive particles intrudes into one layer, and the remainder intrudes into the other layer. Furthermore, the electrically conductive particles may be embedded into the electrically insulating adhesive base layer. In this case, the electrically insulating adhesive cover layer may be formed without lamination.

Production of Anisotropic Electrically Conductive Film of Second Mode

Next, a method of producing an anisotropic electrically conductive film, according to a second mode of the present invention, which has a structure in which the electrically insulating adhesive base layer and the electrically insulating adhesive cover layer are laminated together, and near an interface therebetween, electrically conductive particles are disposed at the lattice points of the planar lattice pattern, will be described. The production method has the following steps (i) to (v). Each step will be described in detail with reference to the drawings. Note that this production method is not limiting.

Step (i)

Figure 6A:
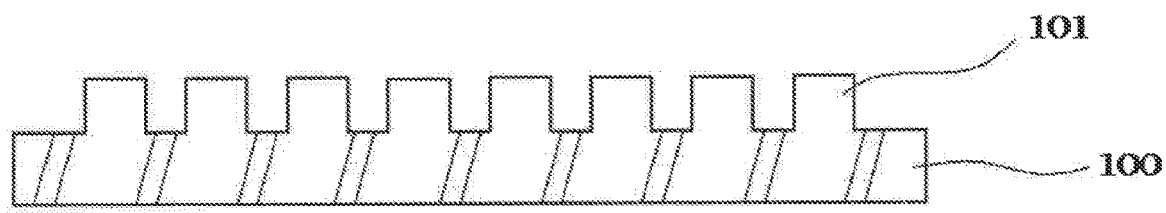
FIG. 6A is a step explanatory diagram of the method of producing the anisotropic electrically conductive film of the second mode of the present invention.

First, as illustrated in FIG. 6A, a transfer body 100 is prepared in which a columnar convex portion 101 corresponding to the lattice points of the planar lattice pattern is formed on the surface. This columnar shape includes a cone type. The columnar shape is preferably the cylindrical shape. The height of the convex portion 101 can be determined depending on a terminal pitch, a terminal width, a spacing width, the average particle diameter of the electrically conductive particles, and the like where anisotropic conductive connection should be provided. And the height is preferably not less than 2 times and less than 4 times the average particle diameter of the electrically conductive particles used. Furthermore, a full width at the half height of the convex portion 101 (width at a half height) is preferably not less than 1.4 times and not greater than 3.6 times the average particle diameter of electrically conductive particles. If the height and the width are within these ranges, then an effect is obtained where occurrence of excess omission is prevented and omission is generated only sporadically.

Furthermore, the convex portion 101 has a substantially flat top surface with a flatness that can promote stable deposition of the electrically conductive particles.

Specific Example of Transfer Body

The transfer body that should be prepared in the step (i) can be prepared by utilizing a well-known technique. For example, a transfer body can be prepared by processing a metal plate to prepare a master, which is then coated with a curable resin composition, followed by curing. Specifically, a flat metal plate is cut and processed to prepare a transfer body master formed with a concave portion corresponding to a convex portion, and then a concave portion formation surface of the master is coated with a resin composition that configures the transfer body followed by curing. Then the composition is separated from the master to obtain the transfer body.

Step (ii)

Figure 6B:
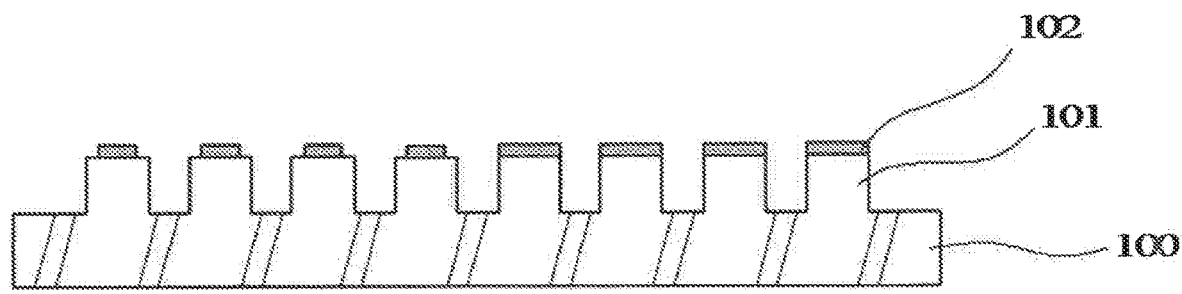
FIG. 6B is a step explanatory diagram of the method of producing the anisotropic electrically conductive film of the second mode of the present invention.

Next, as illustrated in FIG. 6B, at least the top surface of the convex portions 101 of the transfer body 100 in which plural convex portions 101 are formed with the planar lattice pattern on the surface is set as a weak adhesive layer 102.

Weak Adhesive Layer of Transfer Body

The weak adhesive layer 102 is a layer that exhibits an adhesive force, by which it is possible to temporarily hold the electrically conductive particles until the electrically conductive particles are transferred to the electrically insulating adhesive base layer configuring the anisotropic electrically conductive film. Such a weak adhesive layer 102 is formed at least on the top surface of the convex portions 101. Accordingly, the entire convex portions 101 may be slightly adhesive. The thickness of the weak adhesive layer 102 can be appropriately determined depending on the material of the weak adhesive layer 102, the particle diameter of the electrically conductive particles, and the like. In addition, "weak adhesive" has a meaning of a weaker adhesive force than the electrically insulating adhesive base layer when the electrically conductive particles are transferred to the electrically insulating adhesive base layer.

For such a weak adhesive layer 102, a weak adhesive layer used in a known anisotropic electrically conductive film can be used. For example, it is possible to form the weak adhesive layer by applying a silicone-based adhesive composition or an adhesive layer of the same material as in the electrically insulating adhesive base layer or the electrically insulating adhesive cover layer on a top surface of the convex portions 101.

Step (iii)

Figure 6C:
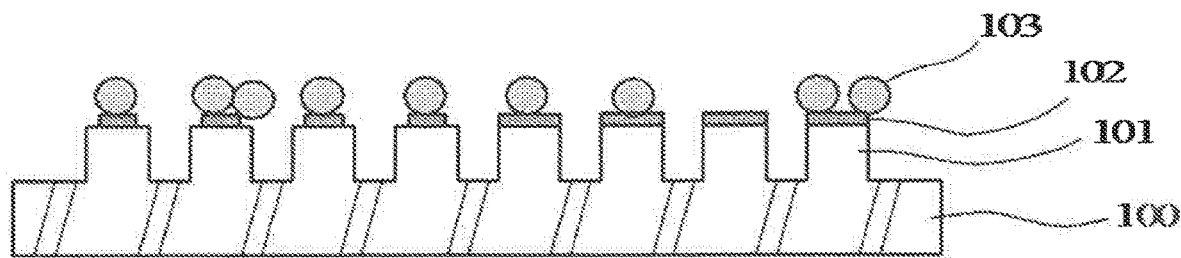
FIG. 6C is a step explanatory diagram of the method of producing the anisotropic electrically conductive film of the second mode of the present invention.

Next, as illustrated in FIG. 6C, the electrically conductive particles 103 are deposited on the weak adhesive layer 102 of the convex portions 101 of the transfer body 100. Specifically, the electrically conductive particles 103 are scattered from above the convex portions 101 of the transfer body 100, the electrically conductive particles 103 that are not deposited on the weak adhesive layer 102 may be blown away using a blower. In this case, the electrically conductive particles are deposited on a side surface of some of the convex portions 101 at a certain frequency due to an action of static electricity and the like, and some electrically conductive particles may not be removed by a blower.

Note that the direction of the surface may be reversed from FIG. 6C, and the top surface of the projection may be attached to a surface over which the electrically conductive particles are all laid. This is to avoid unnecessary stress applied to the electrically conductive particles. It is easy to recover and reuse the electrically conductive particles by only electrically conductive particles necessary for the arrangement being deposited on the top surface of the projection. Thus, economic superiority is obtained in comparison with a method, in which the electrically conductive particles are packed in an opening portion and removed later. Note that in a case of the method for packing and taking out the electrically conductive particles in an opening, there is a concern that it is easy for unnecessary stress to be applied to the electrically conductive particles that are not packed.

Note that in FIG. 6C, a width of the weak adhesive layer 102 of the convex portion 101 in the left half is adjusted to be narrower than that of the weak adhesive layer 102 of the convex portion 101 in the right half. As a result, between left half and right half, as illustrated in FIG. 6C, differences in aggregation mode of the electrically conductive particle 103 may occur.

Step (iv)

Figure 6D:
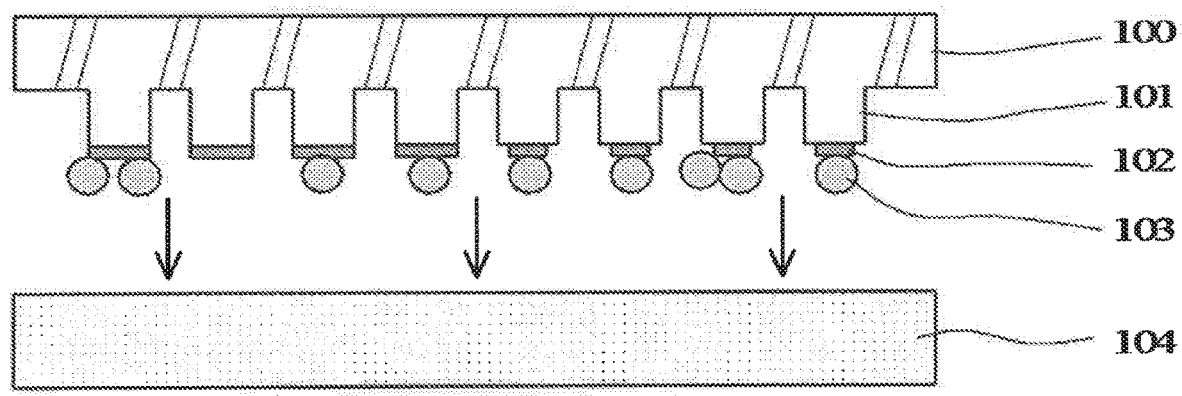
FIG. 6D is a step explanatory diagram of the method of producing of the anisotropic electrically conductive film of the second mode of the present invention.
Figure 6E:
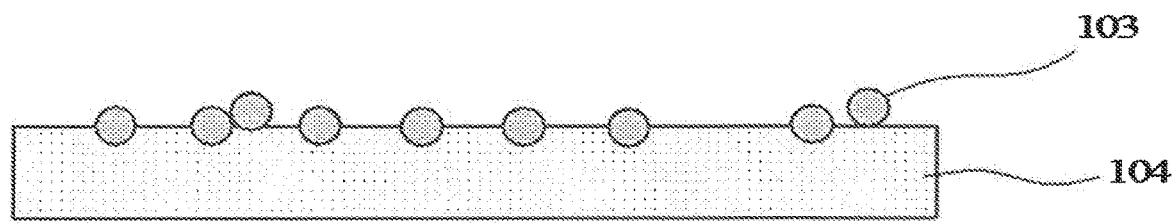
FIG. 6E is a step explanatory diagram of the method of producing of the anisotropic electrically conductive film of the second mode of the present invention.

Next, as illustrated in FIG. 6D, when the electrically insulating adhesive base layer 104 that should configure the anisotropic electrically conductive film is overlapped and pressed on a surface at a side on which the electrically conductive particles 103 of the transfer body 100 are deposited, the electrically conductive particles 103 are transferred to one side of the electrically insulating adhesive base layer 104 (FIG. 6E). In this case, preferably the transfer body 100 overlaps and presses the electrically insulating adhesive base layer 104 such that the convex portions 101 face downward. This is because the electrically conductive particles that are not stuck to the top surface of the convex portion are easily removed by being blown while facing down.

Step (v)

Figure 6F:
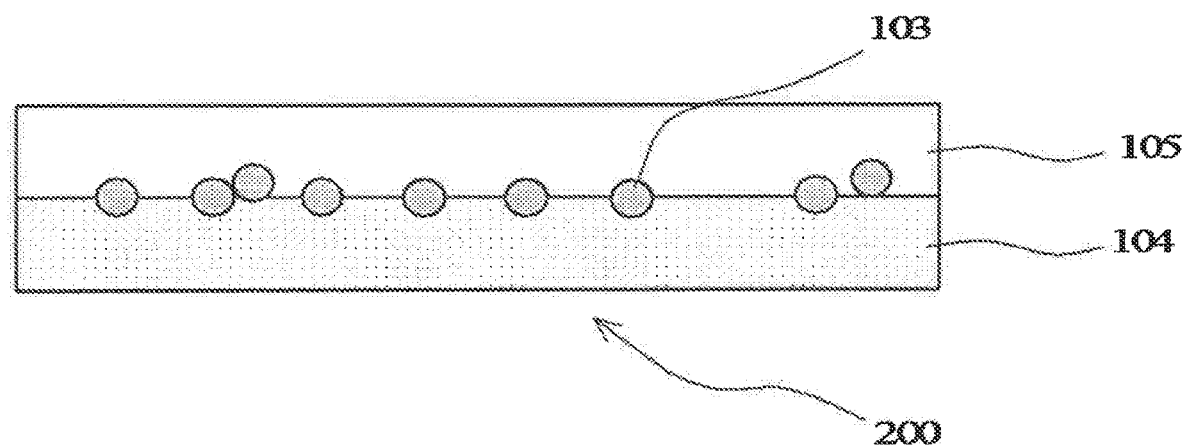
FIG. 6F is a step explanatory diagram of the method of producing of the anisotropic electrically conductive film of the second mode of the present invention while being a schematic cross-sectional view of the anisotropic electrically conductive film of the second mode of the present invention.

As illustrated in FIG. 6F, the electrically insulating adhesive cover layer 105 is laminated on the electrically insulating adhesive base layer 104, on which the electrically conductive particles 103 are transferred, from a side, on which the electrically conductive particles are transferred. Thereby, an anisotropic electrically conductive film 200 according to an embodiment of the present invention is obtained.

Next, an anisotropic electrically conductive film and a method of producing the anisotropic electrically conductive film according to the third mode of the present invention will be described in detail with reference to the drawings.

Anisotropic Electrically Conductive Film of Third Mode

Figure 7:
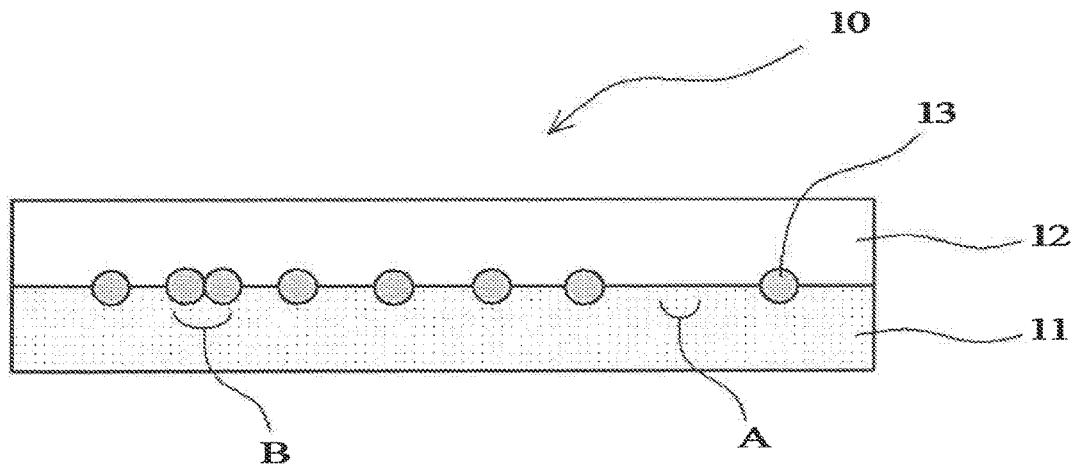
FIG. 7 is a cross-sectional view of an anisotropic electrically conductive film of a third mode of the present invention.
Figure 8:
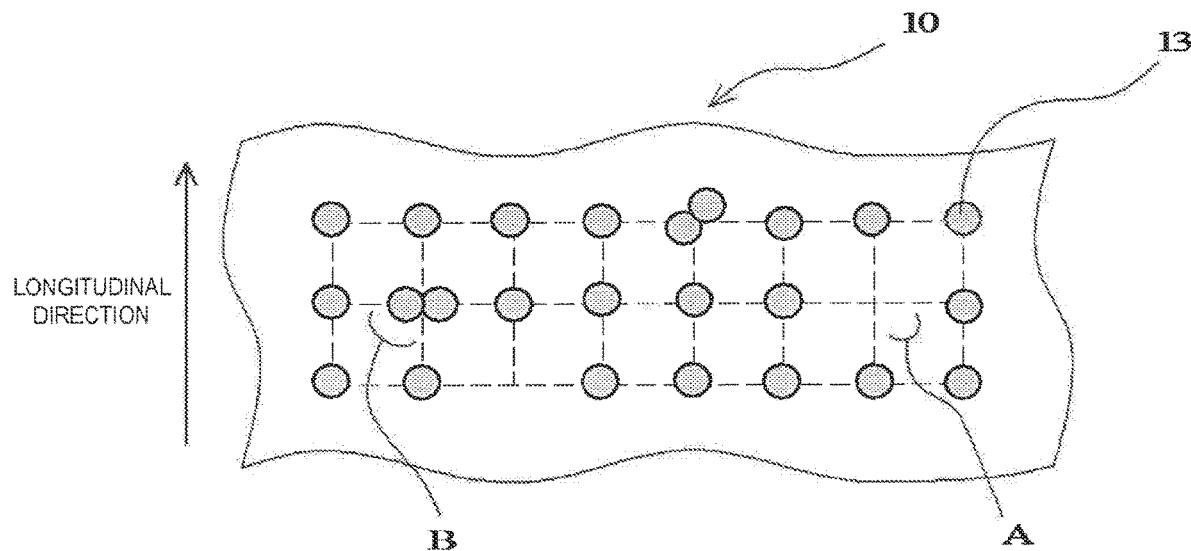
FIG. 8 is a perspective plan view of the anisotropic electrically conductive film of the third mode of the present invention.

As illustrated in FIG. 7 (cross-sectional view) and FIG. 8 (perspective plan view), an anisotropic electrically conductive film 10 according to an embodiment of the present invention has a structure in which an electrically insulating adhesive base layer 11 and an electrically insulating adhesive cover layer 12 are laminated together, and near an interface therebetween, electrically conductive particles 13 are disposed at the lattice points of the planar lattice pattern (dotted line in FIG. 8). In FIGS. 7 and 8, the planar lattice pattern is assumed to be along a longitudinal direction of the anisotropic electrically conductive film 10 and a direction (short-side direction) that is orthogonal to the longitudinal direction; however, the entire pattern may be assumed to be inclined with respect to both the longitudinal direction and the short-side direction. Here, an arrow A indicates a position at which no electrically conductive particle is disposed at the lattice points with a planar lattice, and a position at which there is so-called "omission" of the electrically conductive particles. Note that an arrow B indicates a position at which electrically conductive particles are in contact with each other and are aggregated.

"Omission" of Electrically Conductive Particle

In the anisotropic electrically conductive film according to an embodiment of the present invention, a proportion of "lattice points, at which no electrically conductive particle is disposed" (A in FIG. 8) (proportion of the lattice points at which an electrically conductive particle is not present) with respect to all the lattice points of the planar lattice pattern assumed as the reference region of the anisotropic electrically conductive film is set to 15% or less, preferably to 10% or less, and more preferably to from 6 to 10%. Thereby, in a case where the anisotropic electrically conductive film according to an embodiment of the present invention is applied to anisotropic conductive connection, it is possible to achieve good initial conductivity and good conduction reliability after aging, and it is also possible to suppress occurrence of a short circuit.

Planar Lattice Pattern

Examples of the planar lattice pattern include a rhombic lattice, a hexagonal lattice, a square lattice, a rectangular lattice, and a parallelotope lattice. In particular, the hexagonal lattice, in which closest packing is possible, is preferable.

Here, it is possible to select the whole surface of the anisotropic electrically conductive film as the reference region of the anisotropic electrically conductive film, but ordinarily, it is preferable to select, as the reference region, a substantially square region including a side X and a side Y in a center portion of the anisotropic electrically conductive film plane, the side X and the side Y satisfying the following Relationship (A) and preferably satisfy the following Relationships (1), (2), and (3).

$$100D \leq X+Y \leq 400D \quad (A)$$

$$X+Y=100D \quad (1)$$

$$X \geq 5D \quad (2)$$

$$Y \geq 5D \quad (3)$$

Note that in a case of applying the film to FOG connection in which a connection area is comparatively large, it is possible to reduce the amount of electrically conductive particles being present in the film. In such a case, as described below, it is preferable to increase each of the values of X and Y, preferably to 20D or greater, and it is preferable to set a value of "X+Y" to a value from 100D to around 400D and finally to 400D.

$$X+Y=400D$$

$$X \geq 20D$$

$$Y \geq 20D$$

In Relationships (A) and (1) to (3), and the above relationships, D is an average particle diameter of the electrically conductive particles. It is possible to measure the average particle diameter of the electrically conductive particles by using an image-type or laser-type particle size analyzer. A surface observation can be used for such a measurement. Furthermore, the side Y is a straight line disposed at an angle in a range of less than ±45° with respect to the longitudinal direction (refer to FIG. 8) of the anisotropic electrically conductive film, and the side X is a straight line perpendicular to the side Y.

By defining the reference region in this manner, the reference region may resemble or approximate a shape of a bump to which the electrically conductive particles are pressed. As a result, it is possible to increase the permissible range of shift of the electrically conductive particles from the planar lattice pattern, and anisotropic conductive connection is economically and stably established. In other words, it is possible to reliably establish anisotropic conductive connection because the electrically conductive particles are captured by any bump and there is no excessive aggregation in a space between bumps, even if there may be a shift, an omission or a contact of the electrically conductive particles in a range assumed to be in a range in which the smallest side of the reference region is set to 5 times or greater of the electrically conductive particle size.

Note that the reason that the smallest side is 5 times or greater of the electrically conductive particle diameter is because it is necessary for the side to be typically larger than the average particle diameter of the electrically conductive particles for reliably capturing the particles in at least one side of the bump that is subjected to anisotropic conductive connection, and moreover, it is necessary to desirably provide a size 2 times or greater the average particle diameter of the electrically conductive particles for a space between bumps because of preventing a short circuit. In other words, the reason is because when focusing on a circular electrically conductive particle as one reference, if an unexpected failure does not occur within a concentric circle having a diameter of sum of the average particle diameter D and 4 times the size thereof (4D), that is 5D, then it is considered that the requirements described above can be satisfied. In addition, the reason is because a minimum distance between bumps in a case of a fine pitch is less than 4 times the electrically conductive particle diameter as an example.

Aggregation of Electrically Conductive Particles

In addition, in the anisotropic electrically conductive film according to an embodiment of the present invention, a proportion of the lattice points at which plural electrically conductive particles are disposed in an aggregated state with respect to all the lattice points of the planar lattice pattern (B of FIG. 8) is 10% or less, preferably 9% or less, and from 5 to 9% as a range with no practical problem. When the proportion of the lattice points of aggregated disposition is within this range, even in a case where the anisotropic electrically conductive film according to an embodiment of the present invention is applied to the anisotropic conductive connection, it is possible to achieve better initial conductivity and conduction reliability after aging, and it is also possible to further suppress occurrence of a short circuit. Here, the degree of aggregation of the electrically conductive particles with respect to one lattice point is as small as possible from the viewpoint of suppressing a short circuit and it is preferable not to exceed two.

Note that in this third mode, a sum of the omission and the aggregation is preferably 25% or less.

Arrangement of Electrically Conductive Particles

It is preferable that 11 or more electrically conductive particles are consecutively disposed in a direction perpendicular to the longitudinal direction of the film, and it is more preferable that 13 or more electrically conductive particles are consecutively disposed. This is because, when there is an absence of electrically conductive particles in the longitudinal direction of the bump, there is a concern that there is a failure to anisotropic conductive connection. In this case, it is preferable that all of the three consecutive rows along the longitudinal direction of the film satisfy the above condition, and it is more preferable that all of the five consecutive rows satisfy the above condition. Thereby, the number of electrically conductive particles captured by the bump can be equal to a certain number or more, and it is possible to achieve a stable anisotropic conductive connection.

When the electrically conductive particles are aggregated, it is preferable that in the vicinity of an aggregation of the two electrically conductive particles, there are three or less sets of electrically conductive particles that are connected by two, and more preferable that there are two sets or less, and even more preferable that there is one set or less. This is because when aggregations of the two electrically conductive particles densely exist, it becomes a cause of occurrence of a short circuit.

In addition, it is preferable that absence of four or more consecutive electrically conductive particles in the longitudinal direction of the film and absence of four or more consecutive electrically conductive particles in the direction orthogonal to the longitudinal direction of the film do not intersect, it is more preferable that any of the absence of the four or more consecutive electrically conductive particles is not adjacent to each other via one or more electrically conductive particles being lattice points, and it is even more preferable that any of the consecutive four or more absences is not adjacent to each other via two or more electrically conductive particles being lattice points. Such an intersection of absence is not a problem even if up to three rows intersect simultaneously with absence in one direction. This is because when there is consecutive absence not more than three rows, the electrically conductive particles in the vicinity thereof are captured by a bump.

Note that, generally it is not preferable that plural regions having consecutive absences intersecting with one another in this manner are present in the vicinity of one another. However, as long as an anisotropic conductive connection is established via arrangements of the electrically conductive particles, the number of which is equal to or greater than the number of regions with absences, there is no problem in the stability of the anisotropic conductive connection. Specifically, as long as there are one or more electrically conductive particles connected by two, on a 7×7 matrix around the region of absence as the center, there is no practical problem.

Particle Area Occupancy

In addition, it is effective when a particle area occupancy, with respect to the area of the reference region of the anisotropic electrically conductive film, of all electrically conductive particles present in the area is generally 0.15% or greater, preferably 0.35% or greater, and more preferably 1.4% or greater in a case where a bump size or a distance between bumps is relatively large, as in the FOG connection. An upper limit in this case is preferably 35% or less and is more preferably 32% or less. In a case where the bump size or the distance between the bumps is relatively small (for example, COG connection), the upper limit is more preferably from 15 to 35%, and particularly preferably from 16 to 20%. When the distance is in this range, even in a case where the anisotropic electrically conductive film according to an embodiment of the present invention is applied to anisotropic conductive connection, it is possible to achieve better initial conductivity and conduction reliability after aging, and it is also possible to further suppress occurrence of a short circuit. Here, the particle area occupancy is a proportion, with respect to an area S of a reference region, of an area occupied by all the electrically conductive particles present in the reference region. The area occupied by all the electrically conductive particles is represented by $(R/2)^2 \times \pi \times n$ wherein R is the average particle diameter of the electrically conductive particles and n is the number of electrically conductive particles. Accordingly, the particle area occupancy is represented by the following equation: particle area occupancy (%)=$[\{(R/2)^2 \times \pi \times n\}/S] \times 100$.

Note that, the calculated particle area occupancy is 0.157% in a case where the average particle diameter of the electrically conductive particles is 2 μm, a number density is 500/mm² (0.00054/μm²), X=Y=200D, and X+Y=400D. The calculated particle area occupancy is 0.35325% in a case where the average particle diameter of the electrically conductive particles is 3 μm, the number density is 500/mm² (0.0005/μm²), X=Y=200D, and X+Y=400D. The calculated particle area occupancy is 1.413% in a case where the average particle diameter of the electrically conductive particles is 3 μm, the number density is 2000/mm² (0.002/μm²), X=Y=200D, and X+Y=400D. In addition, the calculated particle area occupancy is 35.325% in a case where the average particle diameter of the electrically conductive particles is 30 μm, the number density is 500/mm² (0.0005/μm²), X=Y=200D, and X+Y=400D.

Electrically Conductive Particles

It is possible to appropriately select and use any electrically conductive particles used in a known anisotropic electrically conductive film. Examples of the electrically conductive particles include metal particles such as nickel, copper, silver, gold, and palladium and metal-coated resin particles, where the surface of resin particles such as polyamide and polybenzoguanamine is coated with metal such as nickel. Furthermore, from the viewpoint of handling during production, the average particle diameter of the electrically conductive particles is preferably from 1 to 30 μm, more preferably from 1 to 10 μm, and more preferably from 2 to 6 μm. As described above, it is possible to measure the average particle diameter of the electrically conductive particles by using an image-type or laser-type particle size analyzer.

The amount of the electrically conductive particles present in the anisotropic electrically conductive film depends on the lattice pitch of the planar lattice pattern and the average particle diameter of the electrically conductive particles, and ordinarily is from 300 to 40000/mm².

Distance Between Adjacent Lattice Points

The distance between adjacent lattice points of a planar lattice pattern that is assumed for the anisotropic electrically conductive film is preferably greater than 0.5 times, more preferably 1 time or greater, even more preferably from 1 to 20 times the average particle diameter of the electrically conductive particles. When the distance is in this range, even in a case where the anisotropic electrically conductive film according to an embodiment of the present invention is applied to anisotropic conductive connection, it is possible to achieve better initial conductivity and conduction reliability after aging, and it is also possible to further suppress occurrence of a short circuit.

Electrically Insulating Adhesive Base Layer

As the electrically insulating adhesive base layer 11, it is possible to appropriately select and use a base layer used as an electrically insulating adhesive base layer in a known anisotropic electrically conductive film. For example, it is possible to use a photoradical polymerizable resin layer including an acrylate compound and photoradical polymerization initiator, a thermal radical polymerizable resin layer including an acrylate compound and a thermal radical polymerization initiator, a thermal cationic polymerizable resin layer including an epoxy compound and a thermal cationic polymerization initiator, a thermal anionic polymerizable resin layer including an epoxy compound and a thermal anionic polymerization initiator, and the like, or a curable resin layer thereof. In addition, it is possible to appropriately select and include a silane coupling agent, a pigment, an antioxidant, an ultraviolet absorber, and the like in the resin layers as appropriate.

Note that the electrically insulating adhesive base layer 11 can be formed by depositing a film using a coating method and drying, and further curing, a coating composition including the resin as described above, or otherwise by forming the coating composition into a film using a method known in advance.

The thickness of such an electrically insulating adhesive base layer 11 is preferably from 1 to 30 μm and more preferably from 2 to 15 μm.

Electrically Insulating Adhesive Cover Layer

As the electrically insulating adhesive cover layer 12, a cover layer used as an electrically insulating adhesive cover layer in a known anisotropic electrically conductive film can be selected and used as appropriate. Alternatively, the cover layer formed from the same material as that of the electrically insulating adhesive base layer 11 as described earlier can be also used.

Note that the electrically insulating adhesive cover layer 12 may be formed by using a coating method and drying, and further curing, a coating composition including the resin as described above, or otherwise by forming a film using a known technique in advance.

The thickness of such an electrically insulating adhesive cover layer 12 is preferably from 1 to 30 μm and more preferably from 2 to 15 μm.

Furthermore, an electrically insulating filler such as silica fine particles, alumina, and aluminum hydroxide may be added to the electrically insulating adhesive base layer 11 or the electrically insulating adhesive cover layer 12 as necessary. The blending amount of the electrically insulating filler is preferably 3 to 40 parts by mass per 100 parts by mass of resin included in the layers. Thereby, even when the electrically insulating adhesive layer is melted during anisotropic conductive connection, it is possible to prevent the electrically conductive particles 13 from moving unnecessarily by the melted resin.

Lamination of Electrically Insulating Adhesive Base Layer and Electrically Insulating Adhesive Cover Layer and Embedding of Electrically Conductive Particles Note that in a case where the electrically insulating adhesive base layer 11 and the electrically insulating adhesive cover layer 12 are laminated together interposing the electrically conductive particles 13 therebetween, it is possible to perform the process by using a known method. In this case, the electrically conductive particles 13 are present near the interface of the layers. Here, "present near the interface" indicates that a part of the electrically conductive particles intrudes into one layer, and the remainder intrudes into the other layer. Furthermore, the electrically conductive particles may be embedded into the electrically insulating adhesive base layer. In this case, the electrically insulating adhesive cover layer may be formed without lamination.

Production of Anisotropic Electrically Conductive Film of Third Mode

Next, a method of producing an anisotropic electrically conductive film, according to the third mode of the present invention, which has a structure in which the electrically insulating adhesive base layer and the electrically insulating adhesive cover layer are laminated together, and near an interface therebetween, electrically conductive particles are disposed at the lattice points of the planar lattice pattern, will be described. The production method has the following steps (i) to (v). Each step will be described in detail with reference to the drawings. Note that this production method is not limiting.

Step (i)

Figure 9A:
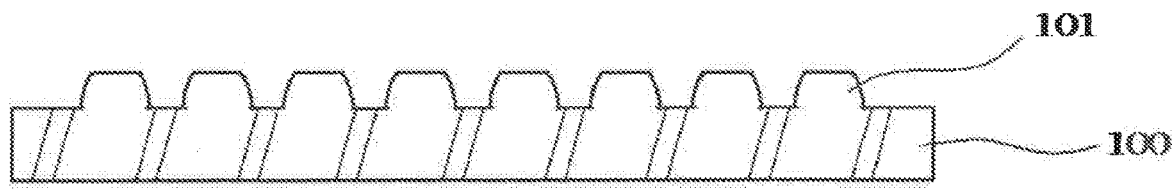
FIG. 9A is a step explanatory diagram of a production method of the anisotropic electrically conductive film of the third mode of the present invention.

First, as illustrated in FIG. 9A, a transfer body 100, a surface of which is formed with a convex portion 101 corresponding to the lattice points of a planar lattice pattern is prepared. Here, as the shape of the convex portion 101, a columnar form (cylinder, triangular prism, square prism, hexagonal prism and the like, for example), roughly columnar, hemispherical, truncated cone, truncated pyramid and the like may be mentioned. The height of the convex portion 101 can be determined depending on a terminal pitch, a terminal width, a spacing width, the average particle diameter of the electrically conductive particles, and the like where anisotropic conductive connection should be provided. And the height is preferably not less than 1.2 times and less than 2 times the average particle diameter of the electrically conductive particles used. Furthermore, a full width at the half height of the convex portion 101 (width at a half height) is preferably not less than 1.4 times and not greater than 3.6 times the average particle diameter of electrically conductive particles. If the height and width are in this range, then an effect is obtained in which consecutive occurrence of shedding and omission is avoided.

Furthermore, the convex portion 101 has a flat top surface with a flatness that can promote stable deposition of the electrically conductive particles.

Specific Example of Transfer Body

The transfer body that should be prepared in the step (i) can be prepared by utilizing a well-known technique. For example, a transfer body can be prepared by processing a metal plate to prepare a master, which is then coated with a curable resin composition, followed by curing. Specifically, a flat metal plate is cut and processed to prepare a transfer body master formed with a concave portion corresponding to a convex portion, and then a concave portion formation surface of the master is coated with a resin composition that configures the transfer body followed by curing. Then the composition is separated from the master to obtain the transfer body.

Step (ii)

Figure 9B:
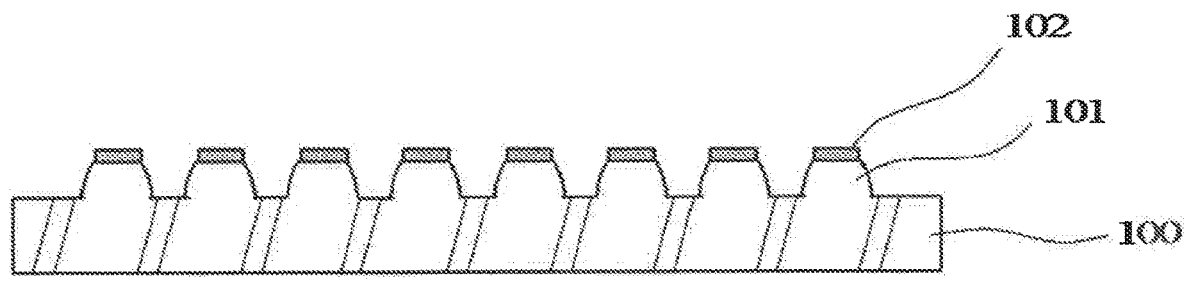
FIG. 9B is a step explanatory diagram of the production method of the anisotropic electrically conductive film of the third mode of the present invention.

Next, as illustrated in FIG. 9B, at least the top surface of the convex portions 101 of the transfer body 100 in which plural convex portions 101 are formed with the planar lattice pattern on the surface is set as a weak adhesive layer 102.

Weak Adhesive Layer of Transfer Body

The weak adhesive layer 102 is a layer that exhibits an adhesive force, by which it is possible to temporarily hold the electrically conductive particles until the electrically conductive particles are transferred to the electrically insulating adhesive base layer configuring the anisotropic electrically conductive film. Such a weak adhesive layer 102 is formed at least on the top surface of the convex portions 101. Accordingly, the entire convex portions 101 may be slightly adhesive. The thickness of the weak adhesive layer 102 can be appropriately determined depending on the material of the weak adhesive layer 102, the particle diameter of the electrically conductive particles, and the like. In addition, "weak adhesive" has a meaning of a weaker adhesive force than the electrically insulating adhesive base layer when the electrically conductive particles are transferred to the electrically insulating adhesive base layer.

For such a weak adhesive layer 102, a weak adhesive layer used in a known anisotropic electrically conductive film can be used. For example, it is possible to form the weak adhesive layer by applying a silicone-based adhesive composition and an adhesive layer of the same material as in the electrically insulating adhesive base layer or the electrically insulating adhesive cover layer on a top surface of the convex portions 101.

Step (iii)

Figure 9C:
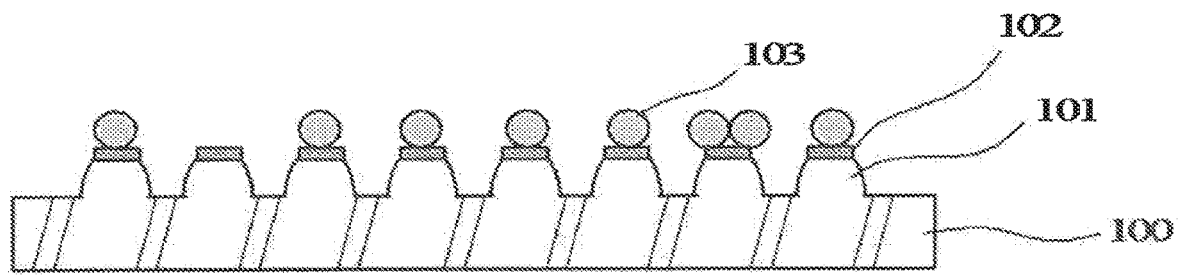
FIG. 9C is a step explanatory diagram of the production method of the anisotropic electrically conductive film of the third mode of the present invention.

Next, as illustrated in FIG. 9C, the electrically conductive particles 103 are deposited on the weak adhesive layer 102 of the convex portions 101 of the transfer body 100. Specifically, the electrically conductive particles 103 are scattered from above the convex portions 101 of the transfer body 100, the electrically conductive particles 103 that are not deposited on the weak adhesive layer 102 may be blown away using a blower. In this case, the electrically conductive particles are deposited on a side surface of some of the convex portions 101 at a certain frequency due to an action of static electricity and the like, and some electrically conductive particles may not be removed by a blower.

Note that the direction of the surface may be reversed from FIG. 9C, and the top surface of the projection may be attached to a surface over which the electrically conductive particles are all laid. This is to avoid unnecessary stress applied to the electrically conductive particles. It is easy to recover and reuse the electrically conductive particles by only electrically conductive particles necessary for the arrangement being deposited on the top surface of the projection. Thus, economic superiority is obtained in comparison with a method, in which the electrically conductive particles are packed in an opening portion and removed later. Note that in a case of the method for packing and taking out the electrically conductive particles in an opening, there is a concern that it is easy for unnecessary stress to be applied to the electrically conductive particles that are not packed.

Step (iv)

Figure 9D:
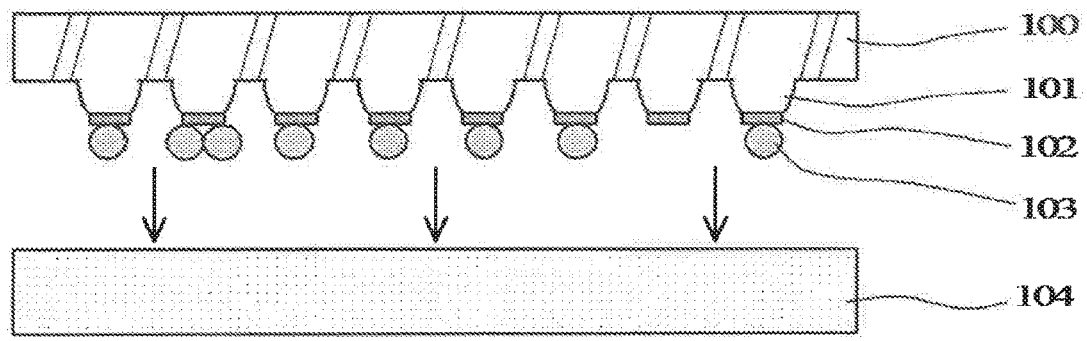
FIG. 9D is a step explanatory diagram of the production method of an anisotropic electrically conductive film of the third mode of the present invention.
Figure 9E:
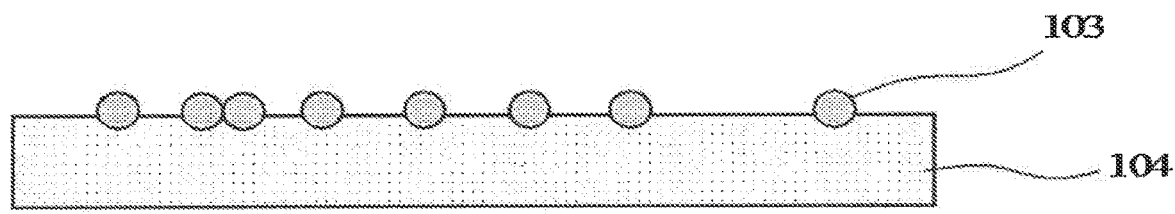
FIG. 9E is a step explanatory diagram of the production method of an anisotropic electrically conductive film of the third mode of the present invention.

Next, as illustrated in FIG. 9D, when the electrically insulating adhesive base layer 104 that should configure the anisotropic electrically conductive film is overlapped and pressed on a surface at a side on which the electrically conductive particles 103 of the transfer body 100 are deposited, the electrically conductive particles 103 are transferred to one side of the electrically insulating adhesive base layer 104 (FIG. 9E). In this case, preferably the transfer body 100 overlaps and presses the electrically insulating adhesive base layer 104 such that the convex portions 101 face downward. This is because the electrically conductive particles that are not stuck to the top surface of the convex portion are easily removed by being blown while facing down.

Step (v)

Figure 9F:
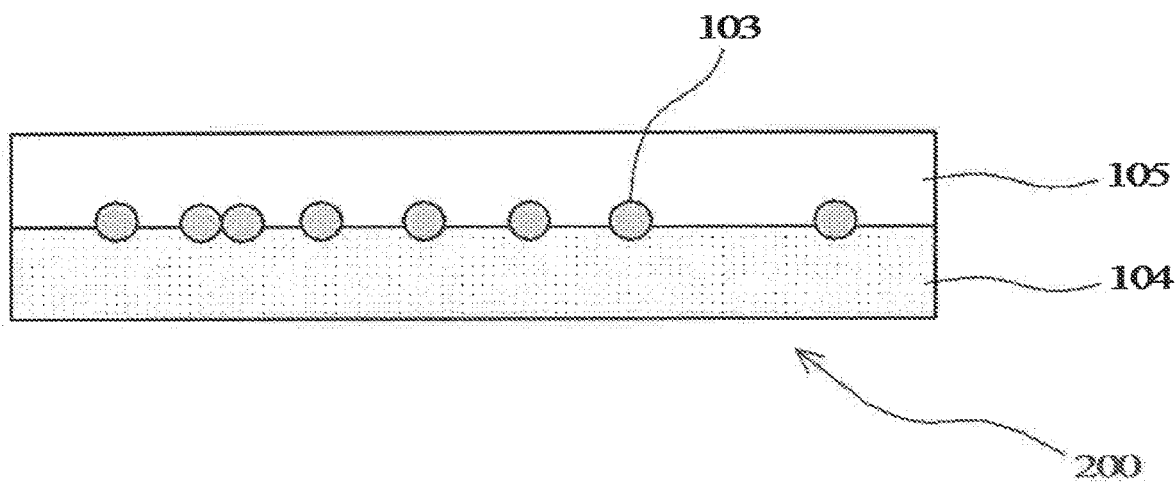
FIG. 9F is a step explanatory diagram of the production method of the anisotropic electrically conductive film of the third mode of the present invention while being a schematic cross-sectional view of the anisotropic electrically conductive film of the third mode of the present invention.

As illustrated in FIG. 9F, the electrically insulating adhesive cover layer 105 is laminated on the electrically insulating adhesive base layer 104, on which the electrically conductive particles 103 are transferred, from a side, on which the electrically conductive particles are transferred. Thereby, an anisotropic electrically conductive film 200 according to an embodiment of the present invention is obtained.

Note that in the anisotropic electrically conductive film 200, when plural conductive particles are disposed at one lattice point of a planer lattice pattern, these electrically conductive particles are disposed in contact with each other in a horizontal direction. This is to prevent excessive decrease in the particle number density.

Next, an anisotropic electrically conductive film and a production method thereof according to the fourth mode of the present invention will be described in detail with reference to the drawings.

Anisotropic Electrically Conductive Film of Fourth Mode

Figure 10:
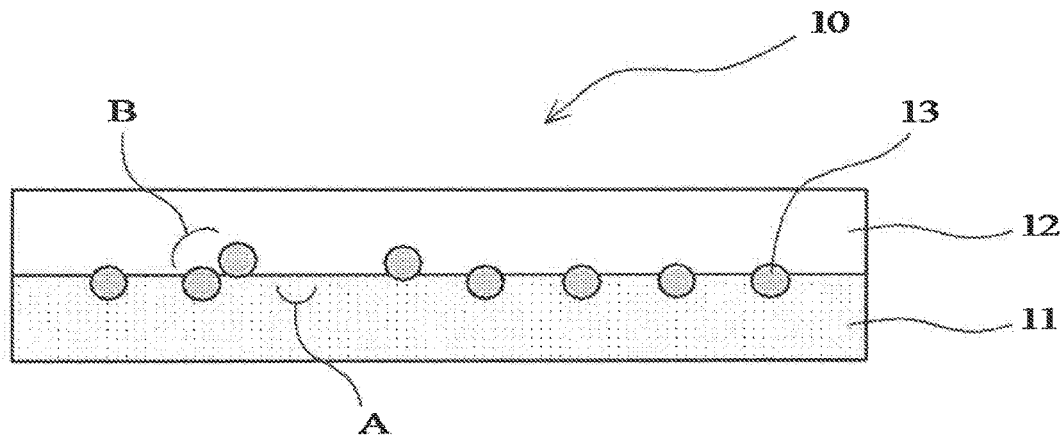
FIG. 10 is a cross-sectional view of the of an anisotropic electrically conductive film of a fourth mode of the present invention.
Figure 11:
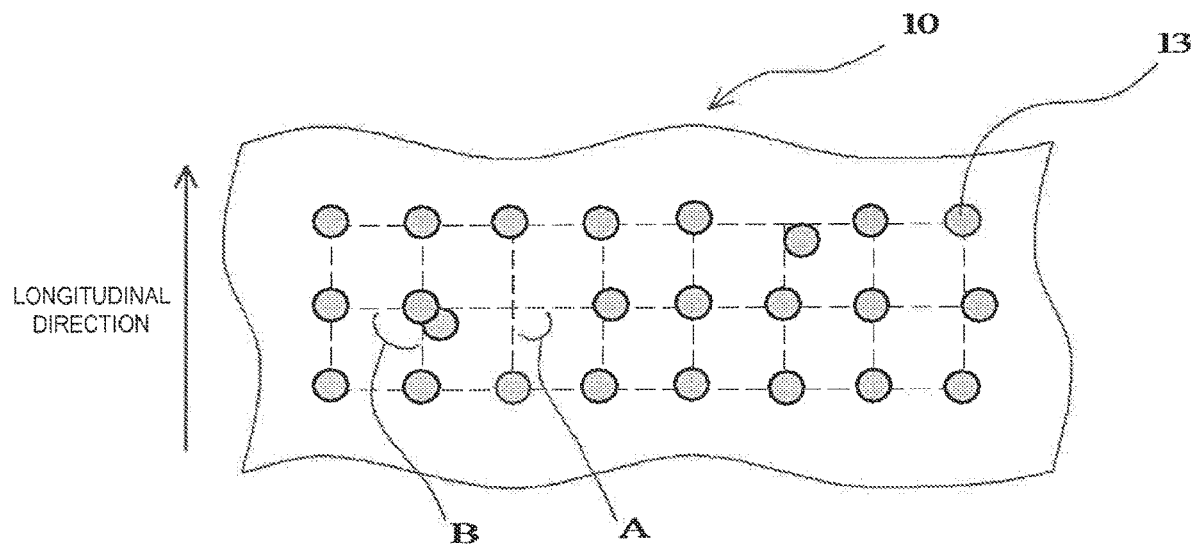
FIG. 11 is a perspective plan view of the anisotropic electrically conductive film of the fourth mode of the present invention.

As illustrated in FIG. 10 (cross-sectional view) and FIG. 11 (perspective plan view), an anisotropic electrically conductive film 10 according to an embodiment of the present invention has a structure in which an electrically insulating adhesive base layer 11 and an electrically insulating adhesive cover layer 12 are laminated together, and near an interface therebetween, electrically conductive particles 13 are disposed at the lattice points of the planar lattice pattern (dotted line in FIG. 11). In FIGS. 10 and 11, the planar lattice pattern is assumed to be along a longitudinal direction of the anisotropic electrically conductive film 10 and a direction that is orthogonal to the longitudinal direction (short-side direction), however, the entire pattern may be assumed to be inclined with respect to both the longitudinal direction and the short-side direction. Here, an arrow A indicates a position at which no electrically conductive particle is disposed at the lattice points with a planar lattice, and a position at which there is so-called "omission" of the electrically conductive particles. Note that an arrow B indicates a position at which the electrically conductive particles are aggregated without contacting each other. Here, to "aggregate without contacting each other" means that the electrically conductive particles are in close proximity in a range not exceeding 50% of the average particle diameter of the electrically conductive particles.

"Omission" of Electrically Conductive Particle

In the anisotropic electrically conductive film according to an embodiment of the present invention, a proportion of "lattice points, at which no electrically conductive particle is disposed" (A in FIG. 11) (proportion of the lattice points at which electrically conductive particles are not present) with respect to all the lattice points of the planar lattice pattern assumed as the reference region of the anisotropic electrically conductive film is set to less than 10%, and preferably to 6% or less. Thereby, in a case where the anisotropic electrically conductive film according to an embodiment of the present invention is applied to anisotropic conductive connection, it is possible to achieve good initial conductivity and good conduction reliability after aging, and it is also possible to suppress occurrence of a short circuit.

Planar Lattice Pattern

Examples of the planar lattice pattern include a rhombic lattice, a hexagonal lattice, a square lattice, a rectangular lattice, and a parallelotope lattice. In particular, the hexagonal lattice, in which closest packing is possible, is preferable.

Here, it is possible to select the whole surface of the anisotropic electrically conductive film as the reference region of the anisotropic electrically conductive film, but ordinarily, it is preferable to select, as the reference region, a substantially square region including a side X and a side Y in a center portion of the anisotropic electrically conductive film plane, the side X and the side Y satisfying the following Relationship (A) and preferably satisfy the following Relationships (1), (2), and (3).

$$100D \leq X+Y \leq 400D \tag{A}$$

$$X+Y=100D \tag{1}$$

$$X \geq 5D \tag{2}$$

$$Y \geq 5D \tag{3}$$

Note that in a case of applying the film to FOG connection in which a connection area is comparatively large, it is possible to reduce the amount of electrically conductive particles being present in the film. In such a case, as described below, it is preferable to increase each of the values of X and Y, preferably to 20D or greater, and it is preferable to set a value of "X+Y" to a value from 100D to around 400D and finally to 400D.

$$X+Y=400D$$

$$X \geq 20D$$

$$Y \geq 20D$$

In Relationships (A) and (1) to (3), and the above relationships, D is an average particle diameter of the electrically conductive particles. It is possible to measure the average particle diameter of the electrically conductive particles by using an image-type or laser-type particle size analyzer. A surface observation can be used for such a measurement. In addition, the side Y is a straight line disposed at an angle in a range of less than ±45° with respect to the longitudinal direction (refer to FIG. 11) of the anisotropic electrically conductive film, and the side X is a straight line perpendicular to the side Y.

By defining the reference region in this manner, the reference region may resemble or approximate a shape of a bump to which the electrically conductive particles are pressed. As a result, it is possible to increase the permissible range of shift of the electrically conductive particles from the planar lattice pattern, and anisotropic conductive connection is economically and stably established. In other words, it is possible to reliably establish anisotropic conductive connection because the electrically conductive particles are captured by any bump and there is no excessive aggregation in a space between bumps, even if there may be a shift, an omission or a contact of the electrically conductive particles in a range assumed to be in a range in which the smallest side of the reference region is set to 5 times or greater of the electrically conductive particle diameter.

Note that the reason that the smallest side is 5 times or greater of the electrically conductive particle diameter is because it is necessary for the side to be typically larger than the average particle diameter of the electrically conductive particles for reliably capturing the particles in at least one side of the bump that is subjected to anisotropic conductive connection, and moreover, it is necessary to desirably provide a size 2 times or greater the average particle diameter of the electrically conductive particles for a space between bumps because of preventing a short circuit. In other words, the reason is because when focusing on a circular electrically conductive particle as one reference, if an unexpected failure does not occur within a concentric circle having a diameter of sum of the average particle diameter D and 4 times the size thereof (4D), that is 5D, then it is considered that the requirements described above can be satisfied. In addition, the reason is because a minimum distance between bumps in a case of a fine pitch is less than 4 times the electrically conductive particle diameter as an example.

Aggregation of Electrically Conductive Particles

In a case of the anisotropic electrically conductive film according to an embodiment of the present invention, a proportion of the lattice points (B of FIG. 11) having plural electrically conductive particles disposed in an aggregated state with respect to all the lattice points of the planar lattice pattern is preferably 15% or less, more preferably 11% or less, and even more preferably 9% or less. When the proportion of the lattice points of aggregated disposition is within this range, even in a case where the anisotropic electrically conductive film according to an embodiment of the present invention is applied to the anisotropic conductive connection, it is possible to achieve better initial conductivity and conduction reliability after aging, and it is also possible to further suppress occurrence of a short circuit. Here, the degree of aggregation of the electrically conductive particles with respect to one lattice point is as small as possible from the viewpoint of suppressing a short circuit and it is preferable not to exceed two. Note that there is no particular problem even if the aggregation is in a horizontal direction.

Note that as a mode of the aggregation of the electrically conductive particles, as in an arrow B of FIGS. 10 and 11, at least some of electrically conductive particles are disposed in an aggregated state with an oblique shift in a thickness direction of the anisotropic electrically conductive film without being in contact with each other. Here, the term "with an oblique shift" means the electrically conductive particles are separated in an oblique direction in a cross sectional view. From this, it is possible to achieve a state in which pressing is not inhibited during the time of connection. Furthermore, when the electrically conductive particles disposed with an oblique shift in the thickness direction is viewed in a planar view, the electrically conductive particles appear to be partially overlapping as illustrated in FIG. 11. Thus, even if the resin flow occurs at the time of connection, anisotropic conductive connection may be achieved in any of the electrically conductive particles.

In addition, the distance between the electrically conductive particles disposed with an oblique shift in the thickness direction (aggregation distance) is preferably from 25 to 50% the average particle diameter of electrically conductive particles and more preferably from 30 to 45%. Within this range, even if the electrically conductive particles are in the terminal end during the time of connection, it is possible to achieve an effect where the contact with the electrically conductive particles present between the terminals is easily avoided. Thus, when the condition that does not adversely affect the connection is found, it is possible to relax restrictions on production conditions, and to have both performance and productivity.

Note that in the fourth mode, a sum of the omission and the aggregation is preferably less than 25%.

Arrangement of Electrically Conductive Particles

It is preferable that 11 or more electrically conductive particles are consecutively disposed in a direction perpendicular to the longitudinal direction of the film, and it is more preferable that 13 or more electrically conductive particles are consecutively disposed. This is because, when there is an absence of electrically conductive particles in the longitudinal direction of the bump, there is a concern that there is a failure to anisotropic conductive connection. In this case, it is preferable that all of the three consecutive rows along the longitudinal direction of the film satisfy the above condition, and it is more preferable that all of the five consecutive rows satisfy the above condition. Thereby, the number of electrically conductive particles captured by the bump can be equal to a certain number or more, and it is possible to achieve a stable anisotropic conductive connection. The row along longitudinal direction satisfies above mentioned conditions as long as five or more electrically conductive particles overlap in the direction perpendicular to the longitudinal direction.

When the electrically conductive particles are aggregated, it is preferable that in the vicinity of an aggregation of the two electrically conductive particles, there are three or less sets of electrically conductive particles that are connected by two, and more preferable that there are two sets or less, and even more preferable that there is one set or less. This is because when aggregations of the two electrically conductive particles densely exist, it becomes a cause of occurrence of a short circuit.

In addition, it is preferable that absence of four or more consecutive electrically conductive particles in the longitudinal direction of the film and absence of four or more consecutive electrically conductive particles in the direction orthogonal to the longitudinal direction of the film do not intersect, it is more preferable that any of the absence of the four or more consecutive electrically conductive particles is not adjacent to each other via one or more electrically conductive particles being lattice points, and it is even more preferable that any of the consecutive four or more absences is not adjacent to each other via two or more electrically conductive particles being lattice points. Such an intersection of absence is not a problem even if up to three rows intersect simultaneously with absence in one direction. This is because when there is consecutive absence not more than three rows, the electrically conductive particles in the vicinity thereof are captured by a bump.

Note that, generally it is not preferable that plural regions having consecutive absences intersecting with one another in this manner are present in the vicinity of one another. However, as long as an anisotropic conductive connection is established via arrangements of the electrically conductive particles, the number of which is equal to or more than the number of regions with absences, there is no problem in the stability of the anisotropic conductive connection. Aggregations of the two electrically conductive particles can exist adjacent to the region intersecting to the consecutive absences.

Particle Area Occupancy

In addition, it is effective when a particle area occupancy, with respect to the area of the reference region of the anisotropic electrically conductive film, of all electrically conductive particles present in the area is generally 0.15% or greater, preferably 0.35% or greater, and more preferably 1.4% or greater in a case where a bump size or a distance between bumps is relatively large, as in the FOG connection. An upper limit in this case is preferably 35% or less and is more preferably 32% or less. Even in a case where the bump size or the distance between bumps is relatively small (for example, COG connection), the upper limit is preferably 35% or less, more preferably 32% or less, even more preferably 25% or less, and particularly preferably from 18 to 23%. When the distance is in this range, even in a case where the anisotropic electrically conductive film according to an embodiment of the present invention is applied to anisotropic conductive connection, it is possible to achieve better initial conductivity and conduction reliability after aging, and it is also possible to further suppress occurrence of a short circuit. Here, the particle area occupancy is a proportion, with respect to an area S of a reference region, of an area occupied by all the electrically conductive particles present in the reference region. The area that all electrically conductive particles occupy is represented by $(R/2)^2 \times \pi \times n$ wherein R is the average particle diameter of the electrically conductive particles and n is the number of electrically conductive particles. Accordingly, the particle area occupancy is represented by the following equation: particle area occupancy $(\%) = [\{(R/2)^2 \times \pi \times n\}/S] \times 100$.

Note that, the calculated particle area occupancy is 0.157% in a case where the average particle diameter of the electrically conductive particles is 2 μm, a number density is 500/mm$^2$ (0.0005/μm$^2$), X=Y=200D, and X+Y=400D. The calculated particle area occupancy is 0.35325% in a case where the average particle diameter of the electrically conductive particles is 3 μm, the number density is 500/mm$^2$ (0.0005/μm$^2$), X=Y=200D, and X+Y=400D. The calculated particle area occupancy is 1.413% in a case where the average particle diameter of the electrically conductive particles is 3 μm, the number density is 2000/mm$^2$ (0.002/μm$^2$), X=Y=200D, and X+Y=400D. In addition, the calculated particle area occupancy is 35.325% in a case where the average particle diameter of the electrically conductive particles is 30 μm, the number density is 500/mm$^2$ (0.0005/μm$^2$), X=Y=200D, and X+Y=400D.

Electrically Conductive Particles

It is possible to appropriately select and use any electrically conductive particles used in a known anisotropic electrically conductive film. Examples of the electrically conductive particles include metal particles such as nickel, copper, silver, gold, and palladium and metal-coated resin particles, where the surface of resin particles such as polyamide and polybenzoguanamine is coated with metal such as nickel. Furthermore, from the viewpoint of handling during production, the average particle diameter of the electrically conductive particles is preferably from 1 to 30 μm, more preferably from 1 to 10 μm, and more preferably from 2 to 6 μm. As described above, it is possible to measure the average particle diameter of the electrically conductive particles by using an image-type or laser-type particle size analyzer.

The amount of the electrically conductive particles present in the anisotropic electrically conductive film depends on the lattice pitch of the planar lattice pattern and the average particle diameter of the electrically conductive particles, and ordinarily is from 300 to 40000/mm$^2$.

Distance Between Adjacent Lattice Points

The distance between adjacent lattice points of a planar lattice pattern that is assumed for the anisotropic electrically conductive film is preferably greater than 0.5 times, more preferably 1 time or greater, even more preferably from 1 to 20 times the average particle diameter of the electrically conductive particles. When the distance is in this range, even in a case where the anisotropic electrically conductive film according to an embodiment of the present invention is applied to anisotropic conductive connection, it is possible to achieve better initial conductivity and conduction reliability after aging, and it is also possible to further suppress occurrence of a short circuit.

Electrically Insulating Adhesive Base Layer

As the electrically insulating adhesive base layer 11, it is possible to appropriately select and use a base layer used as an electrically insulating adhesive base layer in a known anisotropic electrically conductive film. For example, it is possible to use a photoradical polymerizable resin layer including an acrylate compound and photoradical polymerization initiator, a thermal radical polymerizable resin layer including an acrylate compound and a thermal radical polymerization initiator, a thermal cationic polymerizable resin layer including an epoxy compound and a thermal cationic polymerization initiator, a thermal anionic polymerizable resin layer including an epoxy compound and a thermal anionic polymerization initiator, and the like, or a curable resin layer thereof. In addition, it is possible to appropriately select and include a silane coupling agent, a pigment, an antioxidant, an ultraviolet absorber, and the like in the resin layers as appropriate.

Note that the electrically insulating adhesive base layer 11 can be formed by depositing a film using a coating method and drying, and further curing, a coating composition including the resin as described above, or otherwise by forming the coating composition into a film using a method known in advance.

The thickness of such an electrically insulating adhesive base layer 11 is preferably from 1 to 30 μm and more preferably from 2 to 15 μm.

Electrically Insulating Adhesive Cover Layer

As the electrically insulating adhesive cover layer 12, a cover layer used as an electrically insulating adhesive cover layer in a known anisotropic electrically conductive film can be selected and used as appropriate. Alternatively, the cover layer formed from the same material as that of the electrically insulating adhesive base layer 11 as described earlier can be also used.

Note that the electrically insulating adhesive cover layer 12 may be formed by using a coating method and drying, and further curing, a coating composition including the resin as described above, or otherwise by forming a film using a known technique in advance.

The thickness of such an electrically insulating adhesive cover layer 12 is preferably from 1 to 30 μm and more preferably from 2 to 15 μm.

Furthermore, an electrically insulating filler such as silica fine particles, alumina, and aluminum hydroxide may be added to the electrically insulating adhesive base layer 11 or the electrically insulating adhesive cover layer 12 as necessary. The blending amount of the electrically insulating filler is preferably 3 to 40 parts by mass per 100 parts by mass of resin included in the layers. Thereby, even when the electrically insulating adhesive layer is melted during anisotropic conductive connection, it is possible to prevent the electrically conductive particles 13 from moving unnecessarily by the melted resin.

Lamination of Electrically Insulating Adhesive Base Layer and Electrically Insulating Adhesive Cover Layer and Embedding of Electrically Conductive Particles Note that in a case where the electrically insulating adhesive base layer 11 and the electrically insulating adhesive cover layer 12 are laminated together with the electrically conductive particles 13 being interposed therebetween, it is possible to perform the lamination by using a known technique. In this case, the electrically conductive particles 13 are present near the interface of the layers. Here, "present near the interface" indicates that a part of the electrically conductive particles intrudes into one layer, and the remainder intrudes into the other layer. Furthermore, the electrically conductive particles may be embedded into the electrically insulating adhesive base layer. In this case, the electrically insulating adhesive cover layer may be formed without lamination.

Production of Anisotropic Electrically Conductive Film of Fourth Mode

Next, a method of producing an anisotropic electrically conductive film, according to the fourth mode of the present invention, which has a structure in which the electrically insulating adhesive base layer and the electrically insulating adhesive cover layer are laminated together, and near an interface therebetween, electrically conductive particles are disposed at the lattice points of the planar lattice pattern, will be described. The production method has the following steps (i) to (v). Each step will be described in detail with reference to the drawings. Note that this production method is not limiting.

Step (i)

Figure 12A:
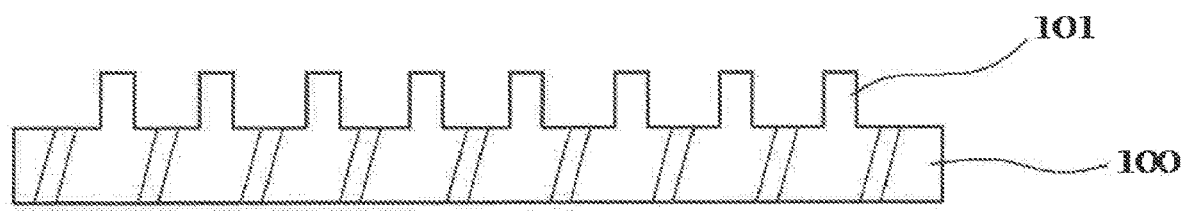
FIG. 12A is a step explanatory diagram of the production method of the anisotropic electrically conductive film of the fourth mode of the present invention.

First, as illustrated in FIG. 12A, a transfer body 100 is prepared in which a columnar convex portion 101 corresponding to the lattice points of the planar lattice pattern is formed on the surface. Here, the columnar shape includes a cylindrical shape or prism shape (a triangular prism, a square prism, a hexagonal prism, and the like). This columnar shape includes a cone type. The columnar shape is preferably the cylindrical shape. The height of the convex portion 101 can be determined depending on a terminal pitch, a terminal width, a spacing width, the average particle diameter of the electrically conductive particles, and the like where anisotropic conductive connection should be provided. And the height is preferably not less than 2 times and less than 4 times the average particle diameter of the electrically conductive particles used. In addition, a full width at half height (width at a half height) of the convex portion 101 is preferably not less than 0.7 times and not greater than 1.3 times the average particle diameter of the electrically conductive particle. If the height and width are in this range, then an effect is obtained in which consecutive occurrence of shedding and omission is avoided.

Furthermore, the convex portion 101 has a flat top surface with a flatness that can promote stable deposition of the electrically conductive particles.

Specific Example of Transfer Body

The transfer body that should be prepared in the step (i) can be prepared by utilizing a well-known technique. For example, a transfer body can be prepared by processing a metal plate to prepare a master, which is then coated with a curable resin composition, followed by curing. Specifically, a flat metal plate is cut and processed to prepare a transfer body master formed with a concave portion corresponding to a convex portion, and then a concave portion formation surface of the master is coated with a resin composition that configures the transfer body followed by curing. Then the composition is separated from the master to obtain the transfer body.

Step (ii)

Figure 12B:
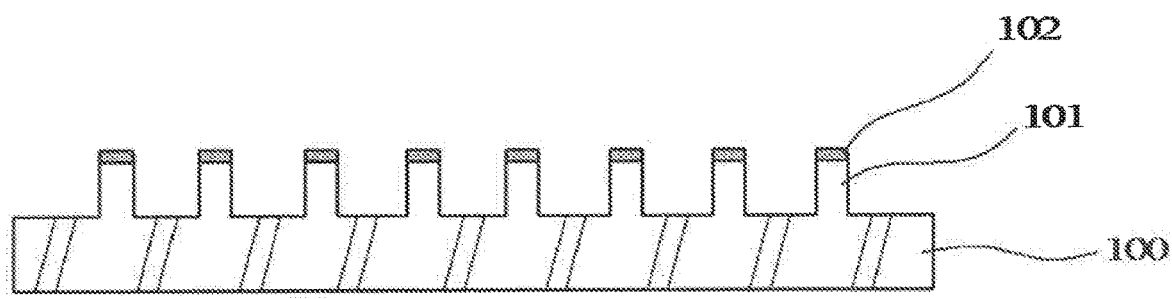
FIG. 12B is a step explanatory diagram of a production method of the anisotropic electrically conductive film of the fourth mode of the present invention.

Next, as illustrated in FIG. 12B, at least the top surface of the convex portions 101 of the transfer body 100 in which plural convex portions 101 are formed with the planar lattice pattern on the surface is set as a weak adhesive layer 102.

Weak Adhesive Layer of Transfer Body

The weak adhesive layer 102 is a layer that exhibits an adhesive force, by which it is possible to temporarily hold the electrically conductive particles until the electrically conductive particles are transferred to the electrically insulating adhesive base layer configuring the anisotropic electrically conductive film. Such a weak adhesive layer 102 is formed at least on the top surface of the convex portions 101. Accordingly, the entire convex portions 101 may be slightly adhesive. The thickness of the weak adhesive layer 102 can be appropriately determined depending on the material of the weak adhesive layer 102, the particle diameter of the electrically conductive particles, and the like. In addition, "weak adhesive" has a meaning of a weaker adhesive force than the electrically insulating adhesive base layer when the electrically conductive particles are transferred to the electrically insulating adhesive base layer.

For such a weak adhesive layer 102, a weak adhesive layer used in a known anisotropic electrically conductive film can be used. For example, it is possible to form the weak adhesive layer by applying a silicone-based adhesive composition and an adhesive layer of the same material as in the electrically insulating adhesive base layer or the electrically insulating adhesive cover layer on a top surface of the convex portions 101.

Step (iii)

Figure 12C:
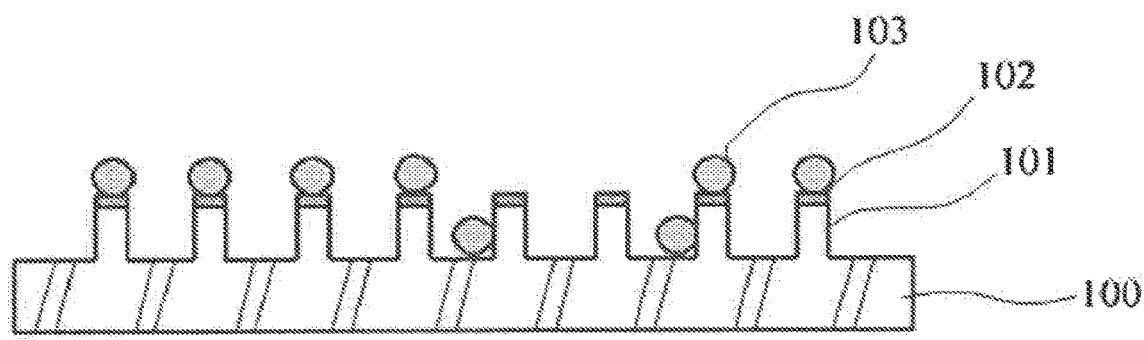
FIG. 12C is a step explanatory diagram of the production method of the anisotropic electrically conductive film of the fourth mode of the present invention.

Next, as illustrated in FIG. 12C, the electrically conductive particles 103 are deposited on the weak adhesive layer 102 of the convex portions 101 of the transfer body 100. Specifically, the electrically conductive particles 103 are scattered from above the convex portions 101 of the transfer body 100, the electrically conductive particles 103 that are not deposited on the weak adhesive layer 102 may be blown away using a blower. In this case, the electrically conductive particles are deposited on a side surface of some of the convex portions 101 at a certain frequency due to an action of static electricity and the like, and some electrically conductive particles may not be removed by a blower.

Note that the direction of the surface may be reversed from FIG. 12C, and the top surface of the projection may be attached to a surface over which the electrically conductive particles are all laid. This is to avoid unnecessary stress applied to the electrically conductive particles. It is easy to recover and reuse the electrically conductive particles by only electrically conductive particles necessary for the arrangement being deposited on the top surface of the projection. Thus, economic superiority is obtained in comparison with a method, in which the electrically conductive particles are packed in an opening portion and removed later. Note that in a case of the method for packing and taking out the electrically conductive particles in an opening, there is a concern that it is easy for unnecessary stress to be applied to the electrically conductive particles that are not packed.
Step (iv)

Figure 12D:
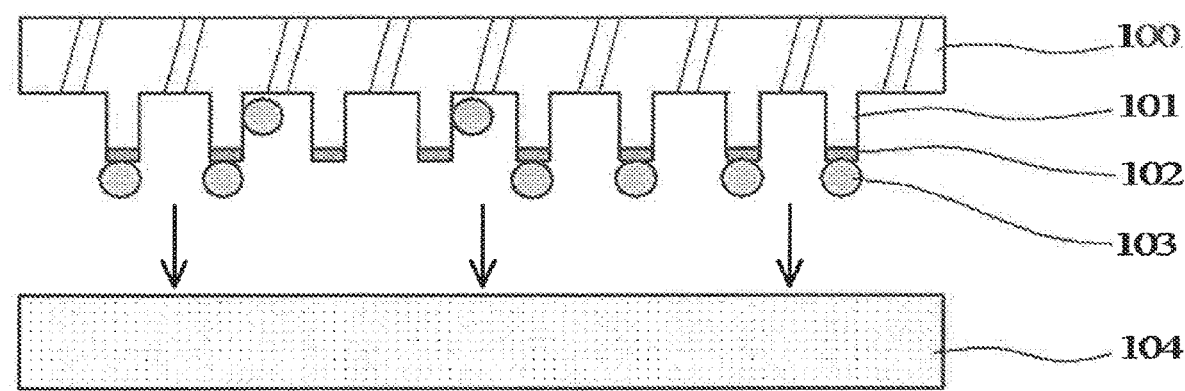
FIG. 12D is a step explanatory diagram of the production method of the anisotropic electrically conductive film of the fourth mode of the present invention.
Figure 12E:
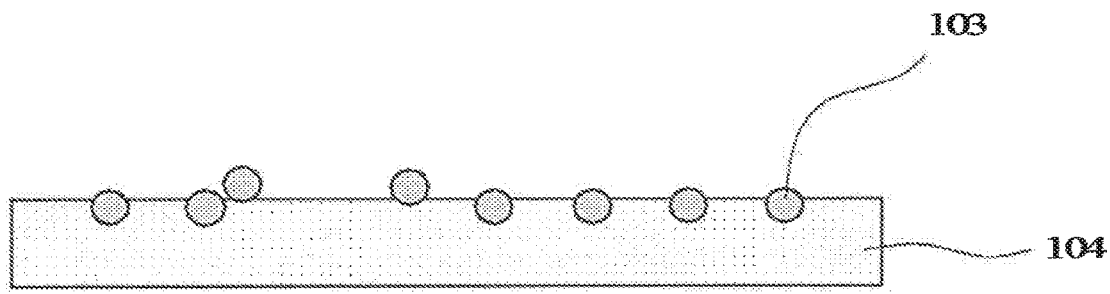
FIG. 12E is a step explanatory diagram of the production method of the anisotropic electrically conductive film of the fourth mode of the present invention.

Next, as illustrated in FIG. 12D, when the electrically insulating adhesive base layer 104 that should configure the anisotropic electrically conductive film is overlapped and pressed on a surface at a side on which the electrically conductive particles 103 of the transfer body 100 are deposited, the electrically conductive particles 103 are transferred to one side of the electrically insulating adhesive base layer 104 (FIG. 12E). In this case, preferably the transfer body 100 overlaps and presses the electrically insulating adhesive base layer 104 such that the convex portions 101 face downward. This is because the electrically conductive particles that are not stuck to the top surface of the convex portion are easily removed by being blown while facing down.
Step (v)

Figure 12F:
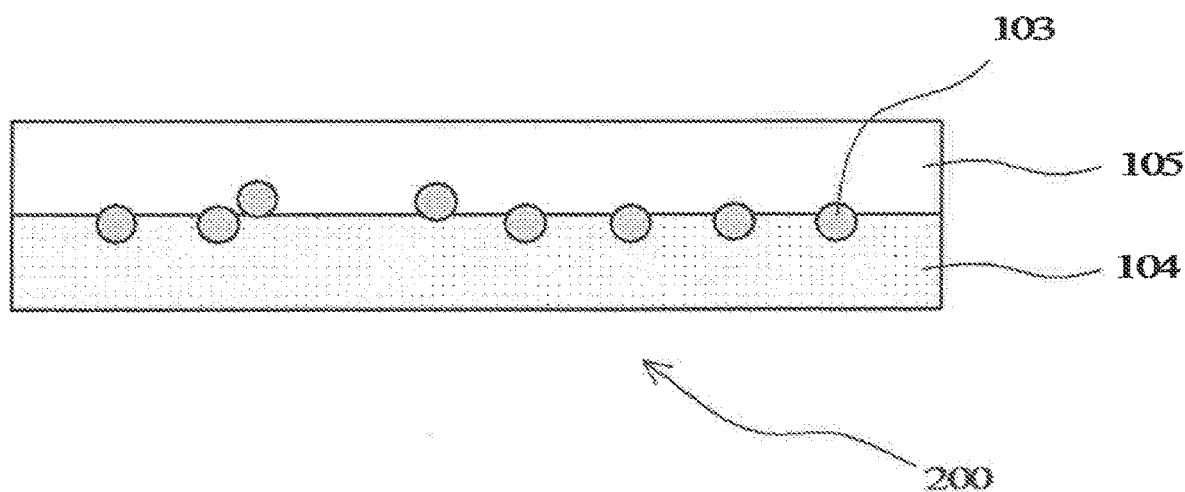
FIG. 12F is a step explanatory diagram of the production method of the anisotropic electrically conductive film of the fourth mode of the present invention while being a schematic cross-sectional view of the anisotropic electrically conductive film of the fourth mode of the present invention.

As illustrated in FIG. 12F, the electrically insulating adhesive cover layer 105 is laminated on the electrically insulating adhesive base layer 104, on which the electrically conductive particles 103 are transferred, from a side, on which the electrically conductive particles are transferred. Thereby, an anisotropic electrically conductive film 200 according to an embodiment of the present invention is obtained.

Noted that in the anisotropic electrically conductive film 200, the electrically conductive particles that are still deposited on the side surface of the convex portion 101 in the step (iii) would be the electrically conductive particles that are aggregated in a thickness direction of the anisotropic electrically conductive film 200 if the electrically conductive particles 103 are present in the weak adhesive layer 102 of the convex portion 101. Furthermore, if the electrically conductive particles 103 are not present in the weak adhesive layer 102 of the convex portion 101, the electrically conductive particles will be disposed with a shift in a horizontal and a thickness direction from the lattice point.
Connection Structural Body The anisotropic electrically conductive film according to the first, second, third, or fourth mode of the present invention may be disposed between a terminal (such as a bump) of a first electronic component (such as an IC chip) and a terminal (such as a bump or a pad) of a second electronic component (such as a wiring board), and finally cured by using thermocompression bonding from the first or second electronic component side to perform anisotropic conductive connection. Then a connection structural body, in which a short circuit or a conduction failure is suppressed, of a so-called chip on glass (COG), film on glass (FOG), or the like can be obtained.

EXAMPLES

The anisotropic electrically conductive film of the first mode of the present invention will be specifically described, below.

Example 1A

A nickel plate having a thickness of 2 mm was prepared, and a cylindrically-shaped concave portion (an inner diameter 5 µm and depth 6 µm) was formed in a tetragonal lattice pattern. Thus, the transfer body master was obtained. The distance between the centers of adjacent concave portions was 8 µm. Accordingly, the density of concave portions was 16000/mm$^2$.

The resultant transfer body master was coated with a photopolymerizable resin composition containing 60 parts by mass of phenoxy resin (YP-50, Nippon Steel & Sumikin Chemical Co., Ltd.), 29 parts by mass of acrylate resin (M208, Toagosei Co., Ltd.), and 2 parts by mass of photopolymerization initiator (IRGACURE184, BASF Japan Ltd.) on a PET (polyethylene terephthalate) film to a dried thickness of 30 µm, and after drying for five minutes at 80° C., light irradiation at 1000 mJ was performed by a high pressure mercury lamp. Thus, the transfer body was created.

The transfer body was peeled off from the master, and wound on a stainless steel roll with a diameter of 20 cm so that the convex portions were on the outer side. Then, the roll was brought into contact with an adhesive sheet obtained by impregnating a nonwoven fabric with a weak adhesive composition containing 70 parts by mass of epoxy resin (jER828, Mitsubishi Chemical Corporation) and 30 parts by mass of phenoxy resin (YP-50, Nippon Steel & Sumikin Chemical Co., Ltd.) while rotating the roll. Next, the weak adhesive composition was deposited on the top surface of the convex portions to form the weak adhesive layer with a thickness of 1 µm. Thus, the transfer body was obtained.

The electrically conductive particles with an average particle diameter of 4 µm (nickel plated resin particles (AUL704, Sekisui Chemical Co., Ltd.)) were scattered on the surface of the transfer body, and subsequently, the electrically conductive particles, which were not deposited to the weak adhesive layer, were removed by blowing.

The transfer body, to which the electrically conductive particles were deposited, was pressed, at a temperature of 50° C. and with a pressure of 0.5 MPa, from the side on which electrically conductive particles were deposited, against a sheet-shaped thermosetting-type electrically insulating adhesive film with a thickness of 5 µm that is the electrically insulating adhesive base layer (a film formed from an electrically insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), 2 parts by mass of cationic curing agent (SI-60L, Sanshin Chemical Industry Co., Ltd.), and 20 parts by mass of silica fine particles (Aerosil RY200, Nippon Aerosil Co., Ltd.)).

Thus, the electrically conductive particles were transferred to the electrically insulating adhesive base layer.

On the side of the electrically insulating adhesive base layer obtained, on which the electrically conductive particles were deposited, another sheet-shaped electrically insulating adhesive film with a thickness of 15 μm (film formed from an insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), and 2 parts by mass of cationic curing agent (SI-60L, Sanshin Chemical Industry Co., Ltd.)) was overlapped as a transparent electrically insulating adhesive cover layer and laminated together at a temperature of 60° C. and with a pressure of 2 MPa. Thereby, the anisotropic electrically conductive film was obtained.

Example 2A

Other than doubling each of the amount of scattered electrically conductive particles and the number of times of blowing, as compared to Example 1A, the anisotropic electrically conductive film was obtained by repeating the steps of Example 1A.

Example 3A

Except for setting the inner diameter of the concave portions of the transfer body master to 3.6 μm, setting a distance between the centers of adjacent concave portions to 6 μm, so that the density of the concave portions is 28000/mm$^2$, and using electrically conductive particles (AUL703, Sekisui Chemical Co., Ltd.) having an average particle diameter of 3 μm instead of electrically conductive particles having an average particle diameter of 4 μm, the anisotropic electrically conductive film was obtained by repeating the steps of Example 1A.

Example 4A

Except for doubling each of the amount of scattered electrically conductive particles and the number of times of blowing, as compared to Example 3A, the anisotropic electrically conductive film was obtained by repeating the steps of Example 3A.

Comparative Example 1A

Except for setting the depth of the concave portion of the transfer body master to 4.4 μm, the inner diameter of the concave portion to 4.8 μm, and setting the distance between the centers of the adjacent concave portions to be 5.6 μm so that the density of the concave portions is 32000/mm$^2$, the anisotropic electrically conductive film was obtained by repeating the steps of Example 1A.

Comparative Example 2A

Except for setting the depth of the concave portion of the transfer body master to 3.3 μm, the inner diameter of the concave portion to 3.6 μm, setting the distance between centers of the adjacent concave portion to 4.2 μm, so that the density of the concave portions is 57000/mm$^2$, and using electrically conductive particles (AUL703, Sekisui Chemical Co., Ltd.) having an average particle diameter of 3 μm instead of electrically conductive particles having an average particle diameter of 4 μm, the anisotropic electrically conductive film was obtained by repeating the steps of Example 1A.

Evaluation

"Omission" and "Aggregation" of Electrically Conductive Particles

For the anisotropic electrically conductive films of Examples 1A to 4A and Comparative Examples 1A to 2A, a region of 1 cm$^2$ was observed by using an optical microscope (MX50, Olympus Corporation) from the transparent electrically insulating adhesive cover layer side. Then, a proportion of the lattice points at which the electrically conductive particle is not deposited within an assumed planar lattice pattern, with respect to all the lattice points (omission [%]), and a proportion of the lattice points at which two or more electrically conductive particles were aggregated, with respect to all the lattice points, were examined. The obtained results are shown in Table 1.

Also, a longest distance (aggregation distance) between the aggregated electrically conductive particles was measured and shown along therewith in Table 1. Note that directions of the "aggregation" were in a horizontal direction of the anisotropic electrically conductive film for all cases.

Particle Area Occupancy

The particle area occupancy was calculated, from the average particle diameter of the electrically conductive particles and the concave portion density of the transfer body master (=the convex portion density of the transfer body), upon considering "omission" and "aggregation" of the electrically conductive particles. The obtained results are shown in Table 1.

Initial Conduction Resistance

The anisotropic electrically conductive films in Examples and Comparative Examples were used to make an anisotropic conductive connection between an IC chip that had a gold bump with a height of 15 μm and 30×50 μm with a space between bumps of 12 μm and a glass substrate on which a wiring of a space of 12 μm was provided under conditions of 180° C. and 60 MPa for five seconds, and the connection structural body was obtained. For the obtained connection structural body, an initial conduction resistance value was measured by using a resistance measuring instrument (digital multimeter 7565, Yokogawa Electric Corporation). The obtained results are shown in Table 1. The resistance of 0.5Ω or less is desirable.

Conduction Reliability

The connection structural body used in measurement of the initial conduction resistance value was placed in an aging tester set to a temperature of 85° C. and a humidity of 85%, and the electrically conductive resistance value after being left for 500 hours was measured in the same manner as the initial conduction resistance. The obtained results are shown in Table 1. The results of 5Ω or less is desirable.

Occurrence Rate of Short Circuit

The same connection structural body as that used to measure the initial conduction resistance value was prepared, and the presence or absence of occurrence of a short circuit between the adjacent wires was investigated. The obtained results are shown in Table 1. An occurrence rate of short circuit of not greater than 50 ppm is desirable.

TABLE 1

|  |  | Example | | | | Comparative Example | |
| --- | --- | --- | --- | --- | --- | --- | --- |
|  |  | 1A | 2A | 3A | 4A | 1A | 2A |
| Concave portion density of transfer body master | [number/mm²] | 16000 | 16000 | 28000 | 28000 | 32000 | 57000 |
| Average particle diameter of electrically conductive particles | [μm] | 4 | 4 | 3 | 3 | 4 | 3 |
| "Omission" of electrically conductive particles | [%] | 15 | 10 | 15 | 18 | 0.8 | 0.8 |
| "Aggregation" of electrically conductive particles | [%] | 0.1 | 5 | 0.1 | 5 | 27 | 27 |
| Aggregation distance | [μm] | 0.25 | 0.1 | 0.2 | 0.45 | 0.2 | 0.4 |
| Particle area occupancy | [%] | 17.1 | 19.1 | 16.8 | 17.2 | 50.7 | 50.8 |
| Initial conduction resistance | [Ω] | 0.2 | 0.2 | 0.2 | 0.2 | 0.2 | 0.2 |
| Conduction reliability | [Ω] | 4 | 4 | 4 | 4 | 4 | 4 |
| Occurrence rate of short circuit | [ppm] | <50 | <50 | <50 | <50 | 200 | 150 |

From the results in Table 1, it is understood that with respect to each of the evaluation items of initial conduction resistance, conduction reliability, and occurrence rate of short circuit, the connection structural bodies in which the anisotropic electrically conductive films of Examples 1A to 4A were used indicated a satisfactory result.

On the other hand, in a case of the anisotropic electrically conductive film of Comparative Examples 1A and 2A, a proportion of "aggregation" of the electrically conductive particles was too large although a proportion of "omission" thereof was small. Thus, the occurrence rate of short circuit was evaluated as poor.

Example 5A

Except for adjusting the distance between the centers of adjacent concave portions to use the transfer body master in which the concave portion density was 500/mm², the transfer body was prepared in the same manner as Example 2A, and furthermore, the anisotropic electrically conductive film was prepared. For the obtained anisotropic electrically conductive film, "omission" and "aggregation" of the electrically conductive particles were measured in the same manner as those in Example 2A, and furthermore, the particle area occupancy was calculated. As a result, the "omission" and the "aggregation" of the electrically conductive particles were the same as in Example 2A. The particle area occupancy was 0.6%.

In addition, the obtained anisotropic electrically conductive film was interposed between a glass substrate (ITO solid electrode) and a flexible wiring board (bump width: 200 μm, L (line)/S (space [spacing])=1, wiring height of 10 μm), the anisotropic conduction connection was made under the conditions of 180° C. and 80 MPa for five seconds such that a connection bump length was 1 mm, and the connection structural body for evaluation was obtained. Concerning the "initial conduction resistance value" and the "conduction reliability" after being input for 500 hours in a thermostatic bath with a temperature of 85° C. and a humidity of 85% RH in the obtained connection structure, conduction resistance was measured using a four terminal method at a current of 1 A using a digital multimeter (34401A, manufactured by Agilent Technologies, Inc.), the "initial conduction resistance value" was evaluated as good in a case where a measurement value was 2Ω or less and failure in a case where the measurement value exceeds 2Ω, and the "conduction reliability" was evaluated as good in a case where a measurement value was 5Ω or less and failure in a case where the measurement value was 5Ω or greater. As a result, every connection structural body of Example 5A was evaluated as "good". When the "occurrence rate of a short circuit" was measured in the same way as in Example 2A, a similar good result was obtained as in Example 2A.

Example 6A

Except for adjusting the distance between the centers of adjacent concave portions to use the transfer body master in which the concave portion density was 2000/mm², the transfer body was prepared in the same manner as Example 2A, and furthermore, the anisotropic electrically conductive film was prepared. For the obtained anisotropic electrically conductive film, "omission" and "aggregation" of the electrically conductive particles were measured in the same manner as those in Example 2A, and furthermore, the particle area occupancy was calculated. As a result, the "omission" and the "aggregation" of the electrically conductive particles were the same as in Example 2A. The particle area occupancy was 2.4%.

In addition, the connection structural body for evaluation was obtained by forming anisotropic conductive connection by interposing the obtained anisotropic electrically conductive film between the glass substrate and the flexible wiring board in the same manner as in Example 5A. When the obtained connection structural body was evaluated for the "initial conduction resistance", the "conduction reliability", and the "occurrence rate of short circuit" in the same manner as in Example 5A, satisfactory results were obtained for all of these.

In the anisotropic electrically conductive film of the first mode of the present invention, a proportion of "lattice points, at which no electrically conductive particle is disposed" with respect to all the lattice points of the planar lattice pattern assumed as a reference region is set to less than 20%, and moreover, a proportion of "lattice points at which plural electrically conductive particles are disposed in an aggregated state" with respect to all the lattice points of the planar lattice pattern is 15% or less. Therefore, in a case where the anisotropic electrically conductive film of the first mode of the present invention is applied to anisotropic conductive connection, it is possible to achieve a good initial conductivity and a good conduction reliability after aging, and it is also possible to suppress occurrence of a short circuit, therefore it is useful to form anisotropic conductive connection of an IC chip and a wiring board with narrow pitches.

Next, the anisotropic electrically conductive film of the second mode of the present invention will be specifically described.

Example 1B

A nickel plate having a thickness of 2 mm was prepared, a cylindrical shaped concave portion (an inner diameter 6 µm and a depth 8 µm) was formed in a tetragonal lattice pattern. Thus, the transfer body master was obtained. The distance between the centers of adjacent concave portions was 8 µm. Accordingly, the density of concave portions was $16000/mm^2$.

The resultant transfer body master was coated with a photopolymerizable resin composition containing 60 parts by mass of phenoxy resin (YP-50, Nippon Steel & Sumikin Chemical Co., Ltd.), 29 parts by mass of acrylate resin (M208, Toagosei Co., Ltd.), and 2 parts by mass of photopolymerization initiator (IRGACURE184, BASF Japan Ltd.) on a PET (polyethylene terephthalate) film to a dried thickness of 30 µm, and after drying for five minutes at 80° C., light irradiation at 1000 mJ was performed by a high pressure mercury lamp. Thus, the transfer body was created.

The transfer body was peeled off from the master, and wound on a stainless steel roll with a diameter of 20 cm so that the convex portions were on the outer side. Then, the roll was brought into contact with an adhesive sheet obtained by impregnating a nonwoven fabric with a weak adhesive composition containing 70 parts by mass of epoxy resin (jER828, Mitsubishi Chemical Corporation) and 30 parts by mass of phenoxy resin (YP-50, Nippon Steel & Sumikin Chemical Co., Ltd.) while rotating the roll. Next, the weak adhesive composition was deposited on the top surface of the convex portions to form the weak adhesive layer with a thickness of 1 µm. Thus, the transfer body was obtained.

The electrically conductive particles with an average particle diameter of 4 µm (nickel plated resin particles (AUL704, Sekisui Chemical Co., Ltd.)) were scattered on the surface of the transfer body, and subsequently, the electrically conductive particles, which were not deposited to the weak adhesive layer, were removed by blowing.

The transfer body, to which the electrically conductive particles were deposited, was pressed, at a temperature of 50° C. and with a pressure of 0.5 MPa, from the side on which electrically conductive particles were deposited, against a sheet-shaped thermosetting-type electrically insulating adhesive film with a thickness of 5 µm that is the electrically insulating adhesive base layer (a film formed from an electrically insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), 2 parts by mass of cationic curing agent (SI-60L, Sanshin Chemical Industry Co., Ltd.), and 20 parts by mass of silica fine particles (Aerosil RY200, Nippon Aerosil Co., Ltd.)). Thus, the electrically conductive particles were transferred to the electrically insulating adhesive base layer.

On the side of the electrically insulating adhesive base layer obtained, on which the electrically conductive particles were deposited, another sheet-shaped electrically insulating adhesive film with a thickness of 15 µm (film formed from an insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), and 2 parts by mass of cationic curing agent (SI-60L, Sanshin Chemical Industry Co., Ltd.)) was overlapped as a transparent electrically insulating adhesive cover layer and laminated together at a temperature of 60° C. and with a pressure of 2 MPa. Thereby, the anisotropic electrically conductive film was obtained.

Example 2B

Except for doubling each of the amount of scattered electrically conductive particles and the number of times of blowing, as compared to Example 1B, the anisotropic electrically conductive film was obtained by repeating the steps of Example 1B.

Example 3B

Except for setting the inner diameter and the depth of the cylindrical concave portions of the transfer body master to 4.5 µm and 7.5 µm, respectively, setting the distance between the centers of adjacent concave portions to 6 µm, so that the density of the concave portions is $28000/mm^2$, and using electrically conductive particles (AUL703, Sekisui Chemical Co., Ltd.) having an average particle diameter of 3 µm instead of electrically conductive particles having an average particle diameter of 4 jinn, the anisotropic electrically conductive film was obtained by repeating the steps of Example 1B.

Example 4B

Except for doubling each of the amount of scattered electrically conductive particles and the number of times of blowing, as compared to Example 3B, the anisotropic electrically conductive film was obtained by repeating the steps of Example 3B.

Comparative Example 1B

Except for setting the depth of the concave portion of the transfer body master to 4.4 µm, the inner diameter of the concave portions to 4.8 µm, setting the distance between the centers of adjacent concave portions to 5.6 µm, so that the density of the concave portions is $32000/mm^2$, the anisotropic electrically conductive film was obtained by repeating the steps of Example 1B.

Comparative Example 2B

Except for setting the depth of the concave portion of the transfer body master to 3.3 µm, the inner diameter of the concave portions to 3.3 µm, setting the distance between the centers of adjacent concave portions to 4.2 µm, so that the density of the concave portions is $57000/mm^2$, and using electrically conductive particles (AUL703, Sekisui Chemical Co., Ltd.) having an average particle diameter of 3 µm instead of electrically conductive particles having an average particle diameter of 4 µm, the anisotropic electrically conductive film was obtained by repeating the steps of Example 1B.

Evaluation

For the anisotropic electrically conductive films of Examples 1B to 4B and Comparative Examples 1B to 2B, the same evaluation items as those evaluated for the anisotropic electrically conductive film of Example 1A were tested and evaluated by the same method. The obtained results are shown in Table 2. Note that direction of the "aggregation" of the aggregated electrically conductive particles was in a horizontal direction of the anisotropic electrically conductive film for all the cases.

resistance was measured using a four terminal method at a current of 1 A using a digital multimeter (34401A, manufactured by Agilent Technologies, Inc.), the "initial conduction resistance value" was evaluated as good in a case where a measurement value was 2Ω or less and failure in a case where the measurement value exceeds 2Ω, and the "con-

TABLE 2

|  |  | Example | | | | Comparative Example | |
| --- | --- | --- | --- | --- | --- | --- | --- |
|  |  | 1B | 2B | 3B | 4B | 1B | 2B |
| Concave portion density of transfer body master | [number/mm$^2$] | 16000 | 16000 | 28000 | 28000 | 32000 | 57000 |
| Average particle diameter of electrically conductive particles | [μm] | 4 | 4 | 3 | 3 | 4 | 3 |
| "Omission" of electrically conductive particles | [%] | 1 | 4 | 1 | 4 | 0.5 | 0.5 |
| "Aggregation" of electrically conductive particles | [%] | 14 | 11 | 14 | 11 | 26 | 26 |
| Aggregation distance | [μm] | 0.2 | 1 | 0.15 | 0.75 | 0.1 | 0.08 |
| Particle area occupancy | [%] | 22.7 | 21.5 | 22.4 | 21.2 | 50.4 | 50.5 |
| Initial conduction resistance | [Ω] | 0.2 | 0.2 | 0.2 | 0.2 | 0.2 | 0.2 |
| Conduction reliability | [Ω] | 4 | 4 | 4 | 4 | 4 | 4 |
| Occurrence rate of short circuit | [ppm] | <50 | <50 | <50 | <50 | 400 | 250 |

From the results in Table 2, it is understood that the connection structural bodies in which the anisotropic electrically conductive films in Examples 1B to 4B were used exhibited good results for each evaluation item of initial conduction resistance, conduction reliability, and occurrence rate of short circuit.

On the other hand, in a case of the anisotropic electrically conductive films in Comparative Examples 1B and 2B, a proportion of "aggregation" of the electrically conductive particles was too large although a proportion of "omission" was low, thus the occurrence rate of short circuit significantly exceeded 50 ppm.

Example 5B

Except for adjusting the distance between the centers of adjacent concave portions to use the transfer body master in which the concave portion density was 500/mm$^2$, the transfer body was prepared in the same manner as in Example 2B, and furthermore, the anisotropic electrically conductive film was prepared. For the obtained anisotropic electrically conductive film, "omission" and "aggregation" of the electrically conductive particles were measured in the same manner as in Example 2B, and furthermore, the particle area occupancy was calculated. As a result, the "omission" and the "aggregation" of the electrically conductive particles were the same as those in Example 2B. The particle area occupancy was 0.7%.

In addition, the obtained anisotropic electrically conductive film was interposed between a glass substrate (ITO solid electrode) and a flexible wiring board (bump width: 200 μm, L (line)/S (space [spacing])=1, wiring height of 10 μm), the anisotropic conductive connection was made under the conditions of 180° C. and 80 MPa for five seconds such that a connection bump length was 1 mm, and the connection structural body for evaluation was obtained. In the obtained connection structural body, for the "initial conduction resistance value" and the "conduction reliability" after being placed for 500 hours in a thermostatic bath with a temperature of 85° C. and a humidity of 85% RH, conduction duction reliability" was evaluated as good in a case where a measurement value was 5Ω or less and failure in a case where the measurement value was 5Ω or greater. As a result, the connection structural body of Example 5B was evaluated as "good" for all items. When the "occurrence rate of a short circuit" was measured in the same manner as in Example 2B, a good result was obtained similar to that of Example 2B.

Example 6B

Except for adjusting the distance between the centers of adjacent concave portions to use the transfer body master in which the concave portion density was 2000/mm$^2$, the transfer body was prepared in the same manner as in Example 2B, and furthermore, the anisotropic electrically conductive film was prepared. For the obtained anisotropic electrically conductive film, "omission" and "aggregation" of the electrically conductive particles were measured in the same manner as in Example 2B, and furthermore, the particle area occupancy was calculated. As a result, the "omission" and the "aggregation" of the electrically conductive particles were the same as those in Example 2B. The particle area occupancy was 2.7%.

In addition, the connection structural body for evaluation was obtained by forming anisotropic conductive connection by interposing the obtained anisotropic electrically conductive film between the glass substrate and the flexible wiring board in the same manner as in Example 5B. When the obtained connection structural body was evaluated for the "initial conduction resistance value", the "conduction reliability", and the "occurrence rate of short circuit" in the same manner as in Example 5B, satisfactory results were obtained for all of these.

In the anisotropic electrically conductive film of the second mode of the present invention, a proportion of "lattice points, at which no electrically conductive particle is disposed" with respect to all the lattice points of the planar lattice pattern assumed as any reference region is set to less than 5%, and moreover, a proportion of "lattice points at which plural electrically conductive particles are disposed in an aggregated state" with respect to all the lattice points of the planar lattice pattern is greater than 10% and less than 15%. Therefore, in a case where the anisotropic electrically conductive film of the second mode of the present invention is applied to anisotropic conductive connection, it is possible to achieve a good initial conductivity and a good conduction reliability after aging, and it is also possible to suppress occurrence of a short circuit, therefore it is useful to form anisotropic conductive connection of an IC chip and a wiring board with narrow pitches.

Next, the anisotropic electrically conductive film of the third mode of the present invention will be specifically described.

Example 1C

A nickel plate having a thickness of 2 mm was prepared, a cylindrical shaped concave portion (an inner diameter 6 µm and a depth 7 µm) was formed in a tetragonal lattice pattern. Thus, the transfer body master was obtained. The distance between the centers of adjacent concave portions was 8 µm. Accordingly, the density of concave portions was 16000/mm$^2$.

The resultant transfer body master was applied with a photopolymerizable resin composition containing 60 parts by mass of phenoxy resin (YP-50, Nippon Steel & Sumikin Chemical Co., Ltd.), 29 parts by mass of acrylate resin (M208, Toagosei Co., Ltd.), and 2 parts by mass of photopolymerization initiator (IRGACURE184, BASF Japan Ltd.) on a PET (polyethylene terephthalate) film to a dried thickness of 30 µm, and after drying for five minutes at 80° C., light irradiation at 1000 mJ was performed by a high pressure mercury lamp. Thus, the transfer body was created.

The transfer body was peeled off from the master, and wound on a stainless steel roll with a diameter of 20 cm so that the convex portions were on the outer side. Then, the roll was brought into contact with an adhesive sheet obtained by impregnating a nonwoven fabric with a weak adhesive composition containing 70 parts by mass of epoxy resin (jER828, Mitsubishi Chemical Corporation) and 30 parts by mass of phenoxy resin (YP-50, Nippon Steel & Sumikin Chemical Co., Ltd.) while rotating the roll. Next, the weak adhesive composition was deposited on the top surface of the convex portions to form the weak adhesive layer with a thickness of 1 µm. Thus, the transfer body was obtained.

The electrically conductive particles with an average particle diameter of 4 µm (nickel plated resin particles (AUL704, Sekisui Chemical Co., Ltd.)) were scattered on the surface of the transfer body, and subsequently, the electrically conductive particles, which were not deposited to the weak adhesive layer, were removed by blowing.

The transfer body, to which the electrically conductive particles were deposited, was pressed, at a temperature of 50° C. and with a pressure of 0.5 MPa, from the side on which electrically conductive particles were deposited, against a sheet-shaped thermosetting-type electrically insulating adhesive film with a thickness of 5 µm that is the electrically insulating adhesive base layer (a film formed from an electrically insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), 2 parts by mass of cationic curing agent (SI-60L, Sanshin Chemical Industry Co., Ltd.), and 20 parts by mass of silica fine particles (Aerosil RY200, Nippon Aerosil Co., Ltd.)). Thus, the electrically conductive particles were transferred to the electrically insulating adhesive base layer.

On the side of the electrically insulating adhesive base layer obtained, on which the electrically conductive particles were deposited, another sheet-shaped electrically insulating adhesive film with a thickness of 15 µm (film formed from an insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), and 2 parts by mass of cationic curing agent (SI-60L, Sanshin Chemical Industry Co., Ltd.)) was overlapped as a transparent electrically insulating adhesive cover layer and laminated together at a temperature of 60° C. and with a pressure of 2 MPa. Thereby, the anisotropic electrically conductive film was obtained.

Example 2C

Except for doubling each of the amount of scattered electrically conductive particles and the number of times of blowing, as compared to Example 1C, the anisotropic electrically conductive film was obtained by repeating the steps of Example 1C.

Example 3C

Except for setting the inner diameter of the cylindrical concave portions of the transfer body master to 4.5 µm, setting the distance between the centers of adjacent concave portions to 6 µm, so that the density of the concave portions is 28000/mm$^2$, and using electrically conductive particles (AUL703, Sekisui Chemical Co., Ltd.) having an average particle diameter of 3 µm instead of electrically conductive particles having an average particle diameter of 4 µm, the anisotropic electrically conductive film was obtained by repeating the steps of Example 1C.

Example 4C

Except for doubling each of the amount of scattered electrically conductive particles and the number of times of blowing, as compared to Example 3C, the anisotropic electrically conductive film was obtained by repeating the steps of Example 3C.

Comparative Example 1C

Except for setting the depth of the concave portion of the transfer body master to 4.4 µm, the inner diameter of the concave portions to 4.8 µm, the distance between the centers of adjacent concave portions to 5.6 µm, so that the density of the concave portions is 32000/mm$^2$, the anisotropic electrically conductive film was obtained by repeating the steps of Example 1C.

Comparative Example 2C

Except for setting the depth of the concave portion of the transfer body master to 3.3 µm, the inner diameter of the concave portions to 3.6 µm, the distance between the centers of adjacent concave portions to 4.2 µm, so that the density of the concave portions is 57000/mm$^2$, and using electrically conductive particles (AUL703, Sekisui Chemical Co., Ltd.) having an average particle diameter of 3 µm instead of electrically conductive particles having an average particle diameter of 4 μm, the anisotropic electrically conductive film was obtained by repeating the steps of Example 1C.

Evaluation

For the anisotropic electrically conductive films of Examples 1C to 4C and Comparative Examples 1C to 2C, the same evaluation items as those evaluated for the anisotropic electrically conductive film of Example 1A were tested and evaluated by the same method. The obtained results are shown in Table 3. Note that direction of the "aggregation" of the aggregated electrically conductive particles was in a horizontal direction of the anisotropic electrically conductive film for all the cases.

a connection bump length was 1 mm, and the connection structural body for evaluation was obtained. In the obtained connection structural body, for the "initial conduction resistance value" and the "conduction reliability" after being placed for 500 hours in a thermostatic bath with a temperature of 85° C. and a humidity of 85% RH, conduction resistance was measured using a four terminal method at a current of 1 A using a digital multimeter (34401A, manufactured by Agilent Technologies, Inc.), the "initial conduction resistance value" was evaluated as good in a case where a measurement value was 2Ω or less and failure in a case where the measurement value exceeds 2Ω, and the "con-

TABLE 3

|  |  | Example | | | | Comparative Example | |
| --- | --- | --- | --- | --- | --- | --- | --- |
|  |  | 1C | 2C | 3C | 4C | 1C | 2C |
| Concave portion density of transfer body master | [number/mm$^2$] | 16000 | 16000 | 28000 | 28000 | 32000 | 57000 |
| Average particle diameter of electrically conductive particles | [μm] | 4 | 4 | 3 | 3 | 4 | 3 |
| "Omission" of electrically conductive particles | [%] | 6 | 10 | 6 | 10 | 0.5 | 0.5 |
| "Aggregation" of electrically conductive particles | [%] | 9 | 5 | 9 | 5 | 26 | 26 |
| Aggregation distance | [μm] | <0.25 | <0.1 | <0.2 | <0.45 | <0.2 | <0.4 |
| Particle area occupancy | [%] | 20.7 | 19.1 | 20.4 | 18.8 | 50.4 | 50.5 |
| Initial conduction resistance | [Ω] | 0.2 | 0.2 | 0.2 | 0.2 | 0.2 | 0.2 |
| Conduction reliability | [Ω] | 4 | 4 | 4 | 4 | 4 | 4 |
| Occurrence rate of short circuit | [ppm] | <50 | <50 | <50 | <50 | 400 | 250 |

From the results in Table 3, it is understood that the connection structural bodies in which the anisotropic electrically conductive films in Examples 1C to 4C were used exhibited a good result for each evaluation item of initial conduction resistance, conduction reliability, and occurrence rate of short circuit.

On the other hand, in a case of the anisotropic electrically conductive films of Comparative Examples 1C and 2C, a proportion of "aggregation" of the electrically conductive particles was too large although a proportion of "omission" thereof was low, and thus, the occurrence rate of short circuit was evaluated as poor.

Example 5C

Except for adjusting the distance between the centers of adjacent concave portions to use the transfer body master in which the concave portion density was 500/mm$^2$, the transfer body was prepared in the same manner as in Example 2C, and furthermore, the anisotropic electrically conductive film was prepared. For the obtained anisotropic electrically conductive film, "omission" and "aggregation" of the electrically conductive particles were measured in the same manner as in Example 2C, and furthermore, the particle area occupancy was calculated. As a result, the "omission" and the "aggregation" of the electrically conductive particles were the same as those in Example 2C. The particle area occupancy was 0.6%.

In addition, the obtained anisotropic electrically conductive film was interposed between a glass substrate (ITO solid electrode) and a flexible wiring board (bump width: 200 μm, L (line)/S (space [spacing])=1, wiring height of 10 μm), the anisotropic conductive connection was made under the conditions of 180° C. and 80 MPa for five seconds such that duction reliability" was evaluated as good in a case where a measurement value was 5Ω or less and failure in a case where the measurement value was 5Ω or greater. As a result, the connection structural body of Example 5C was evaluated as "good" for all items. When the "occurrence rate of a short circuit" was measured in the same manner as in Example 2C, a good result was obtained similar to that of Example 2C.

Example 6C

Except for adjusting the distance between the centers of adjacent concave portions in order to use the transfer body master in which the concave portion density was 2000/mm$^2$, the transfer body was prepared in the same manner as in Example 2C, and furthermore, the anisotropic electrically conductive film was prepared. For the obtained anisotropic electrically conductive film, "omission" and "aggregation" of the electrically conductive particles were measured in the same manner as in Example 2C, and furthermore, the particle area occupancy was calculated. As a result, the "omission" and the "aggregation" of the electrically conductive particles were the same as those in Example 2C. The particle area occupancy was 2.4%.

In addition, the connection structural body for evaluation was obtained by forming anisotropic conductive connection by interposing the obtained anisotropic electrically conductive film between the glass substrate and the flexible wiring board in the same manner as in Example 5C. When the obtained connection structural body was evaluated for the "initial conduction resistance value", the "conduction reliability", and the "occurrence rate of short circuit" in the same manner as in Example 5C, satisfactory results were obtained for all of these.

In the anisotropic electrically conductive film of the third mode of the present invention, a proportion of "lattice points, at which no electrically conductive particle is disposed" with respect to all the lattice points of the planar lattice pattern assumed as a reference region is set to 15% or less, and a proportion of "lattice points at which plural electrically conductive particles are disposed in an aggregated state" with respect to all the lattice points of the planar lattice pattern is 10% or less. The electrically conductive particles that are disposed in the aggregated state are aggregated in contact with each other in the planar direction of the anisotropic electrically conductive film. Therefore, in a case where the anisotropic electrically conductive film of the third mode of the present invention is applied to anisotropic conductive connection, it is possible to achieve a good initial conductivity and a good conduction reliability after aging, and it is also possible to suppress occurrence of a short circuit, therefore it is useful to form anisotropic conductive connection of an IC chip and a wiring board with narrow pitches.

Next, the anisotropic electrically conductive film of the fourth mode of the present invention will be specifically described.

Example 1D

A nickel plate having a thickness of 2 mm was prepared, a cylindrical shaped concave portion (an inner diameter 5 µm and a depth 8 µm) was formed in a tetragonal lattice pattern. Thus, the transfer body master was obtained. The distance between the centers of adjacent concave portions was 8 µm. Accordingly, the density of concave portions was 16000/mm$^2$.

The resultant transfer body master was coated with a photopolymerizable resin composition containing 60 parts by mass of phenoxy resin (YP-50, Nippon Steel & Sumikin Chemical Co., Ltd.), 29 parts by mass of acrylate resin (M208, Toagosei Co., Ltd.), and 2 parts by mass of photopolymerization initiator (IRGACURE184, BASF Japan Ltd.) on a PET (polyethylene terephthalate) film to a dried thickness of 30 µm, and after drying for five minutes at 80° C., light irradiation at 1000 mJ was performed by a high pressure mercury lamp. Thus, the transfer body was created.

The transfer body was peeled off from the master, and wound on a stainless steel roll with a diameter of 20 cm so that the convex portions were on the outer side. Then, the roll was brought into contact with an adhesive sheet obtained by impregnating a nonwoven fabric with a weak adhesive composition containing 70 parts by mass of epoxy resin (jER828, Mitsubishi Chemical Corporation) and 30 parts by mass of phenoxy resin (YP-50, Nippon Steel & Sumikin Chemical Co., Ltd.) while rotating the roll. Next, the weak adhesive composition was deposited on the top surface of the convex portions to form the weak adhesive layer with a thickness of 1 µm. Thus, the transfer body was obtained.

The electrically conductive particles with an average particle diameter of 4 µm (nickel plated resin particles (AUL704, Sekisui Chemical Co., Ltd.)) were scattered on the surface of the transfer body, and subsequently, the electrically conductive particles, which were not deposited to the weak adhesive layer, were removed by blowing.

The transfer body, to which the electrically conductive particles were deposited, was pressed, at a temperature of 50° C. and with a pressure of 0.5 MPa, from the side on which electrically conductive particles were deposited, against a sheet-shaped thermosetting-type electrically insulating adhesive film with a thickness of 5 µm that is the electrically insulating adhesive base layer (a film formed from an electrically insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), 2 parts by mass of cationic curing agent (SI-60L, Sanshin Chemical Industry Co., Ltd.), and 20 parts by mass of silica fine particles (Aerosil RY200, Nippon Aerosil Co., Ltd.)). Thus, the electrically conductive particles were transferred to the electrically insulating adhesive base layer.

On the side of the electrically insulating adhesive base layer obtained, on which the electrically conductive particles were deposited, another sheet-shaped electrically insulating adhesive film with a thickness of 15 µm (film formed from an insulating adhesive composition containing 60 parts by mass of phenoxy resin (YP-50, Nippon Steel & Sumikin Chemical Co., Ltd.), 40 parts by mass of epoxy resin (jER828, Mitsubishi Chemical Corporation), and 2 parts by mass of cationic curing agent (SI-60L, Sanshin Chemical Industry Co., Ltd.)) was overlapped as a transparent electrically insulating adhesive cover layer and laminated together at a temperature of 60° C. and with a pressure of 2 MPa. Thereby, the anisotropic electrically conductive film was obtained.

Example 2D

Except for doubling each of the amount of scattered electrically conductive particles and the number of times of blowing, as compared to Example 1D, the anisotropic electrically conductive film was obtained by repeating the steps of Example 1D.

Example 3D

Except for setting the inner diameter of the cylindrical concave portions of the transfer body master to 3.8 µm, a depth to 6 µm, setting the distance between the centers of adjacent concave portions to 6 µm, so that the density of the concave portions is 28000/mm$^2$, and using electrically conductive particles (AUL703, Sekisui Chemical Co., Ltd.)) having an average particle diameter of 3 µm instead of electrically conductive particles having an average particle diameter of 4 µm, the anisotropic electrically conductive film was obtained by repeating the steps of Example 1D.

Example 4D

Except for doubling each of the amount of scattered electrically conductive particles and the number of times of blowing, as compared to Example 3D, the anisotropic electrically conductive film was obtained by repeating the steps of Example 3D.

Comparative Example 1D

Except for setting the depth of the concave portion of the transfer body master to 4.4 µm, the inner diameter of the concave portions to 4.8 µm, the distance between the centers of adjacent concave portions to 5.6 µm, so that the density of the concave portions is 32000/mm$^2$, the anisotropic electrically conductive film was obtained by repeating the steps of Example 1D.

Comparative Example 2D

Except for setting the depth of the concave portion of the transfer body master to 3.3 µm, the inner diameter of the concave portions to 3.6 µm, the distance between the centers of adjacent concave portions to 4.2 µm, so that the density of the concave portions is 57000/mm², and using electrically conductive particles (AUL703, Sekisui Chemical Co., Ltd.) having an average particle diameter of 3 µm instead of electrically conductive particles having an average particle diameter of 4 µm, the anisotropic electrically conductive film was obtained by repeating the steps of Example 1D.
Evaluation For the anisotropic electrically conductive films of Examples 1D to 4D and Comparative Examples 1D to 2D, the same evaluation items as those evaluated for the anisotropic electrically conductive film of Example 1A were tested and evaluated by the same method. The obtained results are shown in Table 4. Note that direction of the "aggregation" of the aggregated electrically conductive particles was in a horizontal direction of the anisotropic electrically conductive film for all the cases.

In addition, the obtained anisotropic electrically conductive film was interposed between a glass substrate (ITO solid electrode) and a flexible wiring board (bump width: 200 µm, L (line)/S (space [spacing])=1, wiring height of 10 µm), the anisotropic conductive connection was made under the conditions of 180° C. and 80 MPa for five seconds such that a connection bump length was 1 mm, and the connection structural body for evaluation was obtained. In the obtained connection structural body, for the "initial conduction resistance value" and the "conduction reliability" after being placed for 500 hours in a thermostatic bath with a temperature of 85° C. and a humidity of 85% RH, conduction resistance was measured using a four terminal method at a current of 1 A using a digital multimeter (34401A, manufactured by Agilent Technologies, Inc.), the "initial conduction resistance value" was evaluated as good in a case where a measurement value was 2Ω or less and failure in a case where the measurement value exceeds 2Ω, and the "con-

TABLE 4

|  |  | Example |  |  |  | Comparative Example |  |
| --- | --- | --- | --- | --- | --- | --- | --- |
|  |  | 1D | 2D | 3D | 4D | 1D | 2D |
| Concave Portion Density of Transfer Body Master | [number/mm²] | 16000 | 16000 | 28000 | 28000 | 32000 | 57000 |
| Average particle diameter of electrically conductive particles | [µm] | 4 | 4 | 3 | 3 | 4 | 3 |
| "Omission" of electrically conductive particles | [%] | 6 | 4 | 6 | 4 | 1 | 1 |
| "Aggregation" of electrically conductive particles | [%] | 9 | 11 | 9 | 11 | 26 | 26 |
| Aggregation distance | [µm] | 2 | 1.1 | 1.5 | 0.76 | 0.8 | 0.6 |
| Particle area occupancy | [%] | 20.7 | 21.5 | 20.4 | 21.2 | 50.2 | 50.3 |
| Initial conduction resistance | [Ω] | 0.2 | 0.2 | 0.2 | 0.2 | 0.2 | 0.2 |
| Conduction reliability | [Ω] | 4 | 4 | 4 | 4 | 4 | 4 |
| Occurrence rate of short circuit | [ppm] | <50 | <50 | <50 | <50 | 150 | 100 |

From the results in Table 4, it is understood that the connection structural bodies in which the anisotropic electrically conductive films in Examples 1D to 4D were used exhibited a good result for each evaluation item of initial conduction resistance, conduction reliability, and occurrence rate of short circuit.

On the other hand, in a case of the anisotropic electrically conductive films of Comparative Examples 1D and 2D, a proportion of "aggregation" of the electrically conductive particles was too large although a proportion of "omission" is low, and thus, the occurrence of a short circuit was evaluated as poor.

Example 5D

Except for adjusting the distance between the centers of adjacent concave portions to use the transfer body master in which the concave portion density was 500/mm², the transfer body was prepared in the same manner as in Example 2D, and furthermore, the anisotropic electrically conductive film was prepared. For the obtained anisotropic electrically conductive film, "omission" and "aggregation" of the electrically conductive particles were measured in the same manner as in Example 2D, and furthermore, the particle area occupancy was calculated. As a result, the "omission" and the "aggregation" of the electrically conductive particles were the same as those in Example 2D. The particle area occupancy was 0.7%.

duction reliability" was evaluated as good in a case where a measurement value was 5Ω or less and failure in a case where the measurement value was 5Ω or greater. As a result, every connection structural body of Example 5D was evaluated as "good" for all items. When the "occurrence rate of a short circuit" was measured in the same manner as in Example 2D, a good result was obtained similar to that of Example 2D.

Example 6D

Except for adjusting the distance between the centers of adjacent concave portions to use the transfer body master in which the concave portion density was 2000/mm², the transfer body was prepared in the same manner as in Example 2D, and furthermore, the anisotropic electrically conductive film was prepared. For the obtained anisotropic electrically conductive film, "omission" and "aggregation" of the electrically conductive particles were measured in the same manner as in Example 2D, and furthermore, the particle area occupancy was calculated. As a result, the "omission" and the "aggregation" of the electrically conductive particles were the same as those in Example 2D. The particle area occupancy was 2.7%.

In addition, the connection structure for evaluation was obtained by making anisotropic conductive connection with interposing the obtained anisotropic electrically conductive film between the glass substrate and the flexible wiring board in the same manner as Example 5D. When the obtained connection structural body was evaluated for the "initial conduction resistance value", the "conduction reliability", and the "occurrence rate of short circuit" in the same manner as in Example 5D, satisfactory results were obtained for all of these.

In the anisotropic electrically conductive film of the fourth mode of the present invention, a proportion of the "lattice points, at which no electrically conductive particle is disposed" with respect to all the lattice points of the planar lattice pattern assumed as the reference region is set to less than 10%, and a proportion of "lattice points at which plural electrically conductive particles are disposed in an aggregated state" with respect to all the lattice points of the planar lattice pattern is set to 15% or less, and moreover, at least some of the electrically conductive particles disposed in an aggregated state are disposed with an oblique shift in a thickness direction of the anisotropic electrically conductive film. Therefore, in a case where the anisotropic electrically conductive film of the fourth mode of the present invention is applied to anisotropic conductive connection, it is possible to achieve a good initial conductivity and a good conduction reliability after aging, and it is also possible to suppress occurrence of a short circuit, therefore it is useful to establishing anisotropic conductive connection of an IC chip and a wiring board with narrow pitches.

REFERENCE SIGNS LIST 10, 200 Anisotropic electrically conductive film
11, 104 Electrically insulating adhesive base layer
12, 105 Electrically insulating adhesive cover layer
13, 103 Electrically conductive particle
100 Transfer body
101 Convex portion
102 Weak adhesive layer
A Lattice point at which electrically conductive particle is not present (position at which electrically conductive particle is not disposed at a lattice point)
B Lattice point where electrically conductive particles are aggregated in contact with each other (position at which electrically conductive particles are aggregated in contact with each other)
C Lattice point at which electrically conductive particles are aggregated to be spaced apart with one another (position at which electrically conductive particles are aggregated in non-contact manner)

The invention claimed is:

1. An anisotropic electrically conductive film having a structure, in which electrically conductive particles are disposed at lattice points of a planar lattice pattern in an electrically insulating adhesive base layer, wherein:
  a sum of a proportion of the lattice points, at which no electrically conductive particle is disposed, with respect to all the lattice points of the planar lattice pattern assumed as a reference region of the anisotropic electrically conductive film, and a proportion of the lattice points, at which plural electrically conductive particles are disposed in an aggregated state, with respect to all the lattice points of the planar lattice pattern
  is not greater than 25%.

2. The anisotropic electrically conductive film according to claim 1, wherein the reference region is a substantially square region including a side X and a side Y in a center portion of the anisotropic electrically conductive film plane, the side X and the side Y satisfying Relationships (A), (2), and (3):

$$100D \leq X+Y \leq 400D \quad (A)$$

$$X \geq 5D \quad (2)$$

$$Y \geq 5D \quad (3)$$

where D is an average particle diameter of the electrically conductive particles, the side Y is a straight line disposed at an angle in a range of less than ±45° with respect to a longitudinal direction of the anisotropic electrically conductive film, and the side X is a straight line perpendicular to the side Y.

3. The anisotropic electrically conductive film according to claim 1, wherein:
  a proportion of the lattice points, at which no electrically conductive particle is disposed, with respect to all the lattice points of the planar lattice pattern assumed as a reference region of the anisotropic electrically conductive film is less than 20%; and
  a proportion of the lattice points, at which plural the electrically conductive particles are disposed in an aggregated state, with respect to all the lattice points of the planar lattice pattern is not greater than 5%.

4. The anisotropic electrically conductive film according to claim 2, wherein a particle area occupancy with respect to an area of any reference region of the anisotropic electrically conductive film, of all the electrically conductive particles present in the area, is not less than 0.15%.

5. The anisotropic electrically conductive film according to claim 2, wherein a particle area occupancy with respect to an area of the reference region of the anisotropic electrically conductive film, of all the electrically conductive particles present in the area, is from 15 to 35%.

6. The anisotropic electrically conductive film according to claim 1, wherein:
  a proportion of the lattice points, at which no electrically conductive particle is disposed, with respect to all the lattice points of the planar lattice pattern assumed as any reference region of the anisotropic electrically conductive film is less than 5%; and
  a proportion of the lattice points, at which plural the electrically conductive particles are disposed in an aggregated state, with respect to all the lattice points of the planar lattice pattern is greater than 10% and less than 15%.

7. The anisotropic electrically conductive film according to claim 1, wherein:
  a proportion of the lattice points, at which no electrically conductive particle is disposed, with respect to all the lattice points of the planar lattice pattern assumed as a reference region of the anisotropic electrically conductive film is not greater than 15%; and
  a proportion of the lattice points, at which plural the electrically conductive particles are disposed in an aggregated state, with respect to all the lattice points of the planar lattice pattern is not greater than 10%.

8. The anisotropic electrically conductive film according to claim 7, wherein the electrically conductive particles disposed in an aggregated state are aggregated in contact with each other with respect to a plane direction of the anisotropic electrically conductive film.

9. The anisotropic electrically conductive film according to claim 1, wherein:

a proportion of the lattice points, at which no electrically conductive particle is disposed, with respect to all the lattice points of the planar lattice pattern assumed as a reference region of the anisotropic electrically conductive film is less than 10%; and a proportion of the lattice points, at which plural the electrically conductive particles are disposed in an aggregated state, with respect to all the lattice points of the planar lattice pattern is not greater than 15%.

10. The anisotropic electrically conductive film according to claim 1, wherein at least some of the electrically conductive particles that are disposed in an aggregated state are disposed with an oblique shift from each other in a thickness direction of the anisotropic electrically conductive film.

11. The anisotropic electrically conductive film according to claim 1, wherein the average particle diameter of the electrically conductive particles is 1 to 30 µm.

12. The anisotropic electrically conductive film according to claim 1, wherein a distance between adjacent lattice points of the planar lattice pattern is not less than 0.5 times the average particle diameter of the electrically conductive particles.

13. The anisotropic electrically conductive film according to claim 1, wherein the electrically conductive particles are metal particles or metal-coated resin particles.

14. The anisotropic electrically conductive film according to claim 1, wherein
in the planar lattice pattern, 11 or more electrically conductive particles are consecutively disposed in a direction perpendicular to the longitudinal direction of the anisotropic electrically conductive film.

15. The anisotropic electrically conductive film according to claim 14, wherein
the 11 or more electrically conductive particles are consecutively disposed in each of three consecutive rows along the longitudinal direction of the anisotropic electrically conductive film in the planar lattice pattern.

16. The anisotropic electrically conductive film according to claim 1, wherein
when the electrically conductive particles are aggregated, there are not more than three sets of the electrically conductive particles that are connected by two in the vicinity of the electrically conductive particles aggregated by two.

17. The anisotropic electrically conductive film according to claim 1, wherein
when the electrically conductive particles are absent, absence of four or more consecutive electrically conductive particles in the longitudinal direction of the anisotropic electrically conductive film and absence of four or more consecutive electrically conductive particles in the direction orthogonal to the longitudinal direction of the anisotropic electrically conductive film do not intersect.

18. A connection structural body having a terminal of a first electronic component and a terminal of a second electronic component being anisotropically electrically conductive connected by the anisotropic electrically conductive film described in claim 1.

19. A method of manufacturing a connection structural body, wherein the method comprises anisotropically electrically conductive connecting a terminal of a first electronic component with a terminal of a second electronic component via the anisotropic electrically conductive film described in claim 1.

20. The anisotropic electrically conductive film according to claim 1, wherein an electrically insulating adhesive cover layer is laminated on the electrically insulating adhesive base layer.

21. A connection structural body having a terminal of a first electronic component and a terminal of a second electronic component being anisotropically electrically conductive connected by the anisotropic electrically conductive film described in claim 20.

22. A method of manufacturing a connection structural body, wherein the method comprises anisotropically electrically conductive connecting a terminal of a first electronic component with a terminal of a second electronic component via the anisotropic electrically conductive film described in claim 20.

23. The anisotropic electrically conductive film according to claim 1, wherein an aggregation direction of the electrically conductive particles disposed in an aggregated state is inclined with respect to a plane direction of the anisotropic electrically conductive film.

24. The anisotropic electrically conductive film according to claim 1, wherein the electrically conductive particles disposed in an aggregated state are not in contact with each other.

25. The anisotropic electrically conductive film according to claim 1, wherein the planar lattice pattern includes a rhombic lattice, a hexagonal lattice, a square lattice, a rectangular lattice, or a parallelotope lattice.

* * * * *